(12) United States Patent
Ando et al.

(10) Patent No.: US 7,017,101 B2
(45) Date of Patent: Mar. 21, 2006

(54) INFORMATION STORAGE MEDIUM, INFORMATION RECORDING METHOD AND INFORMATION PROCESSING METHOD

(75) Inventors: Hideo Ando, Hino (JP); Chosaku Noda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 461 days.

(21) Appl. No.: 10/170,226

(22) Filed: Jun. 13, 2002

(65) Prior Publication Data

US 2002/0191456 A1    Dec. 19, 2002

(30) Foreign Application Priority Data

Jun. 14, 2001    (JP)    ............................ 2001-180278

(51) Int. Cl.
G11C 29/00    (2006.01)

(52) U.S. Cl. ..................................... 714/768; 714/798

(58) Field of Classification Search ................ 714/768, 714/798, 764, 775; 369/47.19, 47.22; 375/253, 375/357; 370/503
See application file for complete search history.

(56) References Cited

U.S. PATENT DOCUMENTS

| 5,228,041 | A | * | 7/1993 | Yoshino et al. ............. 714/798 |
| 5,587,991 | A | | 12/1996 | Nabeshima et al. |
| 5,793,779 | A | * | 8/1998 | Yonemitsu et al. ......... 714/764 |
| 5,987,066 | A | * | 11/1999 | Kojima et al. .............. 375/253 |
| 6,058,087 | A | * | 5/2000 | Tomita ...................... 369/47.22 |
| 6,292,625 | B1 | | 9/2001 | Gotoh et al. |
| 6,317,397 | B1 | * | 11/2001 | Deguchi et al. ......... 369/47.19 |

FOREIGN PATENT DOCUMENTS

| JP | 6-267075 | 9/1994 |
| JP | 7-154385 | 6/1995 |
| JP | 8-251571 | 9/1996 |
| JP | 9-162857 | 6/1997 |
| JP | 10275358 | 10/1998 |
| JP | 2000-112673 | 4/2000 |
| JP | 2000-332613 | 11/2000 |
| JP | 2002-304589 | 10/2002 |

OTHER PUBLICATIONS

U.S. Appl. No. 09/835,822, filed Apr. 17, 2001, Ando et al.
U.S. Appl. No. 09/666,460, filed Sep. 21, 2000, Ando et al.
U.S. Appl. No. 10/210,880, filed Aug. 2, 2002, Ando et al.
U.S. Appl. No. 10/233,671, filed Sep. 4, 2002, Ando et al.

* cited by examiner

Primary Examiner—Albert Decady
Assistant Examiner—Dipakkumar Gandhi
(74) Attorney, Agent, or Firm—Pillsbury Winthrop Shaw Pittman, LLP

(57) ABSTRACT

User information is recorded in each physical sector of an information storage medium in such a style after it is modulated according to a predetermined modulation rule. The physical sector is comprised of plural sync codes. The sync code contains a common fixed code region and variable code regions which are different depending on each sync code. The fixed code region has a sync position detecting code and this code includes a pattern in which "k+2" "0"s continue and a pattern in which 2 "0"s continue.

18 Claims, 43 Drawing Sheets

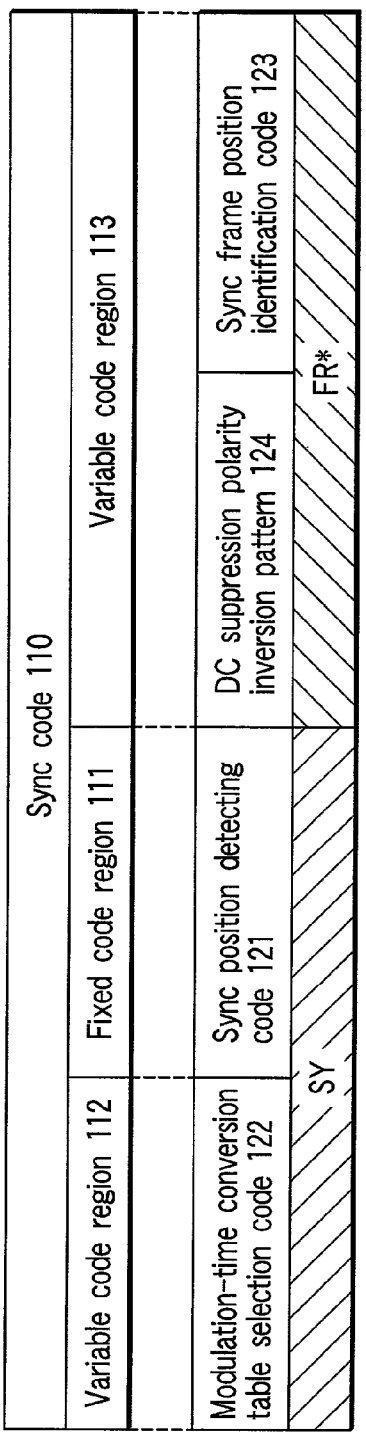
F I G. 12A
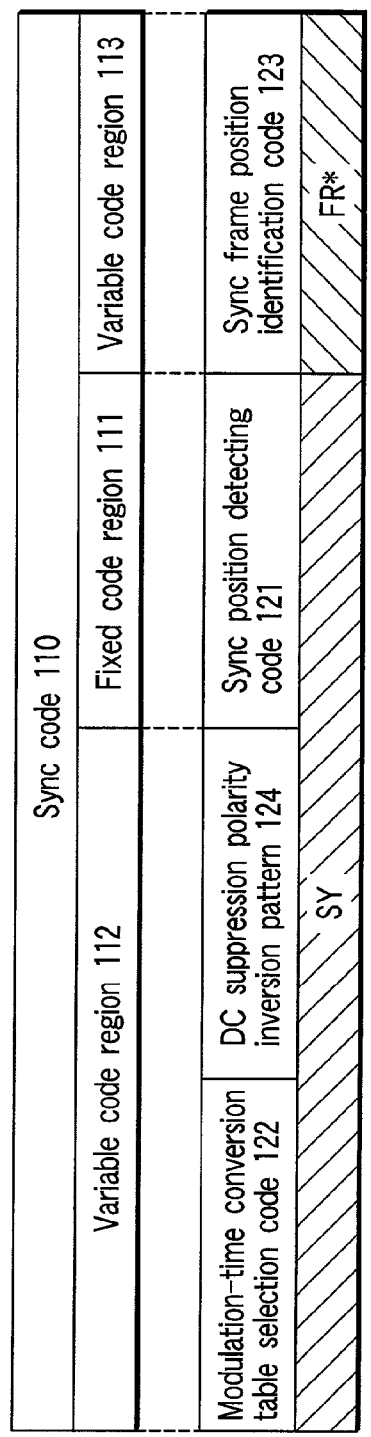
F I G. 12B

FIG. 13A

| Sync code 110 | | | | |
|---|---|---|---|---|
| Variable code region 112 | Sync frame position identification code 123 | Fixed code region 111 | Variable code region 113 | |
| Modulation-time conversion table selection code 122 | DC suppression polarity inversion pattern 124 | Sync position detecting code 121 | DC suppression polarity inversion pattern 124 | SY |
| FR* | | | | |

FIG. 13B

| Sync code 110 | | | |
|---|---|---|---|
| Variable code region 112 | Sync frame position identification code 123 | Fixed code region 111 | |
| Modulation-time conversion table selection code 122 | DC suppression polarity inversion pattern 124 | Sync position detecting code 121 | SY |
| FR* | | | |

FIG. 13C

| Sync code 110 | | | |
|---|---|---|---|
| Variable code region 112 | Sync frame position identification code 123 | Fixed code region 111 | |
| Modulation-time conversion table selection code 122 | DC suppression polarity inversion pattern 124 | Sync position detecting code 121 | SY |
| FR* | | | |

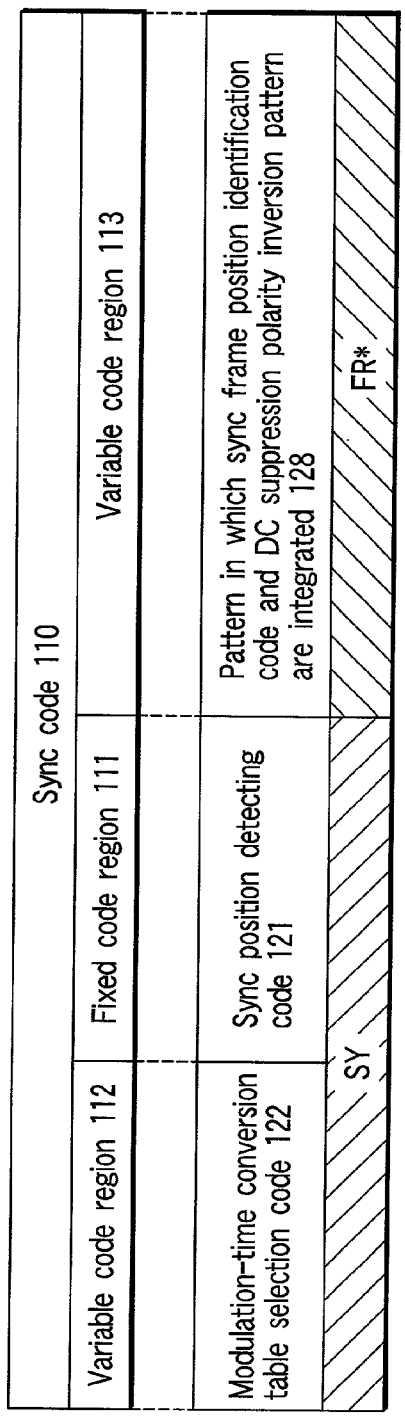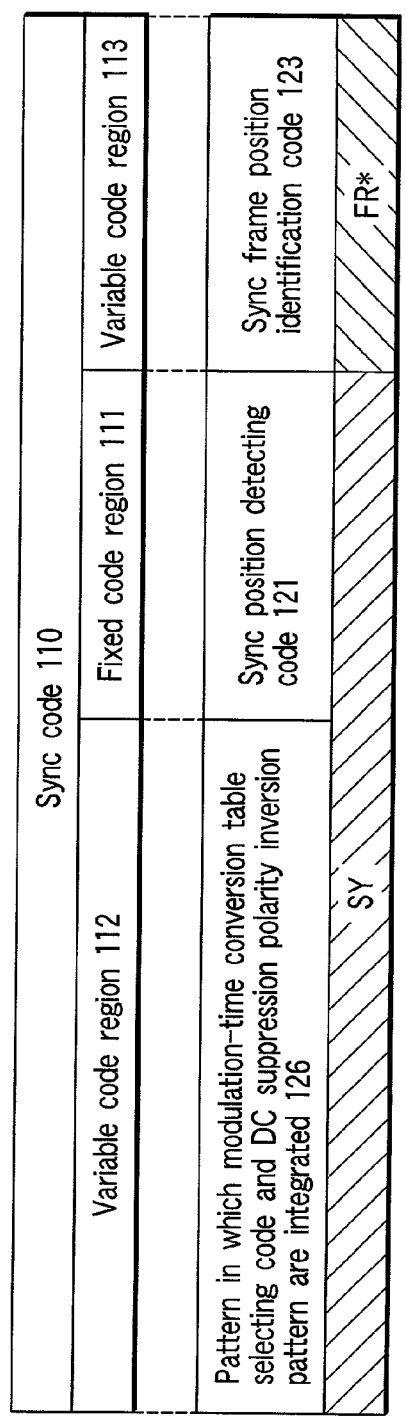
F I G. 14A
F I G. 14B

FIG. 15A

| Sync code 110 | | | |
|---|---|---|---|
| Variable code region 112 | Fixed code region 111 | Variable code region 113 | |
| Pattern in which modulation-time conversion table selecting code and sync frame position identification code are integrated 127 | Sync position detecting code 121 | DC suppression polarity inversion pattern 124 | SY |
| FR* | | | |

FIG. 15B

| Sync code 110 | | | |
|---|---|---|---|
| Variable code region 112 | Fixed code region 111 | | |
| Pattern in which modulation-time conversion table selecting code and DC suppression polarity inversion pattern are integrated 126 | Sync frame position identification code 123 | Sync position detecting code 121 | SY |
| FR* | | | |

F I G. 16A

Sync code 110

| Variable code region 112 | | Fixed code region 111 |
|---|---|---|
| Pattern in which modulation-time conversion table selecting code and sync frame position identification code are integrated 127 | DC suppression polarity inversion pattern 124 | Sync position detecting code 121 |

FR* | SY

F I G. 16B

Sync code 110

| Variable code region 112 | | Fixed code region 111 |
|---|---|---|
| Modulation-time conversion table selection code 122 | Pattern in which sync frame position identification code and DC suppression polarity inversion pattern are integrated 128 | Sync position detecting code 121 |

FR* | SY

F I G. 18A

- Sync code 110
- Variable code region 112
- Pattern in which modulation-time conversion table selecting code and sync frame position identification code are integrated 127
- Pattern in which sync position detecting code and DC suppression polarity inversion pattern are integrated 175
- FR*
- SY

F I G. 18B

- Sync code 110
- Variable code region 112
- Modulation-time conversion table selection code 122
- Sync frame position identification code 123
- Pattern in which sync position detecting code and DC suppression polarity inversion pattern are integrated 175
- FR*
- SY

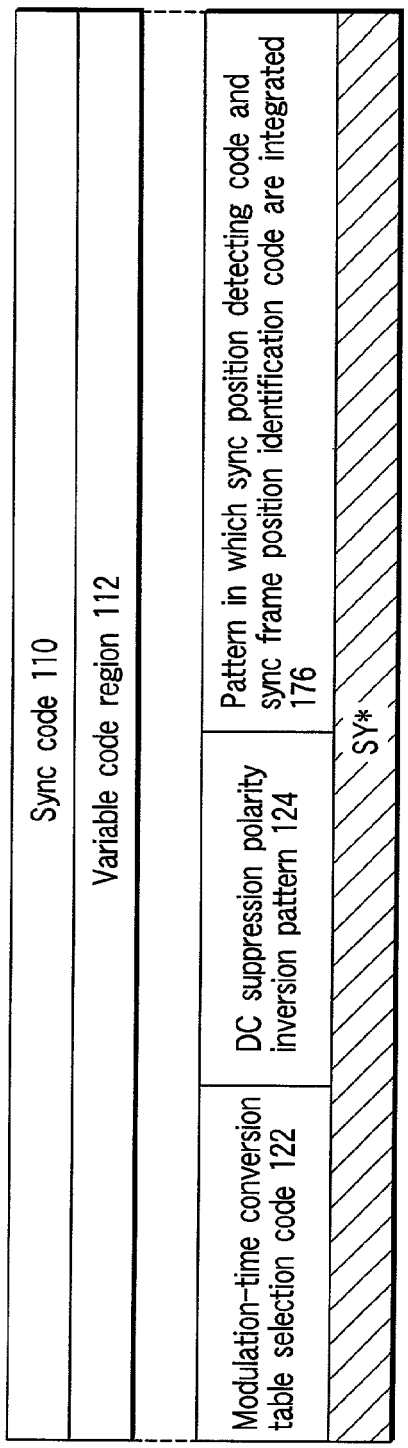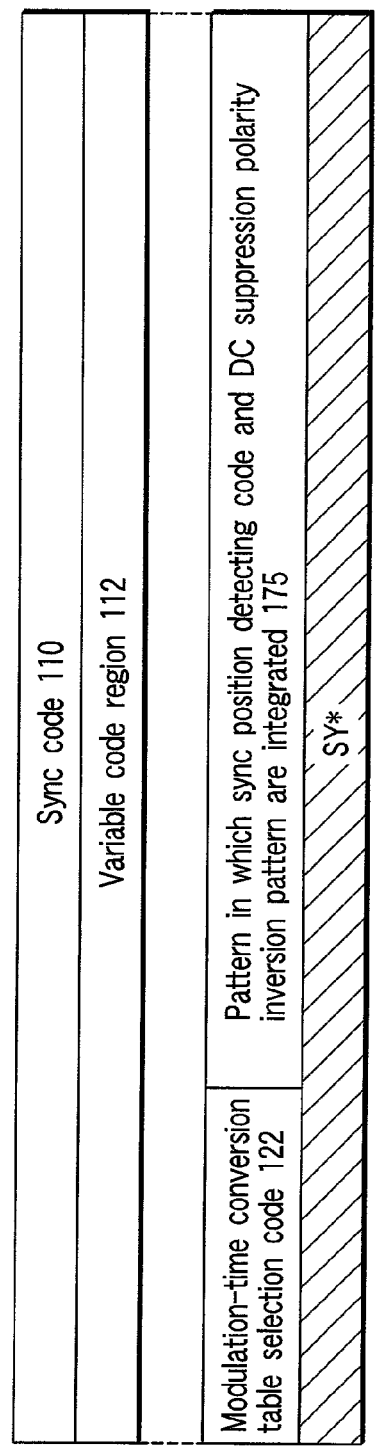
F I G. 19A
F I G. 19B

F I G. 20A

| Non-modulation data region 108 | | | After-modulation data region 107 | |
|---|---|---|---|---|
| Variable code region 112 | Sync code 110 | | After-modulation sync frame data 106 | |
| | Fixed code region 111 | Variable code region 113 | Variable code region 114 | |
| Modulation-time conversion table selecting code 122 | Sync position detecting code 121 | DC suppression polarity inversion pattern 124 | After-modulation sync frame position identification code 125 | FR* |
| | SY | | | |

F I G. 20B

| Non-modulation data region 108 | | | After-modulation data region 107 | |
|---|---|---|---|---|
| Variable code region 112 | Sync code 110 | | After-modulation sync frame data 106 | |
| | Fixed code region 111 | Variable code region 114 | | |
| Modulation-time conversion table selecting code 122 | DC suppression polarity inversion pattern 124 | Sync position detecting code 121 | After-modulation sync frame position identification code 125 | FR* |
| | SY | | | |

| Non-modulation data region 108 | | After-modulation data region 107 | |
|---|---|---|---|
| Sync code 110 | | | After-modulation sync frame data 106 |
| Fixed code region 111 | Variable code region 114 | | |
| Variable code region 112 | Sync position detecting code 121 | After-modulation sync frame position identification code 125 | |
| Pattern in which modulation-time conversion table selecting code and DC suppression polarity inversion pattern are integrated 126 | SY | FR* | |

F I G. 21

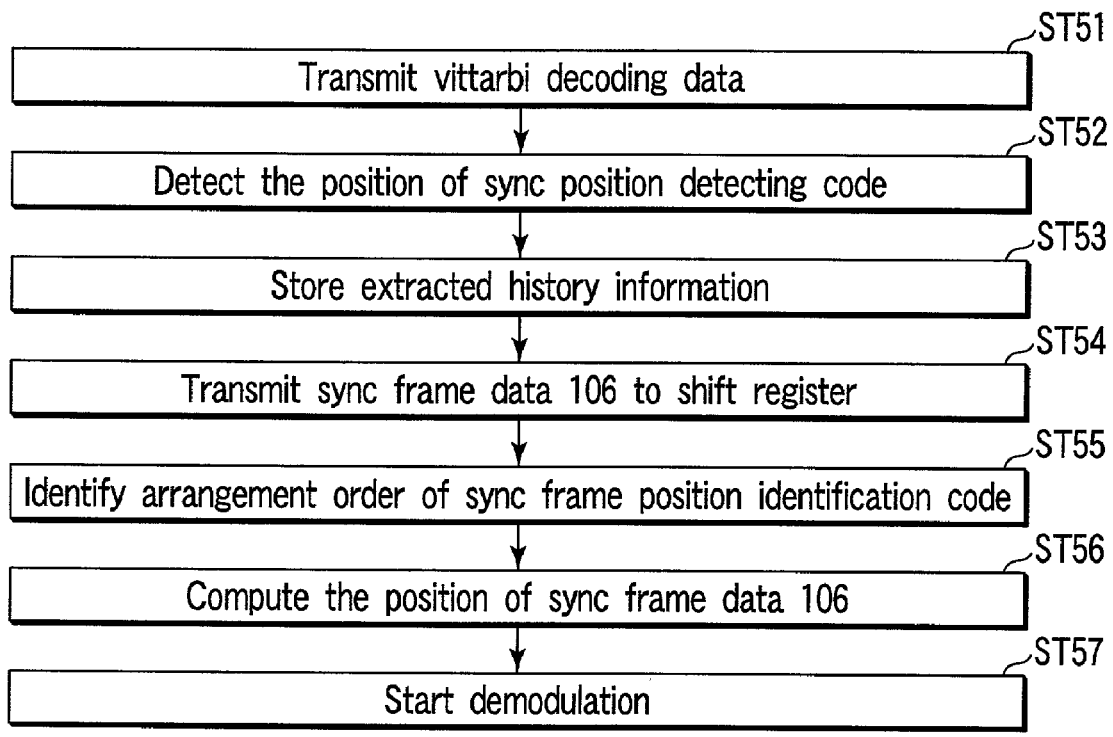
F I G. 42

INFORMATION STORAGE MEDIUM, INFORMATION RECORDING METHOD AND INFORMATION PROCESSING METHOD

CROSS-REFERENCE TO RELATED APPLICATIONS

This application is based upon and claims the benefit of priority from the prior Japanese Patent Application No. 2001-180278, filed Jun. 14, 2001, the entire contents of which are incorporated herein by reference.

BACKGROUND OF THE INVENTION

1. Field of the Invention

The present invention relates to a sync code generation method, an information recording method, an information reproduction method, an information reproducing apparatus and an information storage medium. The present invention is effective as an information recording format and useful as a method of recording information into an information storage medium in an information recording/reproducing apparatus and as an method of reproducing information from the information storage medium. Further, the present invention is also usefully applied to a next generation DVD-ROM, a next generation DVD-R and a next generation DVD-RAM.

2. Description of the Related Art

The digital versatile disc (DVD) specifies the content of sync codes based on the current DVD format. This specification includes 32 kinds of the sync codes.

The information reproducing apparatus or information recording/reproducing apparatus employs the following method in order to detect a position of a sync code from reproduction data. That is, by matching reproduction data reproduced from an information storage medium with 32 kinds of patterns, it is determined whether or not a pattern match occurs.

This sync code position detection processing takes a great deal of time and labor. Consequently, the sync code detecting circuit becomes complicated thereby inducing an increase of price of the information reproducing apparatus or information recording/reproducing apparatus. As described above (because 32 kinds of sync codes exist), sync code detection algorithm is complicated. Thus, reliability of sync code detection is low. Further, a bit number of a code (bit number of an entire code) to be compared with a reproduction signal (32 bits of sync code) in terms of pattern is as long as 32 bits. For the reason, the error rate of a reproduction signal originated from a defect on an information storage medium is high and reliability of sync code position detection (timing detection) is low.

If considering the content of the sync code, three bit "0"s minimum may be continuous just before and just after a place where bit "0"s are continuous long (13 0s are continuous) in some case In such a case, deflection from synchronism in the phase lock loop (PLL) circuit is likely to occur, thereby reliability of sync code detection dropping.

Accordingly, an object of the present invention is to provide a sync code generation method capable of simplifying sync code position detecting processing and improving reliability of sync code detection. Another object of the present invention is to provide an information recording method, an information reproducing method, an information reproducing apparatus and an information storage medium, which employs the sync codes generated according to the same method.

BRIEF SUMMARY OF THE INVENTION

To achieve the above-described object, according to an aspect of the present invention, there is provided a sync code generating method for inserting plural sync codes into a first recording unit containing plural sync frames including user data, the method comprising: disposing a common fixed code region and a variable code region which is different depending on each sync code within the plural sync codes; and disposing a predetermined special sync position detecting code in the fixed code region while disposing at least any one of a modulation-time conversion table selecting code and a sync frame position identification code of the user data in the variable code region.

According to another aspect of the present invention, there is provided an information recording method, an information reproducing method, an information reproducing apparatus and an information storage medium which make use of the characteristic of this sync code.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiment of the invention, and together with the general description given above and the detailed description of the preferred embodiment given below, serve to explain the principles of the invention.

FIGS. 12A and 12B are explanatory diagrams each showing an example of the structure of a sync code according to the present invention, respectively;

FIGS. 13A, 13B and 13C are explanatory diagrams each showing another example of the structure of the sync code according to the present invention, respectively;

FIGS. 14A and 14B are explanatory diagrams each showing still another example of the structure of the sync code according to the present invention, respectively;

FIGS. 15A and 15B are explanatory diagrams each showing yet still another example of the structure of the sync code according to the present invention, respectively;

FIGS. 16A and 16B are explanatory diagrams each showing yet still another example of the structure of the sync code according to the present invention, respectively;

FIGS. 18A and 18B are explanatory diagrams each showing yet still another example of the structure of the sync code according to the present invention, respectively;

FIGS. 19A and 19B are explanatory diagrams each showing yet still another example of the structure of the sync code according to the present invention, respectively;

FIGS. 20A and 20B are explanatory diagrams each showing yet still another example of the structure of the sync code according to the present invention, respectively;

FIG. 21 is an explanatory diagram showing yet still another example of the structure of the sync code according to the present invention;

FIG. 42 is a flow chart showing a method of determining a sync frame in physical sector from the arrangement order of plural sync codes in the information recording/reproducing apparatus of the present invention.

DETAILED DESCRIPTION OF THE INVENTION

Figure 1:
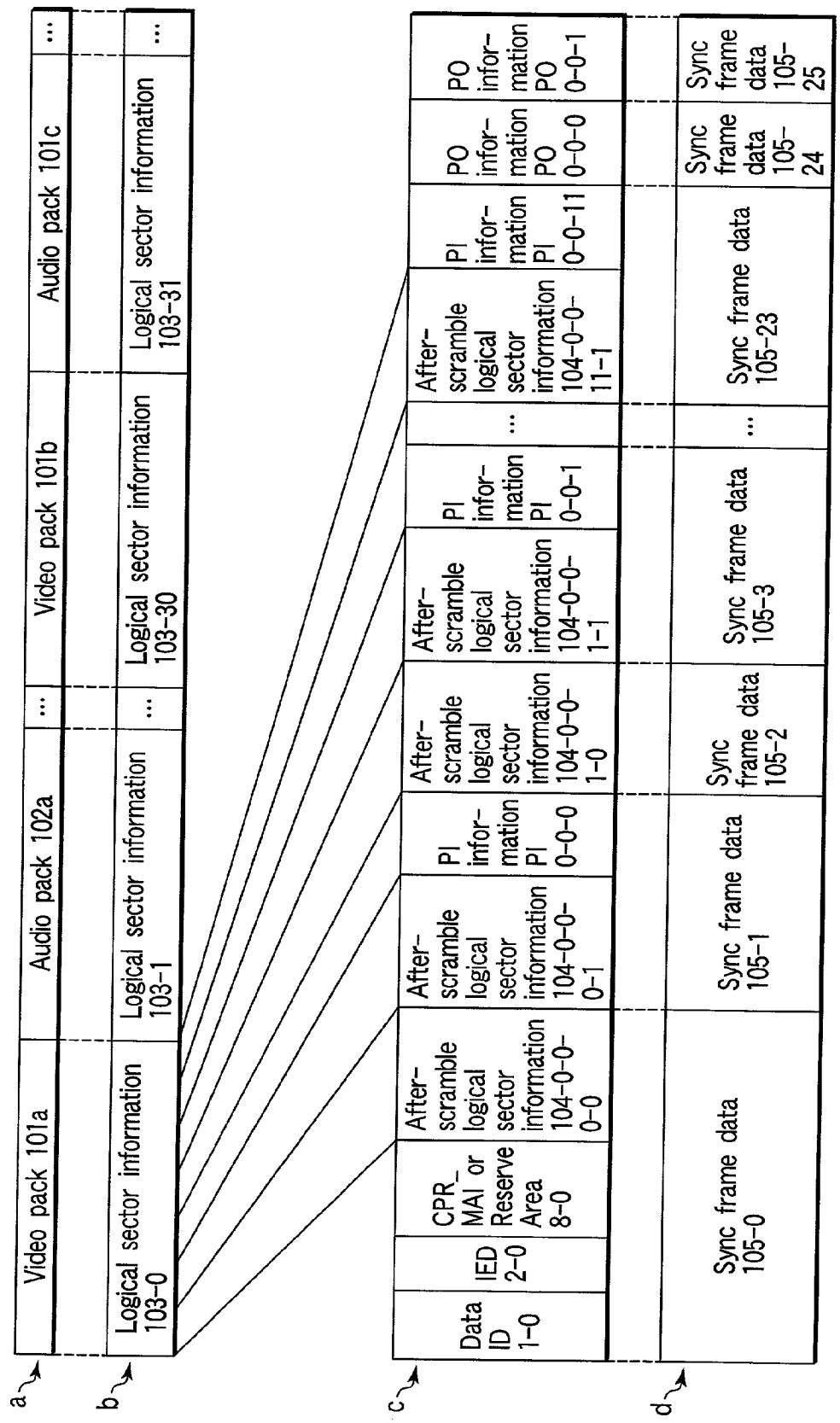
FIG. 1 is an explanatory diagram of composition elements of sync frame data according to the present invention.

Hereinafter, preferred embodiments of the present invention will be described in detail with reference to the accompanying drawings.

First, the concept specific of the present invention will be described below.

Point [1]: The data size of sync code is reduced from 32 bits which a conventional DVD system adopts to 24 bits. Consequently, reliability of sync code detection is improved (see a used bit number described in FIGS. 27 to 35).

Its effect is as follows.

A current DVD system adopts a pattern matching method for all 32 channel bits of an input sync code. Then, a pattern matching an input sync signal is selected from 32 kinds of patterns. When the pattern matching processing is being executed, as the size (bit number) of the pattern increases, it takes longer for pattern verification and the pattern verification becomes complicated. Further, the probability that a bit error originated from a defect (flaw, dust and the like) on an information storage medium 9 (see FIG. 8) may be mixed in the reproduction signal (input sync code) increases, so that the reliability of sync code detection drops.

According to the present invention, the data size of the sync code is decreased from 32 bits of the conventional DVD system to 24 bits. The pattern size (bit number) to be used for pattern matching processing decreases, so that time taken for pattern verification is saved largely. Further, the pattern matching processing is simplified. Additionally, the probability that the bit error originated from a defect (flaw, dust and the like) in the information storage medium 9 may be mixed in the reproduction signal (sync code) is low. Therefore, the reliability of sync code detection is improved.

Point [2]: The interior structure of the sync code is divided depending on each function. That is, bits composing the sync code are classified and allocated to each of plural functional bits. Thus, data corresponding to each allocated portion (functional bits) can be extracted. That is, information of each function can be extracted independently (indicated in "f" and "g" of FIG. 2)

More specifically, the interior structure of the sync code is divided into a fixed code region 111 and variable code regions 112, 113. The inside content of the variable code regions 112, 113 is further divided into a recording place for a "modulation time conversion table selection code 122", a recording place for a "sync frame position identification code 123" and a recording place for a "DC suppression polarity inversion pattern 124" (including a case where the recording places are partially combined or used for other at the same time). The sync code of the present invention has the data structure described above.

The modulation time conversion table selection code 122 means a conversion table selection code which is a selection code for selecting a table in the conversion tables, when data is converted to modulation data.

This effect is as follows.

According to the present invention, the interior structure of the sync code is divided depending on each function. Bits of each function are subjected to pattern matching processing. Consequently, the number of bits to be used for pattern verification is small, so that time taken for the pattern verification can be saved largely. Further, processing for the pattern verification is simplified. Additionally, the probability that a bit error originated from a defect (flaw, dust and the like) in the information storage medium may be mixed into the reproduction signal (sync code) is low. Therefore, the reliability of sync code detection is improved.

Figure 10:
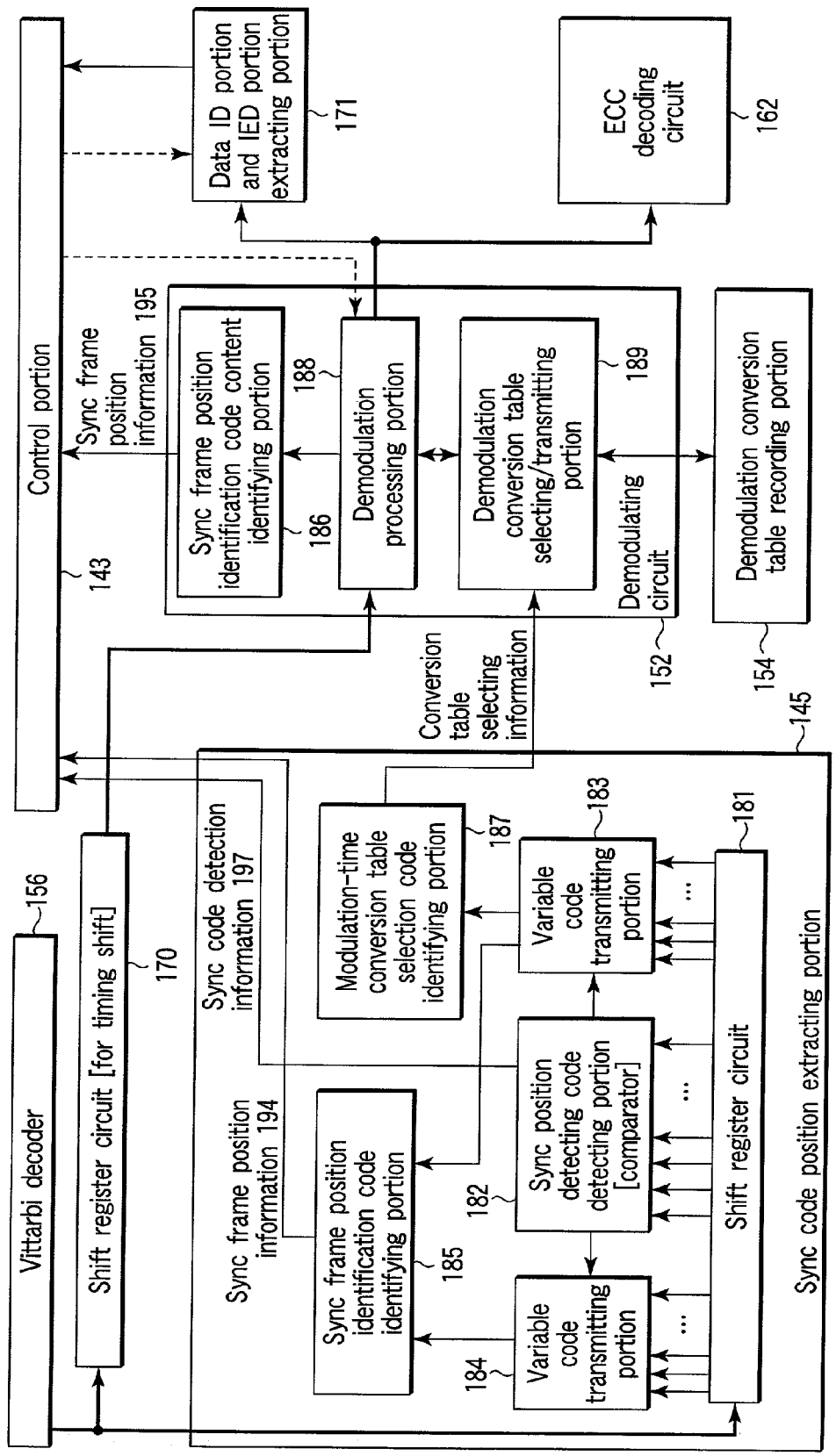
FIG. 10 is an explanatory diagram showing the structure of the surrounding of a sync code position detecting portion of the information recording/reproducing apparatus of the present invention.

More specifically, a sync position detecting code 121 for a single pattern is recorded in the fixed code region 111. As shown in FIG. 10, a sync position detection code detecting portion 182 constituted of a comparator detects the position of the sync position detecting code 121 and as a result, the position of an entire sync code 110 can be detected. As described above, the present invention is not executed by pattern matching processing on the entire sync code 110. Detection is executed in only the fixed code region 111, which is part of the sync code 110. Consequently, time taken for pattern verification for detecting the sync code position is saved largely and detection processing is simplified. Additionally, the probability that a bit error originated from a defect (flaw, dust and the like) in the information storage medium 9 may be mixed into the reproduction signal is low. Therefore, the reliability of sync code detection is improved.

The conventional DVD system executes the pattern matching processing between pattern candidates of 32 kinds and a fetched sync signal in its sync code detection processing. As compared to this, according to the embodiment of the present invention, detection for presence or absence of the sync position detecting code 121 includes position detection for the sync code 110 because a comparator (sync position detection code detecting portion 182) is employed. As a result, the method for detecting the position of the sync code 110 is simplified largely, so that detection accuracy is improved.

Further, the interior structure of the sync code is divided depending on each function.

Then, bits of each function is subjected to the pattern matching processing. Thus, the number of corresponding pattern candidates upon the pattern matching processing is small for the conversion table selection code 122, the sync frame position identification code 123, and the DC polarity inversion pattern 124 after modulation (see each embodiment of FIG. 23, FIG. 24, FIG. 25 and FIG. 26). Thus, the conversion table selection code 122, the sync frame position identification code 123 and the DC polarity inversion pattern 124 are respectively easy to identify, so that they can be processed in a short time. As a result, the detection reliability is improved.

Point [3]: A sync position detection code pattern in the sync code is comprised of a pair of a pattern easy to identify and a pattern capable of restoring PLL at high speeds (see "h" in FIG. 2).

Figure 2:
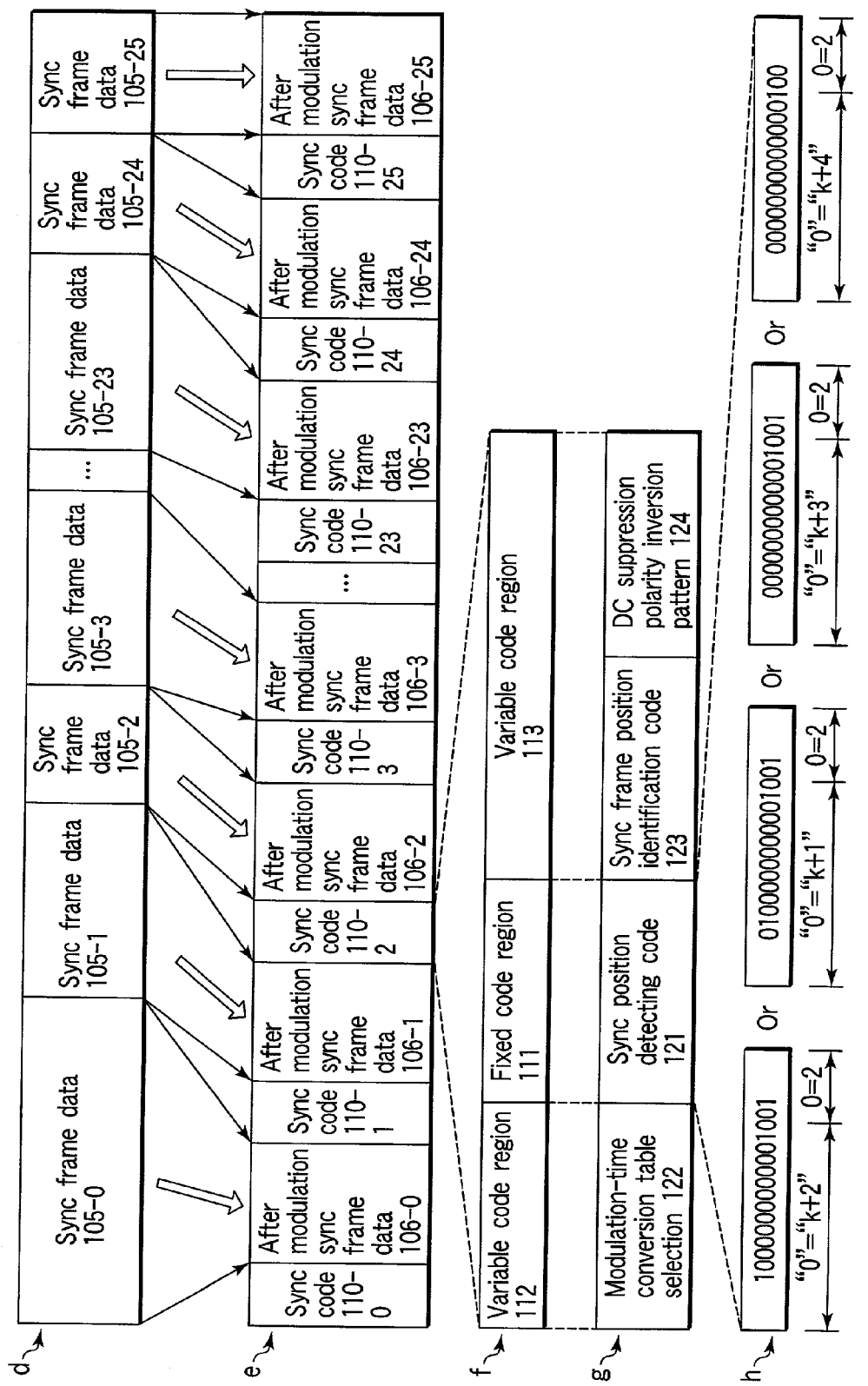
FIG. 2 is an explanatory diagram showing an example of the data structure and content of a sync code when the sync code is attached to the sync frame data.

That is, when user recording data (ordinary data: sync frame data 105) is modulated according to modulation rule of (d, k; m, n), a pattern in which "k+2"0s continue within a pattern of the sync position detecting code 121 is disposed and just after that, a pattern in which 2 0s continue is disposed (see "h" in FIG. 2).

The effect is as follows.

A pattern which cannot exist in modulated user recording data (modulated sync frame data 106) is provided within the sync position detection code pattern. As a result, identification between the sync code and other (modulated) user recording data (sync frame data 106) is facilitated. If ordinary data (sync frame data 105) is modulated according to the modulation rule (as for a channel bit pattern after modulation, its range in which 0s are continuous is d at minimum while k at maximum) of (d, k; m, n), "0" is never continuous by "k+2" according to the (d, k; m, n) modulation rule. This is because a pattern in which "k+2" "0"s continue is provided in the sync position detection code pattern. If an information reproducing apparatus or an information recording/reproducing apparatus searches for a pattern in which "k+2" "0"s continue, it can detect the position of the sync position detection code very easily.

Recent optical disc recording technology records data in an information storage medium according to the non-return to zero invert (NRZI) method. Further, the frequency and phase of a reference clock (clock to be used within the information reproducing apparatus or information recording/reproducing apparatus) are corrected (this is so-called phase lock loop (PLL) correction). This correction is executed so as to gain synchronism between the reproduction signal and the reference clock in the apparatus.

Deflection in phase between the reproduction signal and reference clock is obtained by detecting a difference (deflection in phase) between a time (phase) when data (channel bit data) reproduced from the information storage medium 9 comes to "1" and a time (phase) when the reference clock 198 rises (or falls).

If a pattern in which "0"s are continuous long exists in the sync position detection code, PLL correction (phase matching), which is to be executed with a time when data is "1"

as a reference, is suspended for a long time. In such a case, unlocking of the phase in the PLL circuit is likely to occur. If unlocking of the phase in the PLL occurs, a bit shift in data to be detected is generated, so that an error (bit shift error) in detection data is generated for a long time.

If there exists a pattern in which data "0" is continuous long, the bit shift error is likely to occur, thereby inducing such a problem that reproduction reliability of the sync position detecting code 121 drops largely.

To improve this, the current DVD system employs a pattern in which 3 "0"s continue just after 13 "0"s continue for recording. However, the current DVD system does not secure reliability of data reproduction when a bit shift error occurs.

The feature of phase synchronization processing will be considered.

Because as described above, the PLL correction (phase matching correction) is enabled with a time when data is "1" as a reference, the period in which the PLL correction (phase matching correction) is enabled is shorter as the number of continuous "0"s is smaller. Consequently, it can be expected that if the period in which the PLL correction is executed is decreased, the bit shift error becomes more unlikely to occur.

Thus, as a pattern which comes just after the pattern in which "k+2" "0"s continue, the present invention sets up a pattern in which only 2 "0"s continue. Consequently, the bit shift error becomes unlikely to occur, thereby improving the reliability of synchronism detection.

That is, although the conventional DVD system employs a pattern in which 3 "0"s continue, the present invention adopts a pattern in which only 2 "0"s continue by reducing the number of continuous "0"s by 1.

However, bit length after modulation is set short aiming at intensified density, so that d=1 is set up. In case where PRML is used in the data reproduction system, the amplitude of a reproduction signal from a place (phase) in which only one "0" exists is very small. In this case, because the amplitude of the reproduction signal is small, the reproduction signal cannot be binarized stably.

According to the present invention, to solve this problem, a pattern in which 2 "0"s continue is disposed in order to obtain a relatively large amplitude of the reproduction signal and consequently, a signal after binarization is stabilized (can be detected accurately).

Point [4]: The value of the sync frame position detecting code 123 disposed at the first place of the same physical sector coincides with the value of the sync frame position detecting code 123 disposed at the other place in the same physical sector.

Figure 34:
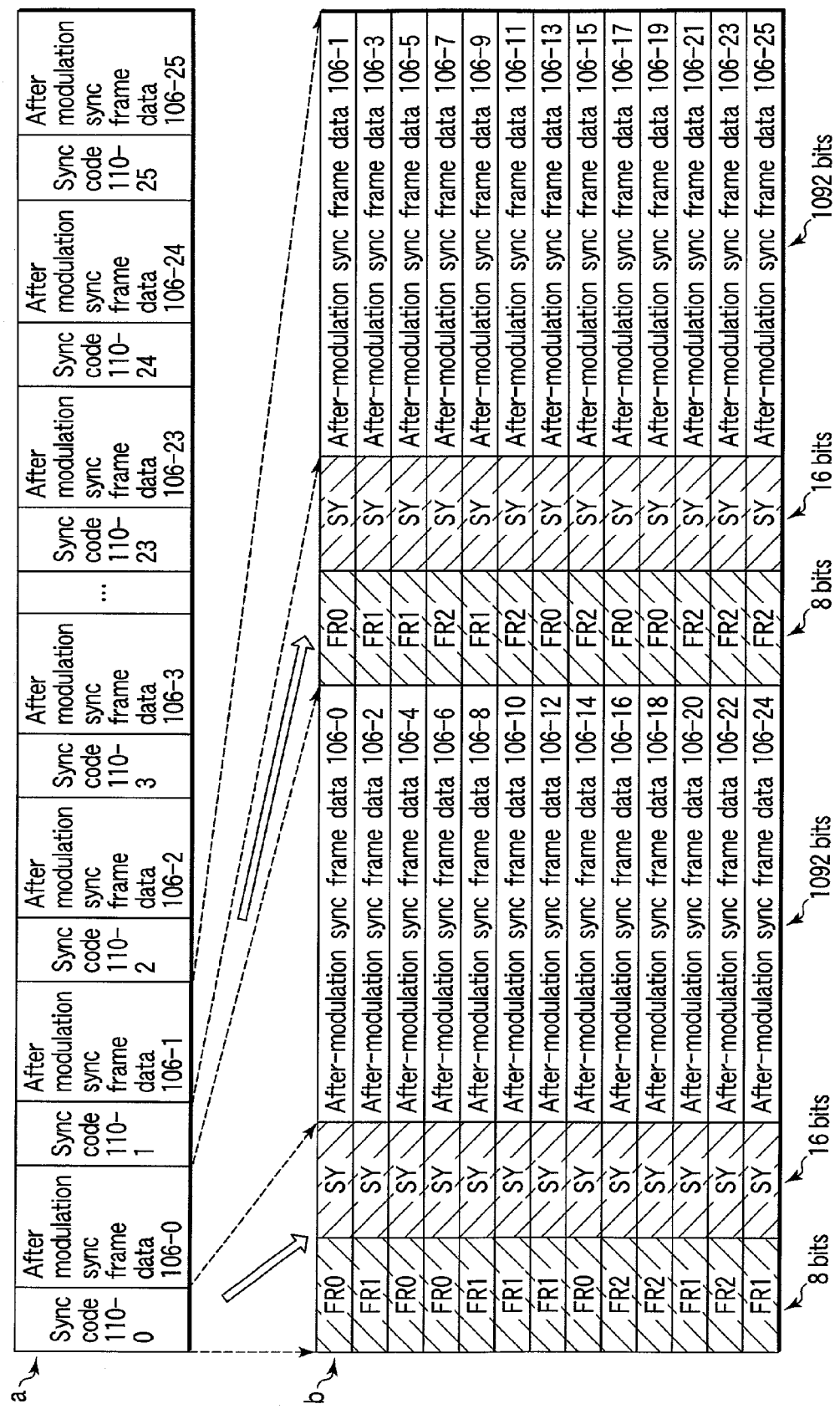
FIG. 34 is an explanatory diagram showing yet still another example of the relation of array between the sync code and modulated sync frame data according to the present invention.
Figure 35:
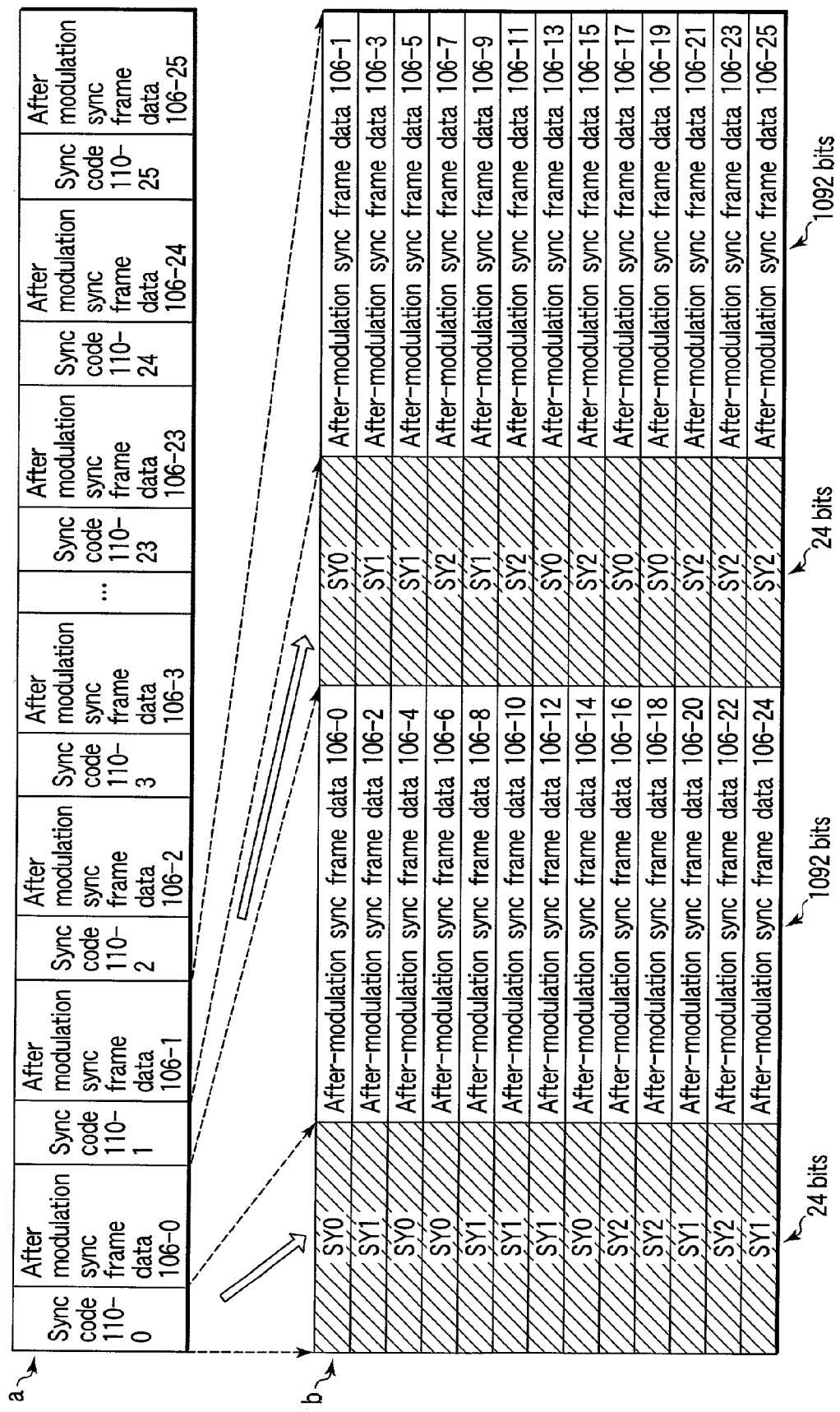
FIG. 35 is an explanatory diagram showing yet still another example of the relation of array between the sync code and modulated sync frame data according to the present invention.

That is, not only "SY0" of FIG. 35 or "FR0" of FIG. 34 is disposed at the first place of the same physical sector, but also the same "SY0" or "FR0" is disposed at another place (2nd, 5th, 7th, 14th, 15th, 18th, or 20th ). Although "SY0" and "FR0" are sync codes, the contents thereof are different.

This effect is as follows.

In the current DVD system, "SY0" which is a sync code disposed first in one sector is not disposed at any other place than the first position in the same sector. If the sync code pattern of "SY0" is disposed at only one place in the same sector, necessarily, the kinds of the sync code patterns which should be disposed at other plural places in the same sector increases.

Identification on the content (content of "SY0" or "SY1") of each sync code pattern or the value of the sync frame position number 115 (see FIGS. 23 to 26) of the present invention is not enabled unless a pattern matching method by trial on all is employed. Then, as the number of the kinds of patterns of sync code or the number of kinds of patterns allocated to the sync frame position number 115 increases, identification processing time by pattern matching increases and further, the identification processing becomes more complicated. Consequently, the reliability of identification drops.

According to the present invention, "SY0", which is the sync code disposed at the first place in the same sector or "FR0" of the sync frame position number 115 can be disposed at another place (2nd, 5th, 7th, 14th, 15th, 18th or 20th in the embodiments of FIGS. 34 and 35) in the same sector. As a result, the number of the kinds of patterns of the sync code disposed in the same sector or the number of the kinds allocated to the sync frame position number 115 can be reduced largely.

Although the existing DVD system requires eight kinds from "SY0" to "SY7", according to the embodiments of FIGS. 34 and 35, the number of the patterns is reduced to only three kinds, that is, from "SY0" or "FR0" to "SY2" or "FR2". For the reason, the number of the kinds of patterns to be identified or the number of the kinds to be allocated to the sync frame position number 115 is small. As a result, not only identification time by pattern matching is reduced largely and identification processing is simplified, but also identification error is unlikely to occur. Therefore, the reliability of identification is improved.

Point [5]: Upon reproduction, information about plural sync codes to be reproduced successively is read and the position thereof in a physical sector currently reproduced can be searched from linkage information of each sync code information (described in FIGS. 36 and 42).

This effect is as follows.

The conventional DVD system searches for a place currently being reproduced by detecting the position of "SY0" located at the head in a sector and then reproducing and confirming information about data ID 1-0 which comes just after. Thus, if reproduction is started from halfway of the sector, the reproduction is continued until "SY0" is detected. However, if an error occurs in "SY0" because of, for example, a defect on the information storage medium 9 or a bit shift error occurs in the sync position detecting code 121, as described in (effect) of [3], so that "SY0" cannot be identified accurately, this method has no way but waiting until "SY0" comes (reproduced)in a next sector. Thus, it often takes a quite long time to detect a reproduced place, so that the reliability of detection is low.

Figure 36:
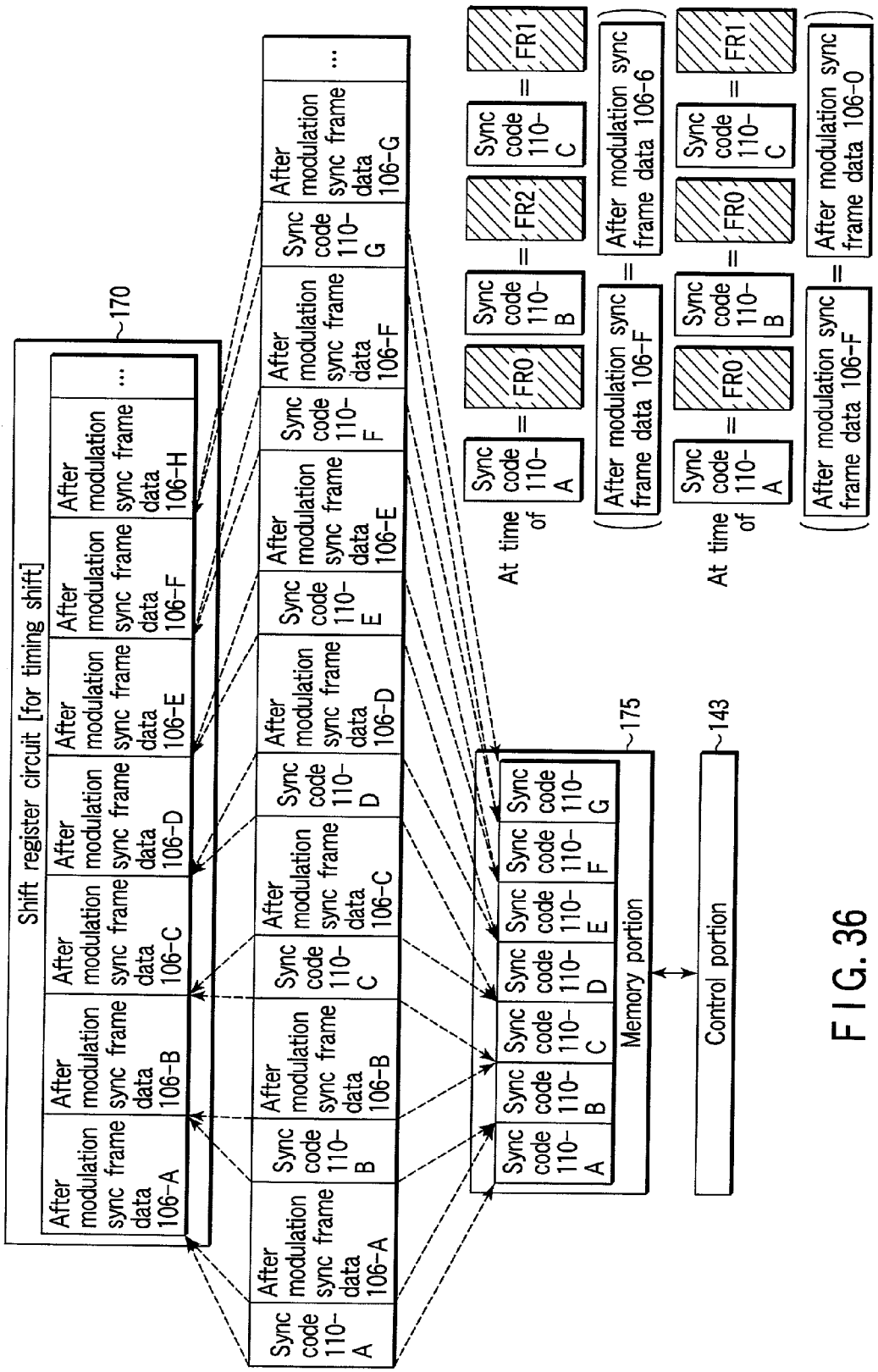
FIG. 36 is an explanatory diagram for explaining a method of determining a sync frame position in a physical sector from the arrangement order of sync frame position identification codes in the sync code of the present invention.

According to an embodiment of the present invention, a method indicated in a flow chart of FIG. 42 and at the right bottom of FIG. 36 (an example of method of searching a sync frame position according to the arrangement order of the sync frame position identification code) is adopted. That is, according to this method, information about continuous plural sync codes 110 is reproduced and the position of the sync code 110 being currently reproduced within the same physical sector 5 is determined according to the arrangement order of the sync codes 110. If the sync code 110 cannot be partially reproduced accurately because of an error or a bit shift error originated from a defect on the information storage medium 9, adoption of this method enables to correct by estimating a sector data position from the arrangement and content of the sync codes 110 back and forth.

Therefore, adoption of the embodiment of the present invention improves the reliability of information reproduction from the sync code 110 or position detection of the sync code 110 largely. Consequently, even if for example, the first sync code 110-0 in the physical sector data 5 cannot be reproduced, the position of the first sync code 110-0 can be searched for by using linkage with the sync code back and forth without waiting for next physical sector data 5 to arrive, unlike in a conventional case. Thus, position detection of the sync code 110 can be accelerated.

The embodiment of the present invention will be described with reference to FIGS. 1 and 2.

Symbol "a" in FIG. 1 indicates pack column such as a video pack 101a, an audio pack 102a, . . . and symbol "b" indicates logical sector information 103-0, 103a-1, 103-2, . . . corresponding to each pack. Symbol "c" indicates that one item of logical sector information 103-0 is scrambled so that each row (12 rows in this case) is supplied with PI information. Further, Data ID.IED.CPR_MAI is added to the head row. The last row (13th row) of this logical sector information is PO information.

A sector block (13 rows) indicated by symbol c in FIG. 1 is divided into sync frame data 105-0, 105-1, . . . (totally 26 (=13×2)). Then, a sync code (see symbol "e" in FIG. 2), which will be described later, is attached between the sync frame data. That is, the sync code is attached to the head of each sync frame data.

FIG. 2 shows a state in which the sync codes 110 is inserted in between the sync frame data 105 indicated by symbols "d" and "e". The sync code is comprised of, for example, a variable code region 112, a fixed code region 111 and a variable code region 113 as indicated by symbol "f" and each region contains content as indicated by symbols "g" and "h" in FIG. 2.

The characteristic composition will be described below.

Video information is recorded on the information storage medium 9 in the form of the video pack 101 and audio pack 102 (indicated by symbol "a") in the unit of 2048 bytes as shown in FIG. 1. This recording unit of 2048 bytes is handled as logical sector information 103 (portion indicated by symbol "b").

Figure 5:
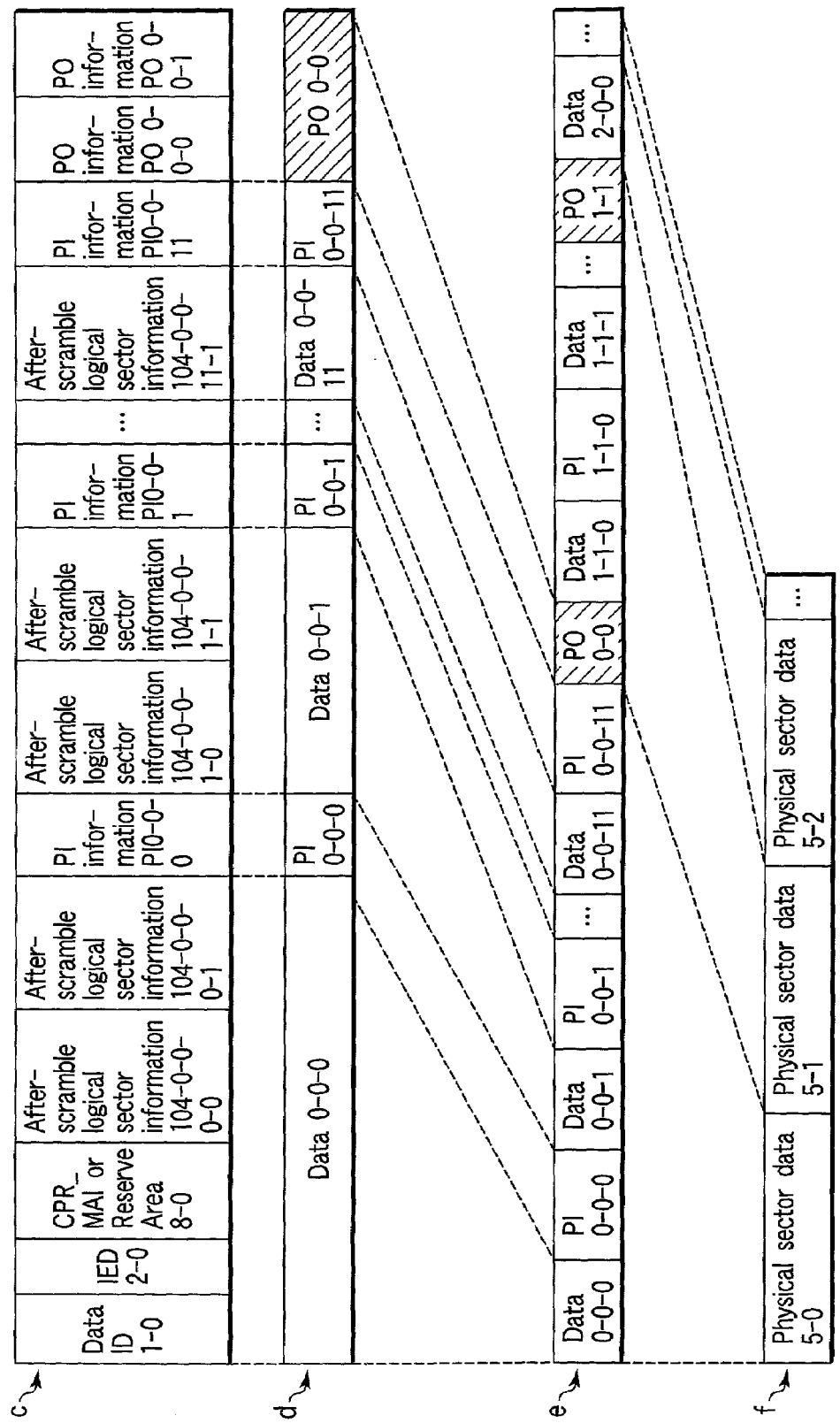
FIG. 5 is an explanatory diagram for explaining the structure of data concerning the present invention, that is, physical sector data.
Figure 6:
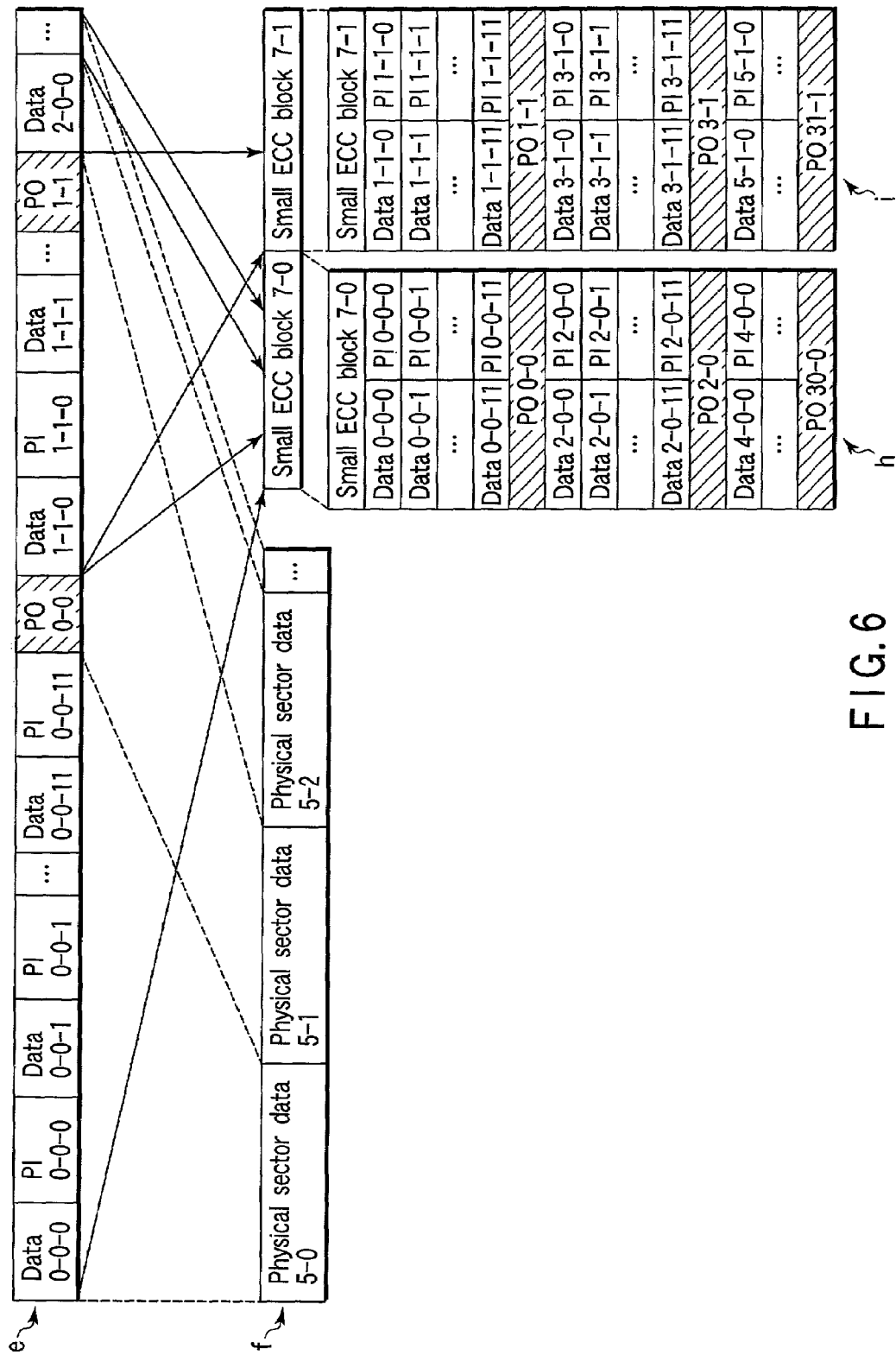
FIG. 6 is an explanatory diagram showing the relation between the aforementioned physical sector data and ECC block.
Figure 7:
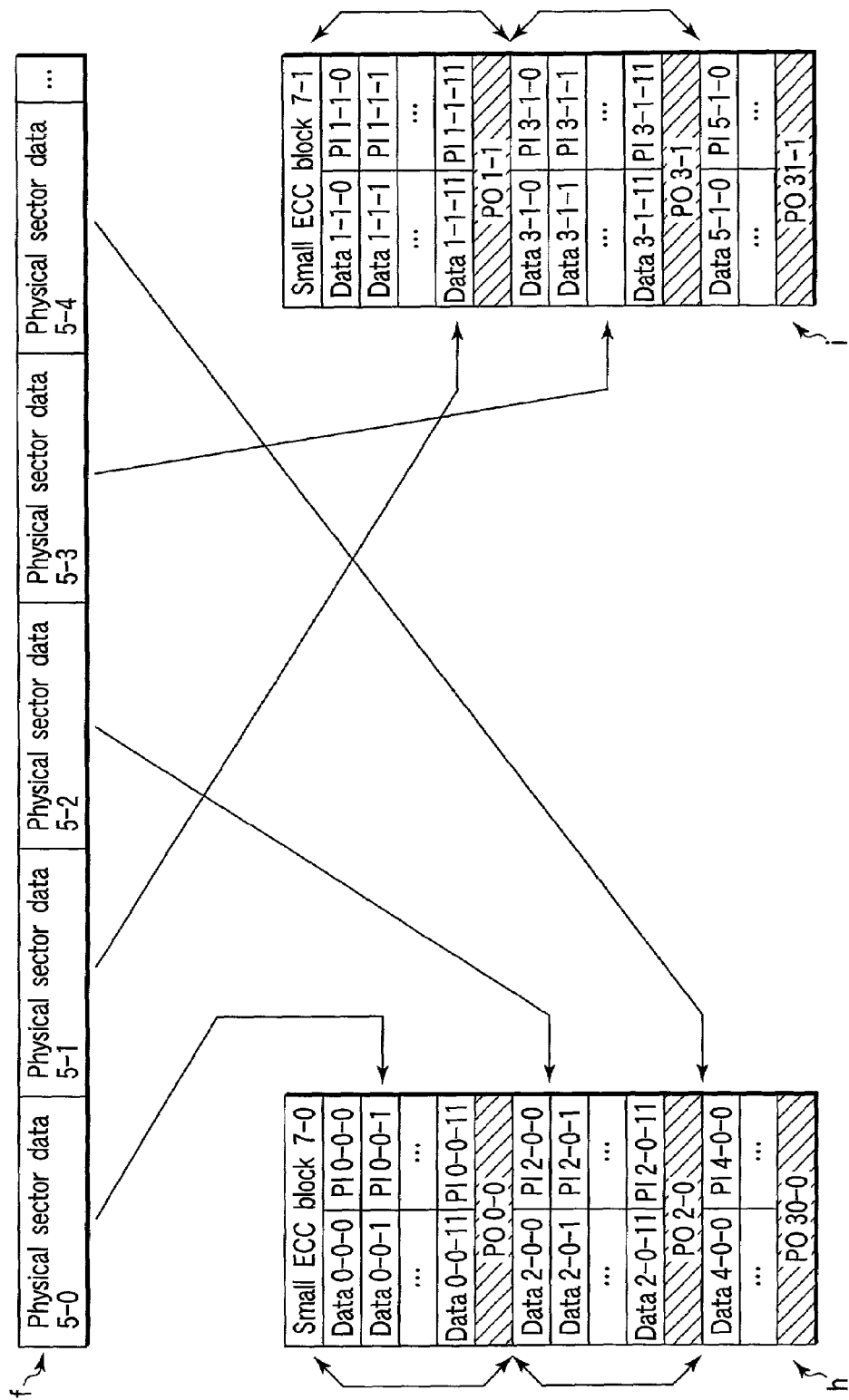
FIG. 7 is an explanatory diagram showing the relation between the aforementioned physical sector data and ECC block.

In the existing DVD system, Data ID.1-0, IED2-0, CPR_MAI8-0 are attached to the logical sector information 103 and PI (parity of inner-code) information and PO (parity of outer-code) information are attached (corresponding to the ECC structure shown in FIGS. 5 to 7). Then, this result data is divided into 26 sections and these divided data form sync frame data 105-0 to 105-25 (indicated by symbols "c" and "d" in FIGS. 1 and 2). In this case, the PO information is also divided into two sections.

Each sync frame data 105 is modulated and the sync code 110 of the present invention is inserted in between the sync frame data 106 after modulation. The modulation method is generally expressed in (d, k; m, n). This means that original data of m bits is converted to n channel bits and that as for the channel bit pattern after modulation, the range in which "0"s are continuous is "d" at minimum while "k" at maximum.

In the embodiment of the present invention, a case where a modulation method disclosed in Jpn. Pat. Appln. KOKAI Publication No. 2000-332613 is indicated. According to the aforementioned modulation method, it comes that d=1, k=9, m=4, n=6. The sync code 110 is divided into the fixed code region 111 and the variable code regions 112, 113 and the variable code regions 112, 113 are further divided into a recording place for the "modulation-time conversion table selection code 122", a recording place for the "sync frame position identification code 123" and a recording place for the "DC suppression polarity inversion pattern 124" (including a case where the recording places are partially combined or used for other at the same time). A prominent feature of the present invention exists in the structure of this sync code.

The modulation mentioned here refers to conversion of input data to modulation data according to the above-described modulation rule. In this case, this modulation processing utilizes the method of selecting modulation data corresponding to input data from plural modulation data described in a conversion table. Here, a plurality of conversion tables are prepared. Therefore, information indicating with which conversion table data is converted upon conversion is necessary and this information is the "modulation-time conversion table selection code 122". This code indicates the conversion table which generates modulation data which comes next to the modulation data just before sync code.

The "sync frame position identification code 123" is a code for identifying where in the physical sector a sync frame exists. The frame can be identified according to the arrangement pattern of plural sync frame position identification codes before and forth.

The prominent feature of the present invention exists in that the content of the sync position detecting code 121 is comprised of a pattern in which "k+1" or more "0"s continue and a pattern in which 2 "0"s continue as indicated by symbol "h" in FIG. 2. To facilitate detection of the position of the sync code 110, a code which cannot exist within the sync frame data 106 after modulation is disposed in the sync position detecting code 121. Because sync frame data 106 (d, k; m, n) after modulation is modulated according to the modulation rule, "0"s are never continuous by "k+1" in data after the modulation. Therefore, as the pattern in the sync position detecting code 121, it is preferable to dispose a pattern in which "k+1" or more "0"s continue.

However, when, as the pattern in the sync position detecting code 121, a pattern in which "k+1" "0"s continue is disposed, there is a danger that if a bit shift error occurs when the sync frame data 106 is reproduced after modulation, it may be erroneously detected as the sync position detecting code 121. Therefore, as the pattern in the sync position detecting code 121, it is preferable to dispose a pattern in which "k+2" "0"s continue. However, if the pattern in which "0"s are continuous continues too long, deflection in the phase is more likely to occur in a PLL circuit 174.

The existing DVD system utilizes a pattern in which "k+3" "0"s continue (modulation rule of the existing DVD system is (2.10; 8, 16)). Therefore, in order to secure reliability of detection of the position of the sync code 110 and information reproduction therein while suppressing generation of a bit shift error with respect to the existing DVD system, the length in which "0"s are continuous needs to be "k+3" or less according to the present invention and more preferably, "k+2".

Figure 8:
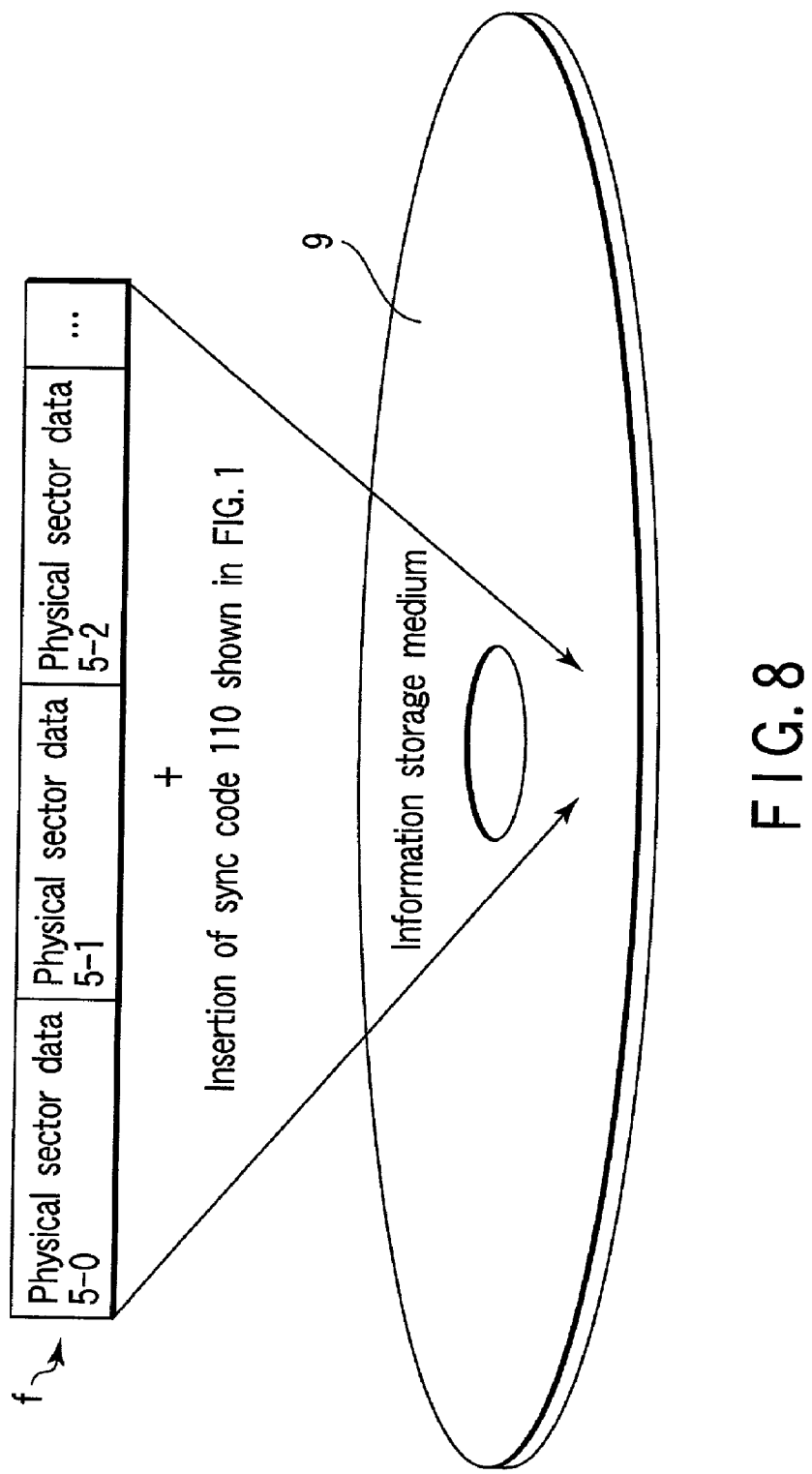
FIG. 8 is an explanatory diagram showing the relation between the aforementioned physical sector data and information storage medium.

As shown in FIG. 8 and description of Jpn. Pat. Appln. Publication No. 10-275358 (Jpn. Pat. Appln. KOKAI Publication No. 2000-105981), the digital sum value (DSV) changes largely depending upon the bit pattern after modulation. If the DSV value deflects from 0 largely, that DSV value can be brought near 0 by changing "0" to "1" at an optimum bit pattern position.

As described above, according to the present invention, the sync code 110 contains the DC suppression polarity inversion pattern 124 having a specific pattern for bringing the DSV value near 0.

If it is intended to adopt the modulation method disclosed in Jpn. Pat. Appln. KOKAI Publication No. 2000-332613, it is necessary to demodulate 6-channel bits which is a demodulation object, by using selection information of a conversion table also, adopted for modulation, of the "data after 6-channel bit modulation" existing just after the after-6-channel-bit-modulation data, which is the object of demodulation.

However, as shown by symbol "e" in FIG. 2, selection information of a 6-channel bit conversion table, which should come next to the last 6-channel bit data in the sync frame data 106 after modulation disposed just before the sync code 110, is recorded in the modulation-time conversion table selection code 122 within the sync code 110. That is, the conversion table selection code 122 for modulation time exists in the sync code 110. This conversion table selection code 122 at this modulation time is conversion table selection information for 6-channel bit data which comes next to the last 6-channel bit data of the sync frame data 106 just before. Referring to this conversion table information enables a conversion table for use when next data is demodulated to be determined.

Figure 3:
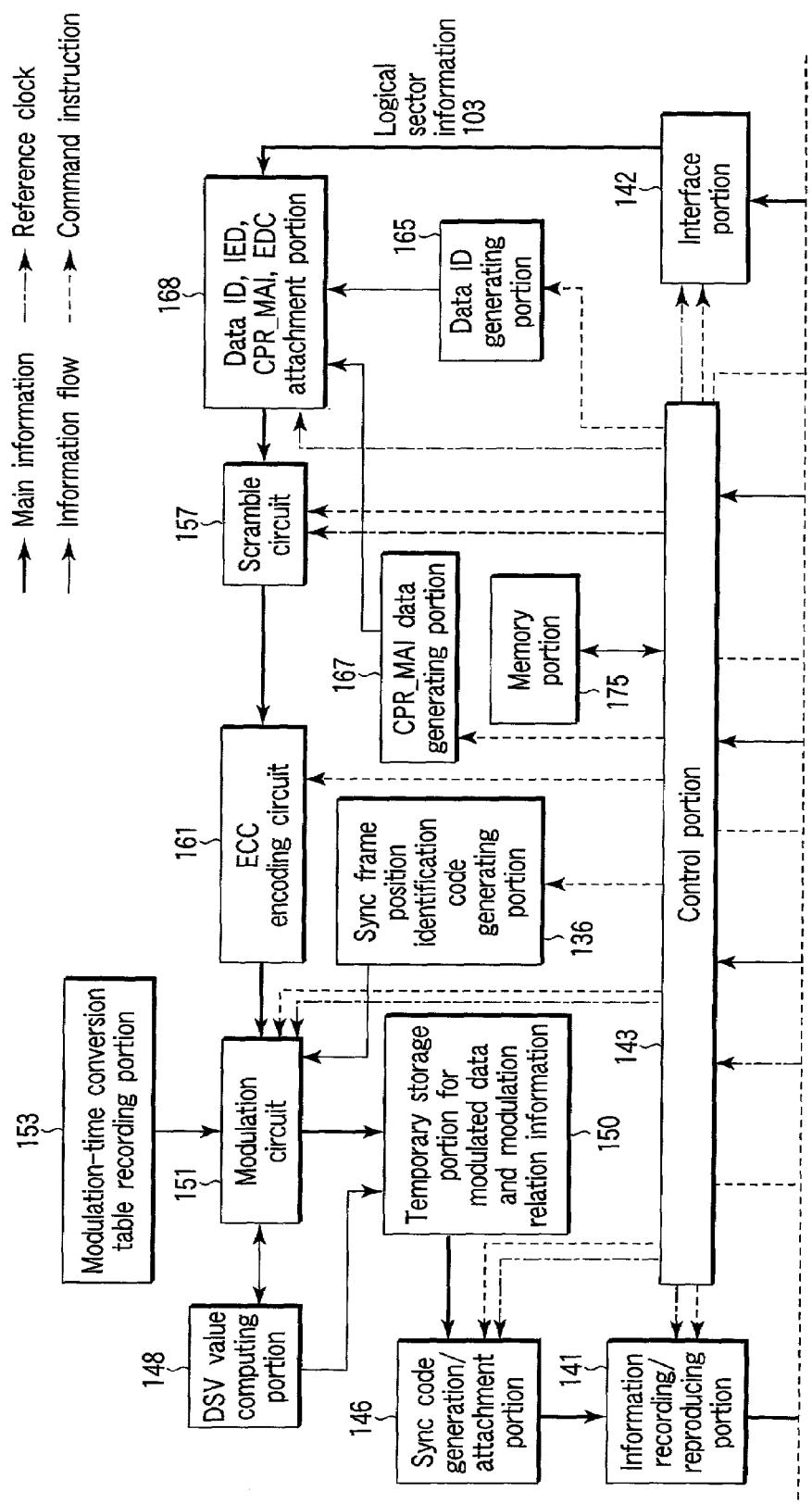
FIG. 3 is an explanatory diagram showing a recording system of an information recording/reproducing apparatus of the present invention.
Figure 4:
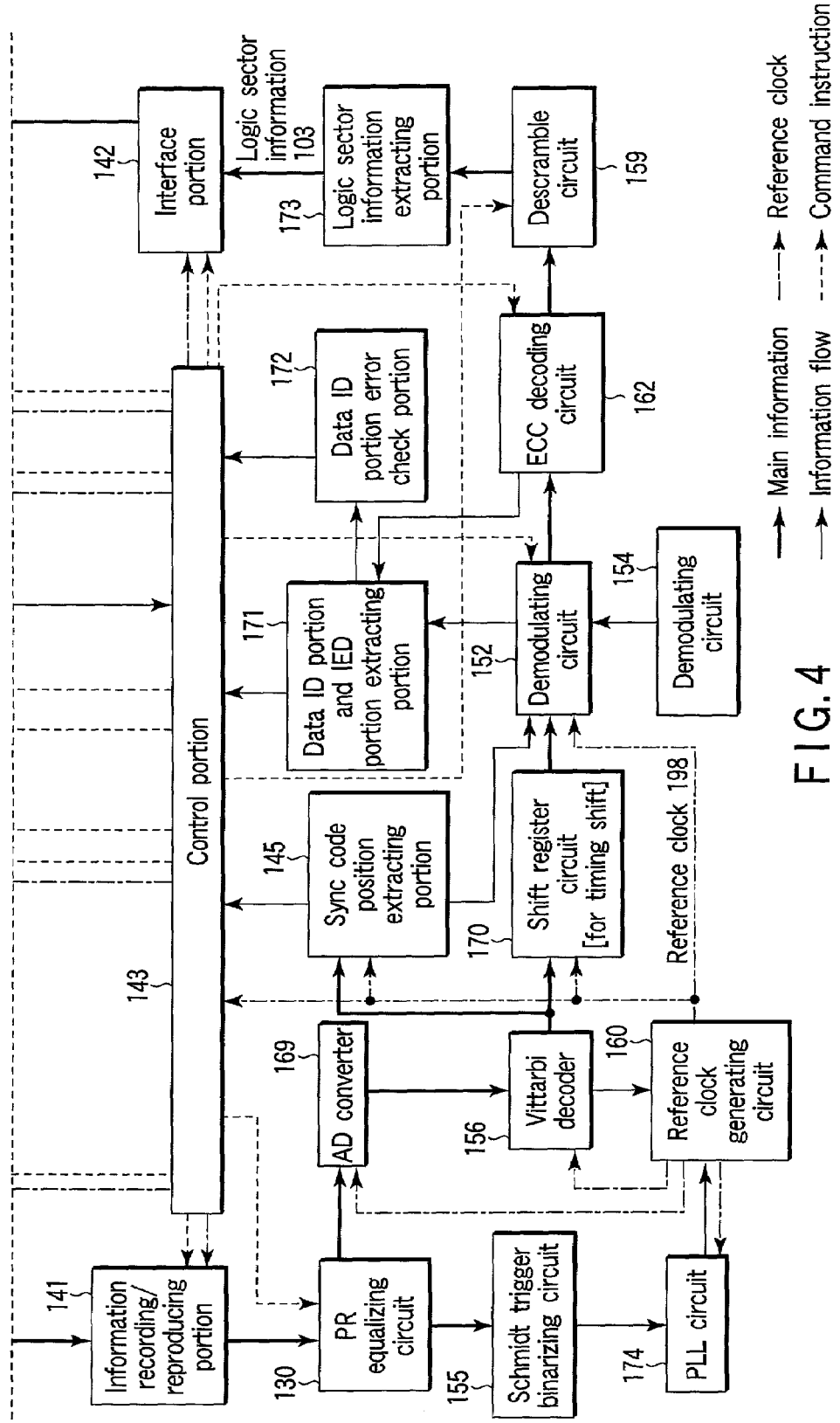
FIG. 4 is an explanatory diagram showing a reproducing system of the information recording/reproducing apparatus of the present invention.

FIGS. 3 and 4 show the structures of the information reproducing apparatus and information recording/reproducing apparatus of the present invention.

FIG. 3 indicates the recording system while FIG. 4 indicates the reproducing system. A control portion 143 controls an entire apparatus. Logic sector information 103 inputted from an interface portion 142 is supplied with Data ID, IED, CPR_MAI, EDC by a Data ID, IED, CPR_MAI, EDC attachment portion 168. Data ID is generated by a Data ID generating portion 165 according to a specified rule. CPR_MAI is outputted from a CPR_MAI generating portion 167. The logic sector information 103 provided with data ID, IED, CPR_MAI, EDC is inputted to a scramble circuit 157 and then, for example, entire data is scrambled. The scrambled data is inputted to an ECC encoding circuit 161 and converted to an ECC block. The ECC block is indicated with symbols "h" and "i" in FIG. 6.

The ECC block is inputted to a modulation circuit 151 and then modulated. This modulation processing utilizes a conversion table of a conversion table storage portion 153 (for example, a conversion table for converting from 4 bits to 6 bits). To select modulation data of the table, the DSV of continuous modulation data is calculated by a DSV computing portion 148 and DC component is selected so as to be within a predetermined level (the number of continuous 0 or 1 is a specified value or less). Further, a DC suppression polarity inversion pattern is selected corresponding to the result of DSV computation. Further, a sync frame position identification code is outputted from a sync frame position identification code generating portion 136. The sync frame position identification code is a code for identifying a frame within a single ECC block.

The modulated data (sync frame data) and modulation relation information (information and the like for selecting sync code: conversion table selection code, sync frame position identification code, or DC suppression polarity inversion pattern) are stored in a temporary storage portion 150 and next, provided to a sync code generation/attachment portion 146. The sync code generation/attachment portion 146 attaches a code indicated by symbol "h" in FIG. 2 into the sync code.

Figure 9:
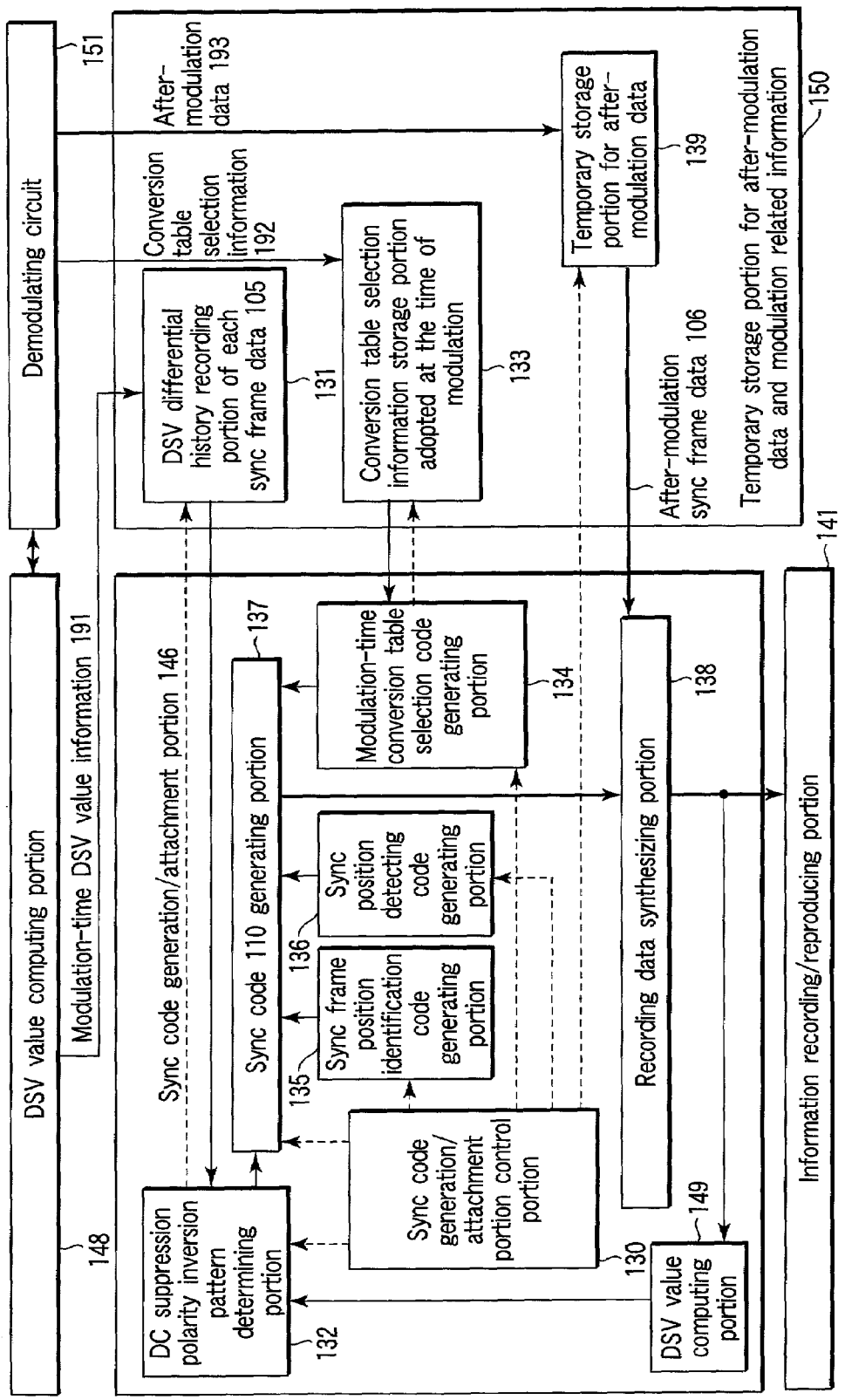
FIG. 9 is an explanatory diagram showing the structure of a sync code generation/attachment portion of the information recording/reproducing apparatus of the present invention.

The contents of the temporary storage portion 150 for the modulated data and modulation relation information and the sync code generation/attachment portion 146 are shown in FIG. 9 described later.

The above-described sync framed data is supplied to the information recording/reproducing portion 141 and recorded in an optical disc.

Data reproduced from the optical disc is equalized in waveform between the information recording/reproducing portion 141 and a PR equalizing circuit 130 and digitized by an AD converter 169. The digitized data is inputted to a sync code position extracting portion 145 and a shift register circuit 170 through a vittarbi decoding circuit 156. Modulation data of the shift register circuit 170 is inputted to a demodulation circuit 152 depending on the result of sync position extraction of the sync code position extracting portion 145 and demodulated using a conversion table of a demodulation conversion table recording portion 154 (for example, conversion from 6 bits to 4 bits). Data ID and IED are extracted from the demodulated data by a data ID portion and an IED portion extracting portion 171. A data ID portion error check portion 172 checks an error in the data ID using IED. If there is no error, it means that an ECC block is reproduced properly. If there is an error, for example, reading of the ECC block is executed again.

The ECC block is inputted to an ECC decoding circuit 162 and subjected to error correction processing. The error corrected data is descrambled by a descrambling portion 159 to its original logic sector information and extracted by a logic sector extracting portion 173. The extracted logic sector is sent to a data decode processing portion (not shown) through the interface portion 142.

FIGS. 5, 6 and 7 show that data string indicated with symbol "c" in FIG. 1 is constructed in the form of ECC block. In a portion indicated with symbol "d" in FIG. 5, respective rows of the ECC block are described in the form of data 0-0-0, 0-0-1, 0-0-2, . . . The physical sector data is constructed with 13-row frame. PI information is attached to each row of this physical sector and PO information is attached to the last row. Then, a single ECC block is constructed of plural physical sector data. The PO information is created in the unit of ECC block constructed of plural physical sectors and a row thereof is distributed in each physical sector.

Every other physical sector data is selected as shown in FIG. 7 and allocated to a first small ECC block 7-0 and a second small ECC block 7-1.

In this example, a single item of the physical sector data (portion indicated by symbol "f") is composed of 13 columns. One column thereof is part of the PO information. One small ECC block is composed of 31 physical sector data. 62 physical sector data (two small ECC blocks) are divided into even sector data and odd sector data and PO information is created for each of the even sector data and odd sector data.

FIG. 7 shows the arrangement of the physical sector data and indicates the relation between the physical sector data arranged in this way and each ECC block. FIG. 8 shows a state in which the physical sector data is arrayed on the information storage medium 9. The first and second small ECC blocks are constructed by fetching every other physical sector data arrayed on a track.

According to the embodiment of the present invention, the channel bit interval is shortened near its extreme limit aiming at intensification of the density of the information storage medium 9. As a result, the pattern of "101010101010101010101010" which is a repetition of for example, pattern of d=1 is recorded in the information storage medium 9 and when that data is reproduced by the information recording/reproducing portion 141, it is near frequency cutoff, which is MTF characteristic of reproduction optical system. Thus, the signal amplitude of the reproduction signal is almost buried in noise.

For the reason, the embodiment of the present invention employs partial response maximum likelihood (PRML) technology as a method of reproducing a recording mark or a pit having a density brought near the limit (frequency cutoff) of MTF characteristic. That is, a signal reproduced from the information recording/reproducing portion 141 is subjected to reproduction waveform correction by the PR equalizing circuit 130. A signal passing the PR equalizing circuit 130 is sampled and digitized to digital amount by an analog/digital (AD) converter 169 with timing of reference clock 198 to be sent from a reference clock generating circuit 160 and then subjected to vittarbi decoding processing within the vittarbi decoder 156.

Data subjected to the vittarbi decoding processing is treated as the same data as data binarized at a conventional slice level. If sampling timing in the AD converter 169 deflects when the PRML technology is employed, the error rate of data after the vittarbi decoding increases. Therefore, the information reproducing apparatus and the information recording/reproducing apparatus of the present invention have a special sampling timing extraction circuit (combination of a Schmidt trigger binary circuit 155 and PLL circuit 174) in order to raise sampling timing accuracy.

The information reproducing apparatus and the information recording/reproducing apparatus of the present invention have its feature in employing the Schmidt trigger binary circuit 155 as a binary circuit. This Schmidt trigger binary circuit 155 provides a slice reference level for binarization with a specific width (actually, a forward direction voltage value of a diode) and only when the specific value is exceeded, binarizes. Thus, if for example, a pattern of "101010101010101010101010" is inputted as described above, changeover of binarization does not occur because the signal amplitude is very small. If a sparse pattern, for example, "1001001001001001001001" is inputted, the amplitude of the reproduction signal is increased. Thus, in the Schmidt trigger circuit 155, polarity changeover occurs in outputted binary signal with a timing of "1". The embodiment of the present invention employs the non-return to zero invert (NRZI) method and the position of "1" in the above pattern coincides with an edge portion (boundary portion) of a recording mark or a pit.

The PLL circuit 174 detects deflections in frequency and phase between a binary signal which is an output of this Schmidt trigger binary circuit 155 and the reference clock signal 198 sent from the reference clock generating circuit 160 and changes the frequency and phase of the output clock of the PLL circuit 174. The reference clock generating circuit 160 applies feedback to the reference clock 198 (in terms of frequency and phase) so as to reduce error rate after vittarbi decoding by using an output signal of this PLL circuit 174 and decoding characteristic information (information of convergence length (distance up to convergence) in bus metric memory within the vittarbi decoder 156 (not shown)).

The ECC encoding circuit 161, ECC decoding circuit 162, scramble circuit 157 and descramble circuit 159 in FIG. 3 carry out processing in the unit of byte. If 1-byte data before modulation is modulated according to (d, k; m, n) modulation rule, the length after the modulation is:

$$8n \div m \quad (1)$$

Thus, if data processing unit in the above mentioned circuit is converted to processing unit after the modulation, the expression (1) is given. Because the processing unit of the sync frame data 106 after modulation in a portion indicated by symbol "e" in FIG. 2 is given in the form of the expression (1), if it is intended to aim at integration of processing between the sync code 110 indicated by symbol "e" in FIG. 2 and sync frame data 106 after the modulation, data size (channel bit size) of the sync code 110 needs to be set up to integer times as large as the expression (1). There exists a prominent feature of the present invention in securing integration of processing between the sync code 110 and sync frame data 106 after the modulation with the size of the sync code 110 as:

$$8Nn \div m \quad (2)$$

wherein N means an integer value.

Because in the above description, it is assumed that d=1, k=9, m=4, and n=6 as the embodiment of the present invention, if these values are substituted into the expression (2), the total data size of the sync code 110 is:

$$12N \quad (3)$$

The sync code size of the existing DVD system is 32 channel bits. However, if the total data size of the sync code 110 is smaller than 32 channel bits, data processing is simplified for the reason described about the point [1] and effect of the present invention, the reliability of position detection/information identification is improved. Therefore, according to the present invention, the total data size of the sync code 110 is desired to be 24 channel bits.

FIG. 9 shows in detail a portion (sync code generating/attachment portion 146) for generating the sync code 110 of the present invention, attaching this sync code to sync frame and creating data unit to be recorded and the temporary storage portion 150 for storing after-modulation data and modulation related information. The operation of this portion will be described with reference to FIGS. 37 and 38.

FIG. 10 shows the sync code position extracting portion 145 and the demodulation circuit 152 in detail. The operation of this portion will be described with reference to FIG. 39.

Data size of the sync code 110 (and data size of the sync frame data 106 after modulation) of the respective embodiments of the present invention is expressed as numerical data in FIGS. 23 to 36.

Figure 11:
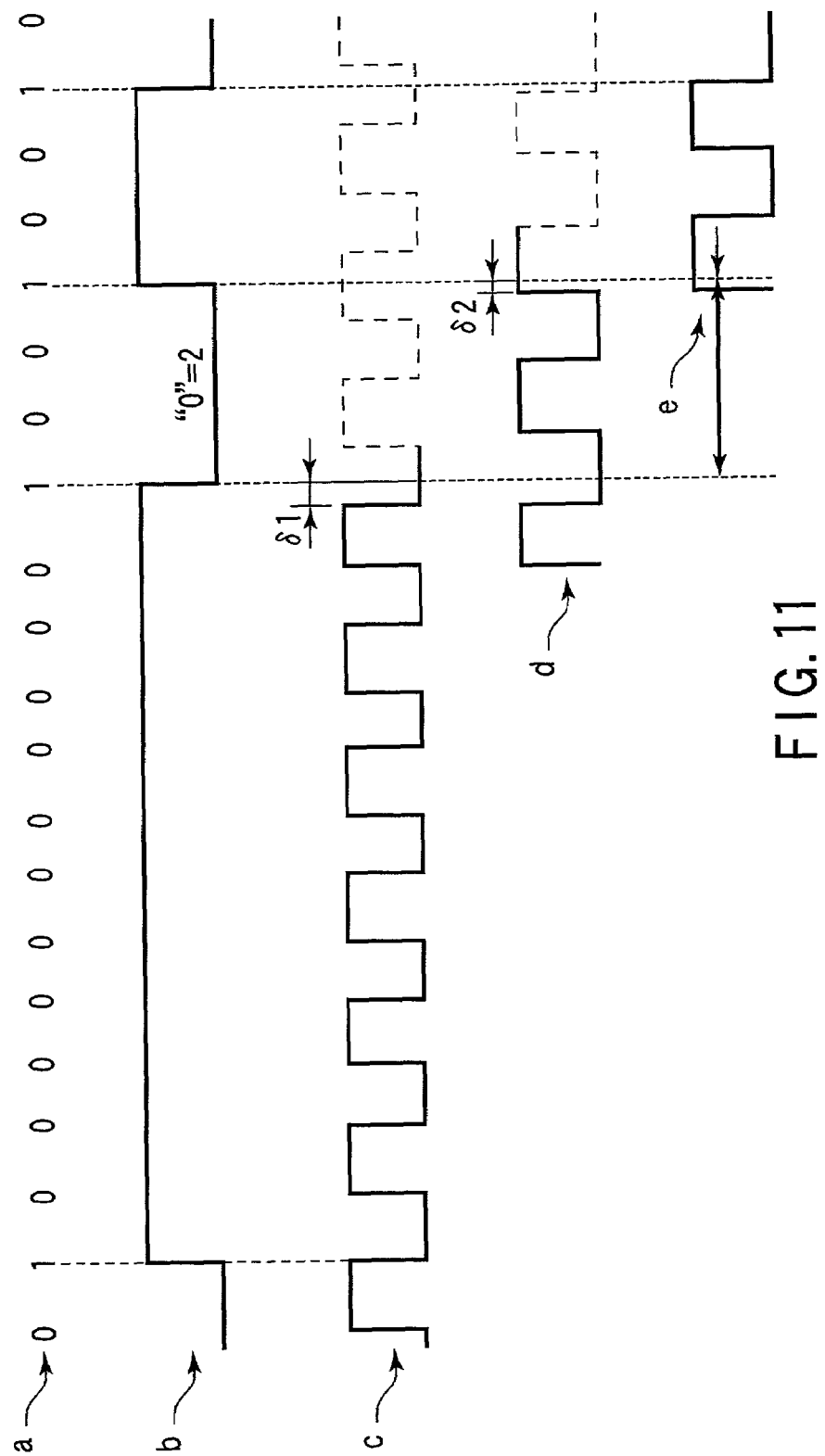
FIG. 11 is an explanatory diagram of a sync code position detecting code of the present invention.

FIG. 11 shows the relation between the operation of the PLL circuit 174 shown in FIGS. 3 and 4 and the pattern in the sync position detecting code 121.

A portion of symbol "a" in FIG. 11 indicates the content of a pattern around the sync position detecting code 121 and a portion of symbol "b" in FIG. 11 indicates output waveform of the Schmidt trigger binary circuit 155 based on the reproduction signal from the information storage medium 9. Portions of symbols "c" to "e" in FIG. 11 indicate time changes of the reference clock 198 outputted from the reference clock generating circuit 160 because of activity of the PLL circuit 174.

The PLL circuit 174 detects amount of deflections in frequency and phase between the reference clocks 198 with only the polarity changeover timing of the input signal (portion of symbol b in FIG. 11) and applies feedback thereon. Thus, the feedback of the PLL circuit 174 is not applied to a place in which "0"s continue in a long interval of the sync position detecting code 121, so that the phase of the reference clock 198 is deflected.

Thus, when "1" comes first after "0"s continue in a long interval within the sync position detecting code 121, a deflection in phase "δ1" between the reference clocks 198 is detected so that feedback is applied to the reference clock 198. However, if feedback occurs at this place, phase comparison is disabled until next "1" comes. Thus, if it takes long until the next "1" comes (that is, the number of "0"s to be inserted until the next "1" come is large), too much feedback is applied, so that conversely, the deflection in phase is likely to occur.

The feature of the present invention is that as the pattern of the sync position detecting code 121, a pattern in which "1" comes with a few "0" just after "1" comes after "0"s continues in a long interval is adopted in order to improve the phase/frequency deflection correcting performance of the PLL circuit 174.

According to the present invention, the quantity of "0"s to be disposed between "1" and "1" is restricted to 2 or less so as to raise the phase/frequency deflection correcting performance of the PLL circuit 174 more than the "10001" pattern of the existing DVD system. Because according to the present invention, the reproduction signal of the densest pattern "101" exists near the frequency cut-off frequency of the MTF characteristic to aim at intensification of the density of the information storage medium 9, the Schmidt trigger binary circuit 155 is so constructed not to obtain a binary signal which induces polarity inversion from the densest pattern "101" so as to improve the reproduction signal detection characteristic. For the above reason, as the pattern in the sync position detecting code 121, a pattern in which 2 "0"s are contained between "1" and "1" is adopted.

FIGS. 12A, 12B, and 13A to 22C show examples of the structure within the sync code of the present invention.

According to the embodiment shown in FIG. 12A, in the sync code 110, the modulation-time conversion table selection code 122 and the sync position detecting code 121 are arrayed as sync information (SY), while the DC suppression polarity inversion pattern 124 and the sync frame position identification code 123 are arrayed as frame information (FR).

According to the embodiment shown in FIG. 12B, in the sync code 110, the modulation-time conversion table selection code 122, the DC suppression polarity inversion pattern 124, and the sync position detecting code 121 are arrayed as sync information (SY), while the sync frame position identification code 123 is arrayed as frame information (FR).

According to the embodiment shown in FIG. 13A, in the sync code 110, the modulation-time conversion table selection code 122, and the sync frame position identification code 123 are arrayed in order as frame information (FR), while the sync position detecting code 121 and the DC suppression polarity inversion pattern 124 are arrayed in order as sync information (SY).

According to the embodiment shown in FIG. 13B, in the sync code 110, the modulation-time conversion table selection code 122, the DC suppression polarity inversion pattern 124 and the sync frame position identification code 123 are arrayed in order as frame information (FR), while the sync position detecting code 121 is arrayed as sync information (SY).

According to the embodiment shown in FIG. 13C, in the sync code 110, the modulation-time conversion table selection code 122, the sync frame position identification code 123, the DC suppression polarity inversion pattern 124 and the sync frame position identification code 123 are arrayed in order as frame information (FR), while the sync position detecting code 121 is arrayed as sync information (SY).

According to the embodiment shown in FIG. 14A, in the sync code 110, the modulation-time conversion table selection code 122 and the sync position detecting code 121 are arrayed as sync information (SY), while a pattern in which the sync frame position identification code 123 and the DC suppression polarity inversion pattern 124 are combined is arrayed as frame information (FR).

According to the embodiment shown in FIG. 14B, in the sync code 110, a pattern in which the modulation-time conversion table selection code 122 and the DC suppression polarity inversion pattern 124 are integrated and the sync position detecting code 121 are arrayed as sync information (SY), while the sync frame position identification code 123 is arrayed as frame information (FR).

According to the embodiment shown in FIG. 15A, in the sync code 110, a pattern in which the modulation-time conversion table selection code 122 and the sync frame position identification code 123 are integrated is arrayed as frame information (FR), while the sync position detecting code 121 and the DC suppression polarity inversion pattern 124 are arrayed as sync information (SY).

According to the embodiment shown in FIG. 15B, in the sync code 110, a pattern in which the modulation-time conversion table selection code 122 and the DC suppression polarity inversion pattern 124 are integrated and the sync frame position identification code 123 are arrayed as frame information (FR), while the sync position detecting code 121 is arrayed as sync information (SY).

According to the embodiment shown in FIG. 16A, in the sync code 110, a pattern in which the modulation-time conversion table selection code 122 and the sync frame position identification code 123 are integrated and the DC suppression polarity inversion pattern 124 are arrayed as frame information (FR), while the sync position detecting code 121 is arrayed as sync information (SY).

According to the embodiment shown in FIG. 16B, in the sync code 110, a pattern in which the sync frame position identification code 123 and the DC suppression polarity inversion pattern 124 are integrated is arrayed next to the modulation-time conversion table selection code 122 as frame information (FR), while the sync position detecting code 121 is arrayed as sync information (SY).

Figure 17A:
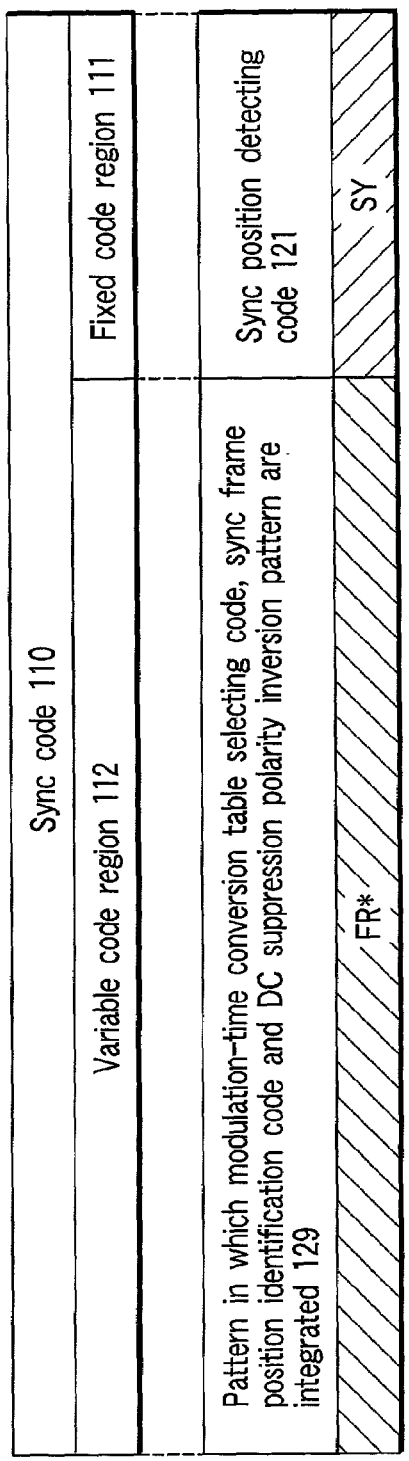
FIGS. 17A and 17B are explanatory diagrams each showing yet still another example of the structure of the sync code according to the present invention, respectively.

According to the embodiment shown in FIG. 17A, in the sync code 110, a pattern in which the modulation-time conversion table selection code 122, the sync frame position identification code 123 and the DC suppression polarity inversion pattern 124 are integrated is arrayed as frame information (FR), while the sync position detecting code 121 is arrayed as sync information (SY).

Figure 17B:
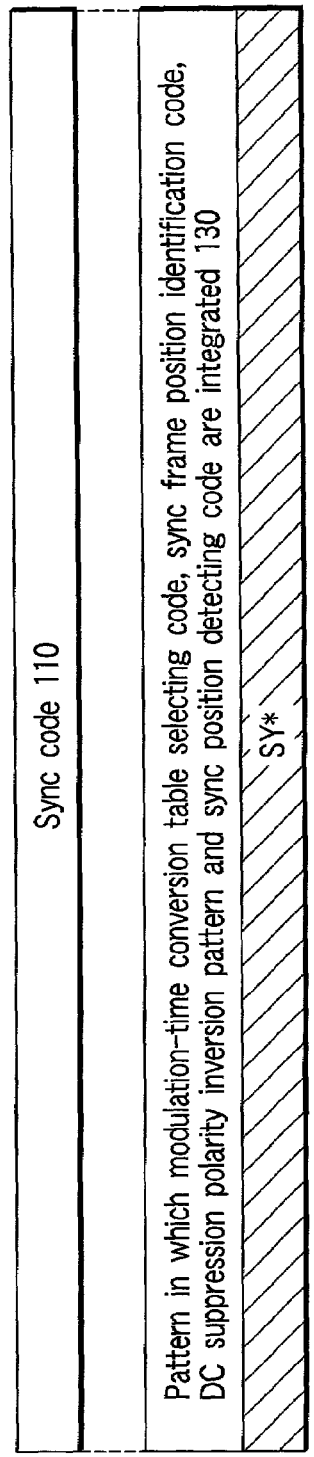

According to the embodiment shown in FIG. 17B, in the sync code 110, a pattern in which the modulation-time conversion table selection code 122, the sync frame position identification code 123, the DC suppression polarity inversion pattern 124 and the sync position detecting code 121 are integrated is arrayed as sync information (SY).

According to the embodiment shown in FIG. 18A, in the sync code 110, a pattern in which the modulation-time conversion table selection code 122 and the sync frame position identification code 123 are integrated is arrayed as frame information (FR), while a pattern in which the sync position detecting code 121 and the DC suppression polarity inversion pattern 124 are integrated is arrayed as sync information (SY).

According to the embodiment shown in FIG. 18B, the modulation-time conversion table selection code 122 and the sync frame position identification code 123 are arrayed as frame information (FR), while a pattern in which the sync position detecting code 121 and the DC suppression polarity inversion pattern 124 are integrated is arrayed as sync information (SY).

According to the embodiment shown in FIG. 19A, in the sync code 110, the modulation-time conversion table selection code 122 and the DC suppression polarity inversion pattern 124 are arrayed as sync information (SY), while a pattern in which the sync position detecting code 121 and the sync frame position identification code 123 are integrated is arrayed.

According to the embodiment shown in FIG. 20A, in the sync code 110, the modulation-time conversion table selection code 122, the sync position detecting code 121 and the DC suppression polarity inversion pattern 124 are arrayed in order as sync information (SY), while the after-modulation sync frame position identification code 125 is arrayed as frame information (FR).

According to the embodiment shown in FIG. 20B, in the sync code 110, the modulation-time conversion table selection code 122, the DC suppression polarity inversion pattern 124 and the sync position detecting code 121 are arrayed as sync information (SY), while the after-modulation sync frame position identification code 125 is arrayed as frame information (FR).

According to the embodiment shown in FIG. 21, in the sync code 110, a pattern in which the modulation-time conversion table selection code 122 and the DC suppression polarity inversion pattern are integrated is arrayed as sync information (SY) and next to this, the sync position detecting code 121 is arrayed, while the after-modulation sync frame position identification code 125 is arrayed as frame information (FR).

Figure 22A:
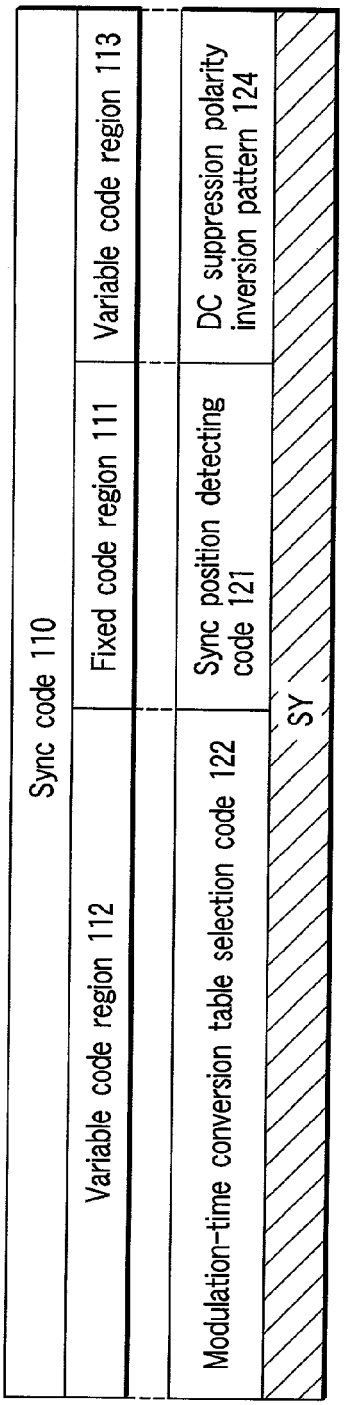
FIGS. 22A, 22B and 22C are explanatory diagrams each showing yet still another example of the structure of the sync code according to the present invention.

According to the embodiment shown in FIG. 22A, in the sync code 110, the modulation-time conversion table selection code 122, the sync position detecting code 121 and the DC suppression polarity inversion pattern 124 are arrayed in order as sync information (SY).

Figure 22B:
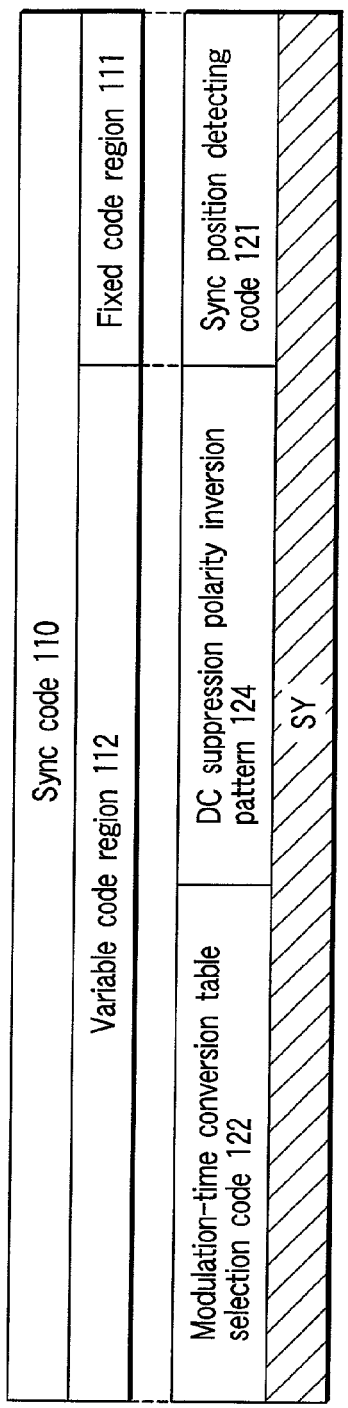

According to the embodiment shown in FIG. 22B, in the sync code 110, the modulation-time conversion table 122, the DC suppression polarity inversion pattern 124 and the sync position detecting code 121 are arrayed as sync information (SY).

Figure 22C:
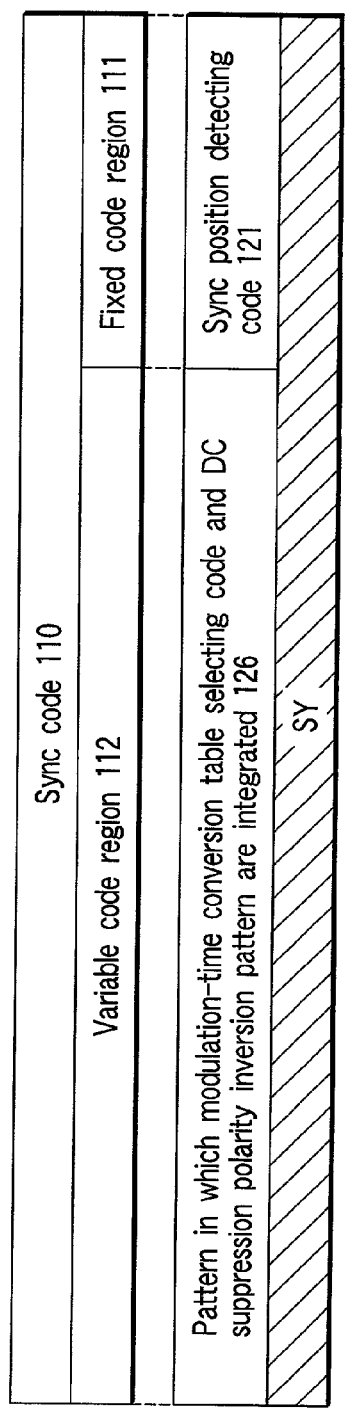

According to the embodiment shown in FIG. 22C, in the sync code 110, a pattern in which the modulation-time conversion table selection code 122 and the DC suppression polarity inversion pattern 124 are integrated is arrayed and the sync position detecting code 121 is arrayed next to it as sync information (SY).

According to other example of the sync code 110 of the present invention, the after-modulation conversion table selection code 122, the sync position detecting code 121, the sync frame position identification code 123 and the DC suppression polarity inversion pattern 124 are arrayed separately without being used in combination.

Further, it is permissible to integrate or employ at the same time different codes and pattern partially.

FIGS. 20A, 20B and 21 show the structure of modification of the sync frame position identification code 125 after modulation. Consequently, the sync code detecting performance can be improved by lowering the channel bit size of the non-modulation data region 108.

FIG. 22 shows a concrete structure of information about only "SY" used in FIGS. 29 to 32 and 35 described later and employing this structure enables availability of user data to the information storage medium 9 to be raised.

Next, FIGS. 23 to 26 show examples of concrete bit patterns in the sync code 110.

Each shows a concrete bit pattern corresponding to the structure of the sync code 110 shown in each of FIGS. 14A, 14B, 15A and 17A. "*" in FIGS. 23 to 26 means that "0" or "1" is selected appropriately so that the DSV value approaches "0".

Figure 23:
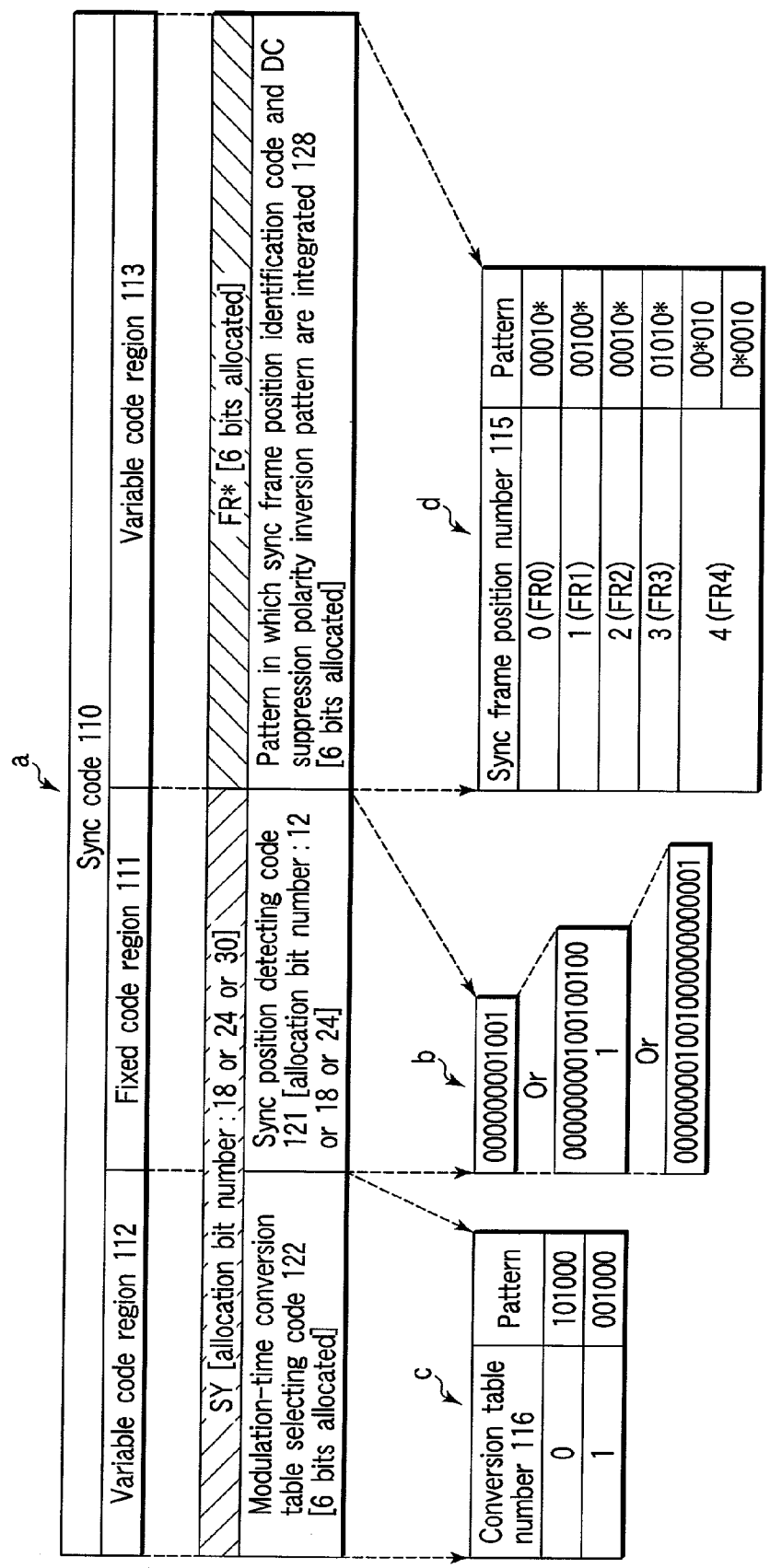
FIG. 23 is an explanatory diagram showing an example of a specific bit pattern of the sync code according to the present invention.

The feature of the example shown in FIG. 23 is that "k+2" "0"s continue by combining the modulation-time conversion table selection code 122 with the sync position detecting code. A portion indicated with the symbol "a" is the same as the content shown in FIG. 14A. The modulation-time conversion table selection code 122 has two patterns and as the conversion table number, 0 or 1 is set up (portion indicated by symbol "c"). As the sync position detecting code 121, 12 bits, 18 bits or 24 bits are allocated (portion indicated by symbol "b"). As a pattern in which the sync frame position identification code and DC suppression polarity inversion pattern are integrated, 6 bits are allocated (portion indicated by symbol "d").

Pattern 00010* means frame 0, pattern 00100* means frame 1, pattern 00010* means frame 2, pattern 01010* means frame 3, and pattern 00*010 or 0*0010 means frame 4.

As described above, the pattern of the sync position detecting code 121 satisfies following condition. The interval between "1" and "1" 1) has a longer portion than the maximum length which can occur in modulation rule, 2) does not contain the densest (minimum) length which can occur in the modulation rule (because a longer pattern next to the minimum is advantageous for PLL correction) and 3) has a portion in which "k+2" "0"s continue by combining the modulation-time conversion table selection code with the sync position detection code.

Figure 24:
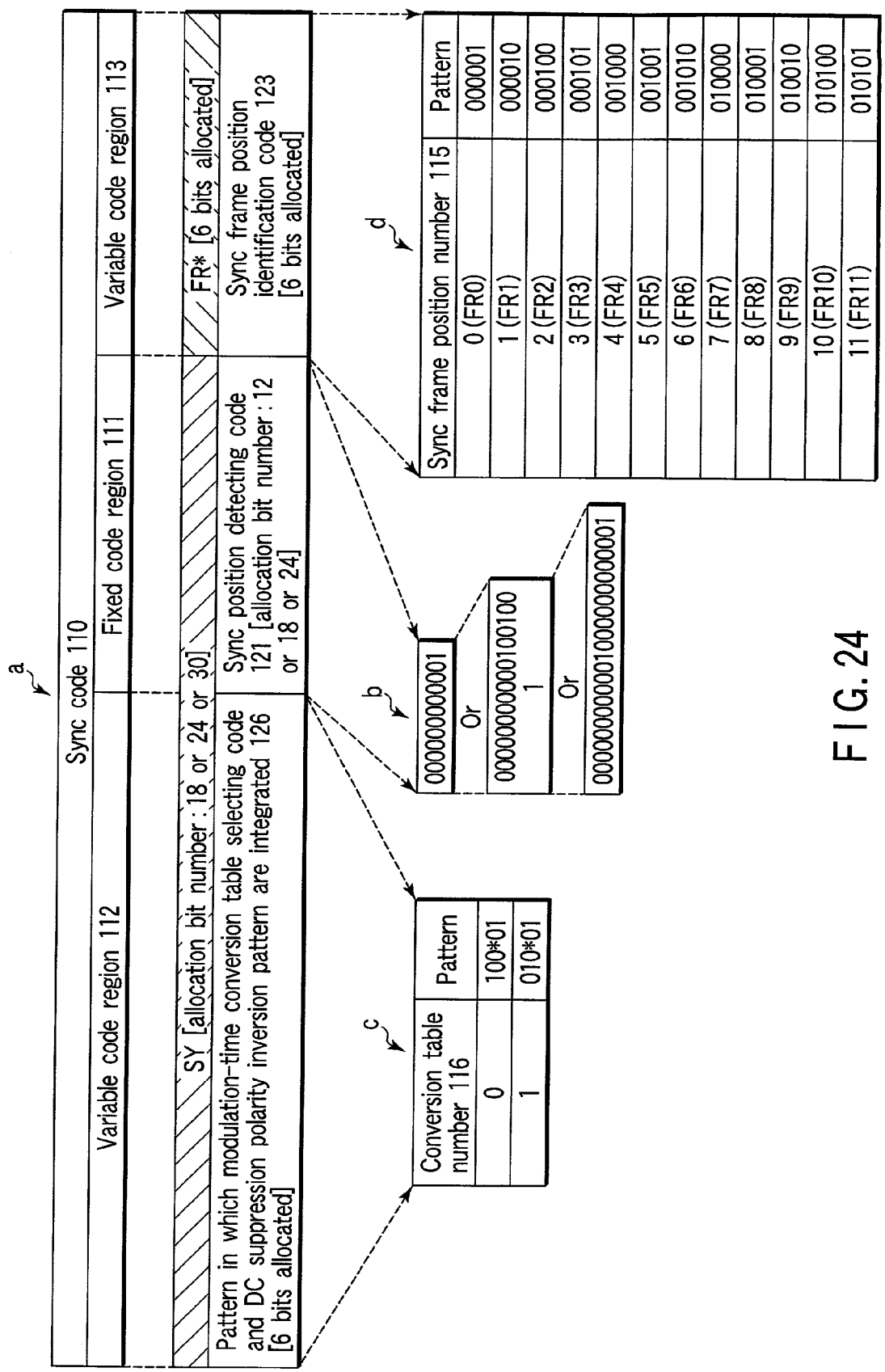
FIG. 24 is an explanatory diagram showing another example of a specific bit pattern of the sync code according to the present invention.

The example shown in FIG. 24 indicates a concrete bit pattern corresponding to the structure of the sync code 110 shown in FIG. 14B. In this example, a pattern in which the modulation-time conversion table selection code and the DC suppression polarity inversion pattern are integrated is used before the sync position detecting code 121.

As for the pattern, 100*1 is set up as the pattern of table number 0 and 010*0 is set up as the pattern of the table number 1 (portion indicated by symbol "c"). As the sync position detecting code 121, 12 bits, 18 bits or 24 bits are adopted as described in a portion indicated by symbol "b". Further, 6 bits are allocated to the sync frame position identification code 123 and 8 patterns of 12 patterns are adopted (portion indicated by symbol "d").

This example also has following rule: the interval between "1" and "1" 1) has a portion longer than the maximum length which can occur in the modulation rule, and 2) does not contain the densest (minimum) length which can occur in the modulation rule.

Figure 25:
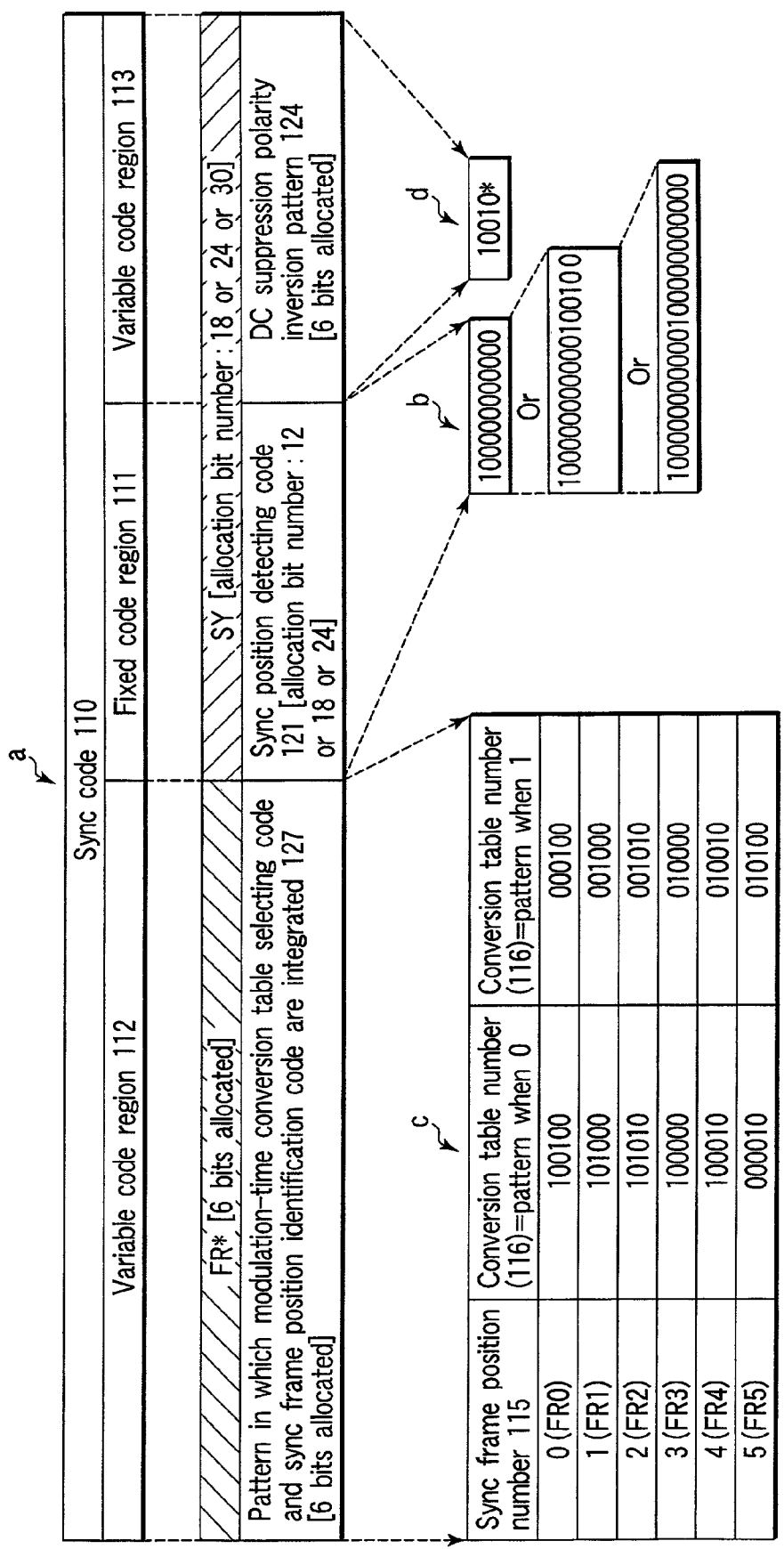
FIG. 25 is an explanatory diagram showing still another example of a specific bit pattern of the sync code according to the present invention.

The example shown in FIG. 25 indicates a concrete bit pattern corresponding to the structure of the sync code 110 shown in FIG. 15A. In this example, a pattern in which the modulation-time conversion table selection code 122 and the sync frame position identification code 123 are integrated (6 bits allocated) is arrayed as frame information (FR) and as sync information (SY), the sync position detecting code 121 (12 or 18 or 24 bits) and the DC suppression polarity inversion pattern 124 (6 bits) are arrayed.

As the sync frame position number, six patterns in which conversion table 0 is used and 6 patterns in which conversion table 1 is used are set up (portion indicated by symbol "c").

As the sync position detecting code 121, any code in a portion indicated by symbol "b" is adopted. Further, as the DC suppression polarity inversion pattern 124, 6 bits are allocated and 10010* is used.

In this example, the pattern of the sync position detecting code 121 has following rule: the interval between "1" and "1" 1) is longer than the maximum length which can occur in the modulation rule (in this example, "k+2" "0"s continue) and 2) constitutes a pattern in which 2 "0"s continue by combining the sync position detecting code with the DC suppression polarity determining pattern.

Figure 26:
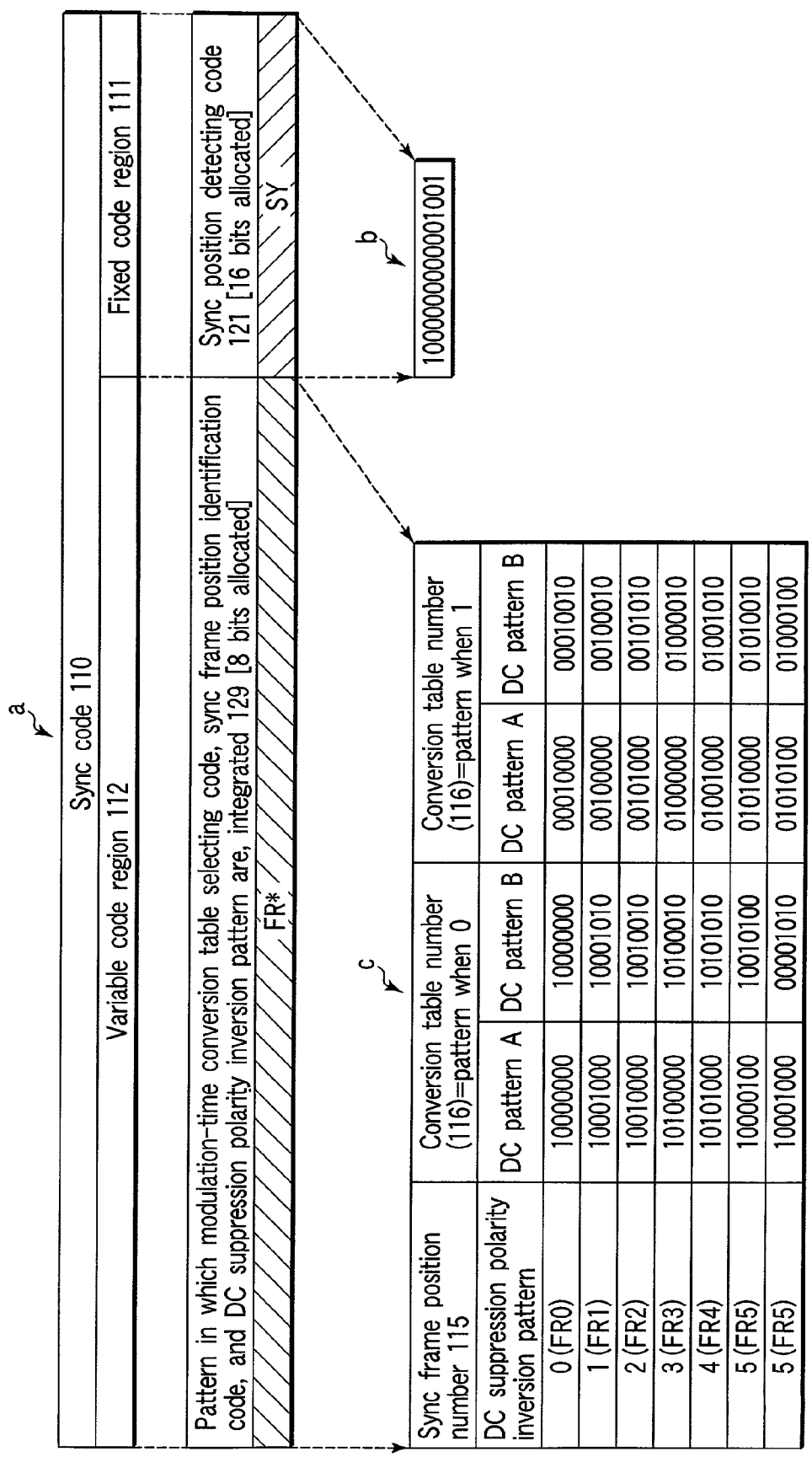
FIG. 26 is an explanatory diagram showing yet still another example of a specific bit pattern of the sync code according to the present invention.

The example shown in FIG. 26 indicates a concrete bit pattern corresponding to the structure of the sync code 110 shown in FIG. 17A. According to this example, in the sync code 110, a pattern (8 bits) (portion indicated by symbol "c") in which the modulation-time conversion table selection code 122, the sync frame position identification code 123 and the DC suppression polarity inversion pattern 124 are integrated is arrayed as frame information (FR), while the sync position detecting code 121 (portion indicated by symbol "b") is arrayed as sync information (SY).

As the sync frame position number, 14 patterns in which the conversion table 0 is used and 14 patterns in which the conversion table 1 is used are set up (portion indicated by symbol "c"). Further, the conversion tables 0 and 1 are divided into DC pattern A (7 types) and DC patterns B (7 types).

This embodiment also has following rule about the pattern of the sync position detecting code 121: the interval between "1" and "1", 2) is longer than the maximum length which can occur in the modulation rule, 2) does not contain the densest (minimum) length which can occur in the modulation rule (constituting a pattern in which 2 "0"s continues).

FIGS. 27 to 35 show respective embodiments of the sync code arrangement method in a physical sector of the present invention. Symbol "b" in FIGS. 27 to 35 indicates rearrangement of the arrangement of the sync code 110 mentioned linearly in a portion indicated by symbol "e" in FIG. 2 and the after-modulation sync frame data 106 in matrix manner.

As an applied example of the embodiments of the present invention, the structure inside the sync code may be of various types as shown in FIGS. 12A to 22C. In order to obtain correspondence between the structure inside the sync code 110 to be used in FIGS. 27 to 35 and the structure shown in FIGS. 12A to 22C, respective portions in respective structures shown in FIGS. 12A to 22C are classified into groups "SY", "SY*", "FR*" (* indicates a numerical value) and FIGS. 12A to 22C indicate correspondence between the respective portions and the aforementioned groups.

Figure 27:
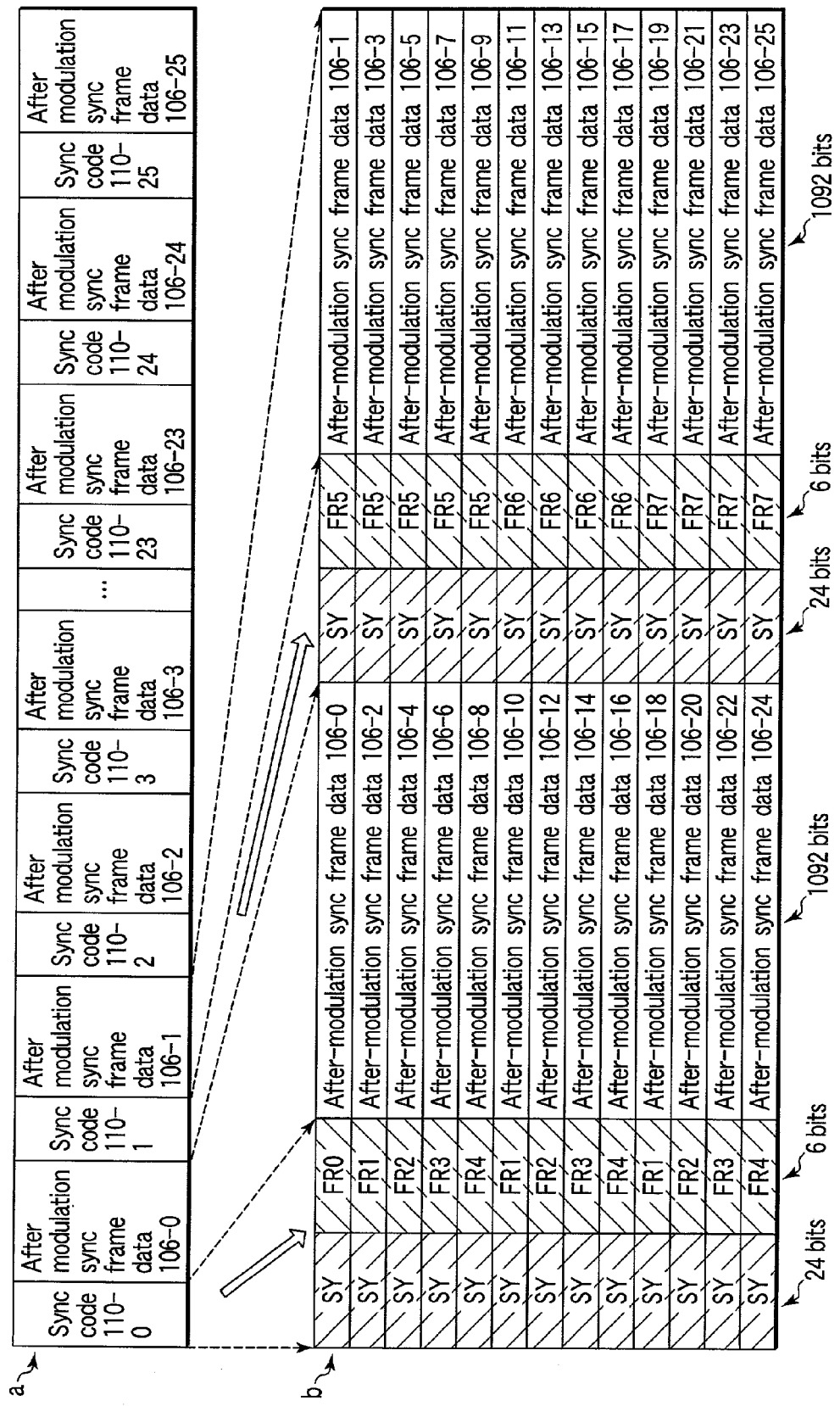
FIG. 27 is an explanatory diagram showing an example of the relation of array between the sync code and modulated sync frame data according to the present invention.

For example, because "SY", "FR*" are arranged in this order inside the sync code 110 in FIG. 27, all the structures shown in FIGS. 12A, 12B, 14A, 14B, 20A, 20B and 21 correspond to the structure inside the sync code 110 shown in FIG. 27.

Figure 33:
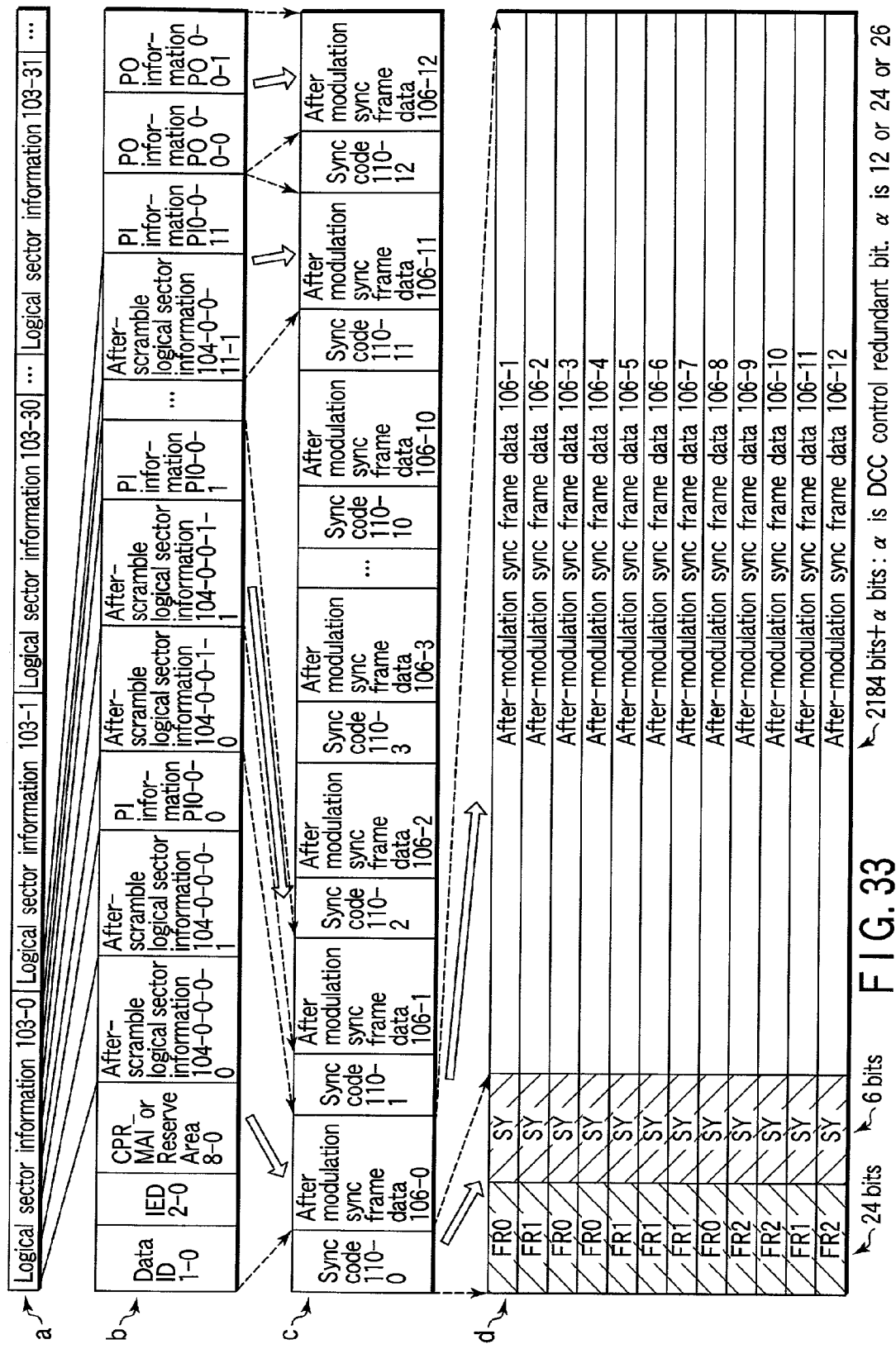
FIG. 33 is an explanatory diagram showing yet still another example of the relation of array between the sync code and modulated sync frame data according to the present invention.

Because in case of the structures shown in FIGS. 27 and 33, "FR*" comes after "SY", the sync position detection code detecting portion 182 shown in FIG. 10 detects the position of the sync code 110 from "SY" and after that, transmits "FR*" which comes just after it to an identifying portion 185 inside the sync frame position identifying code through a variable code transmitting portion 184. Consequently, the position of the sync code 110 in a physical sector is determined.

Figure 28:
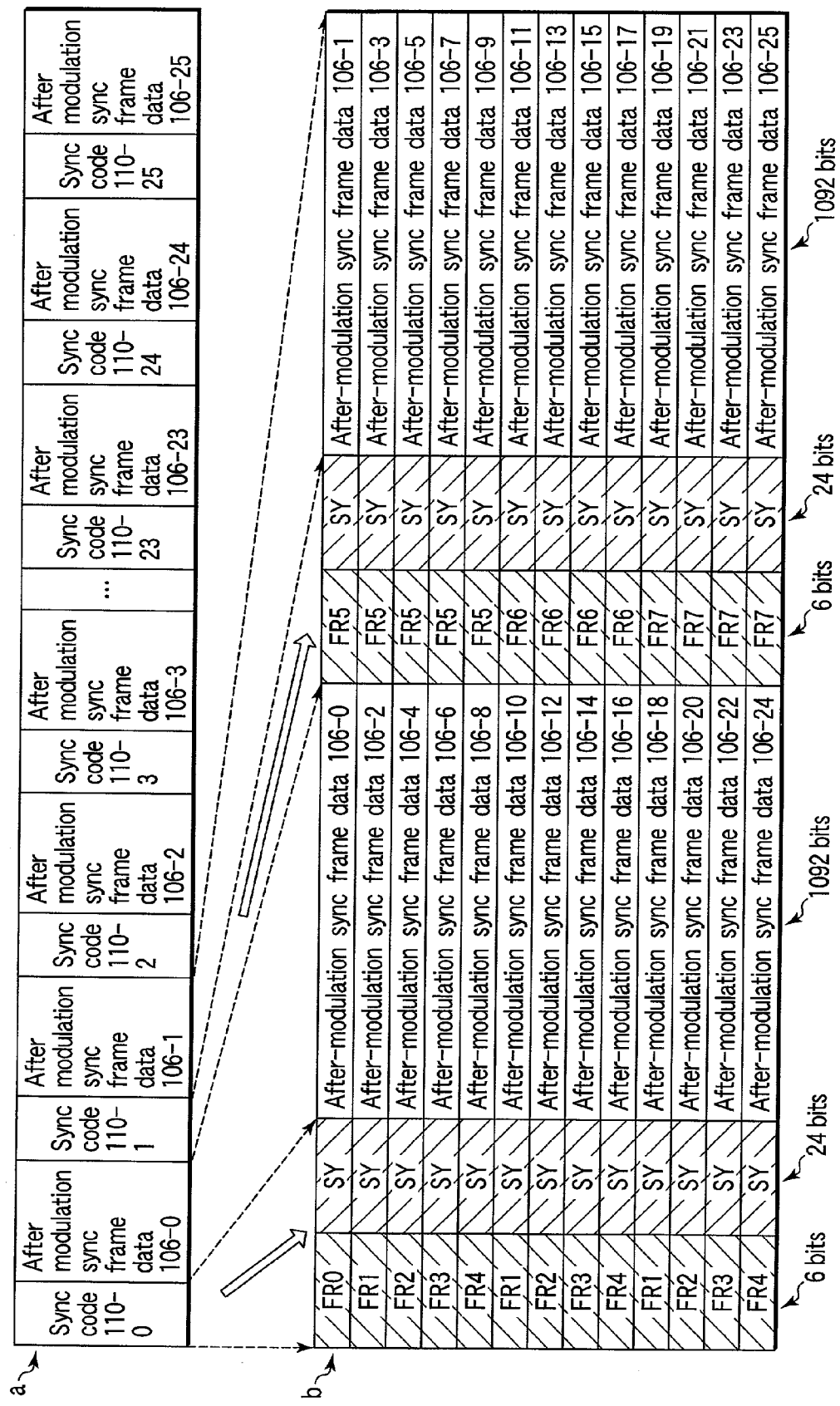
FIG. 28 is an explanatory diagram showing another example of the relation of array between the sync code and modulated sync frame data according to the present invention.
Figure 29:
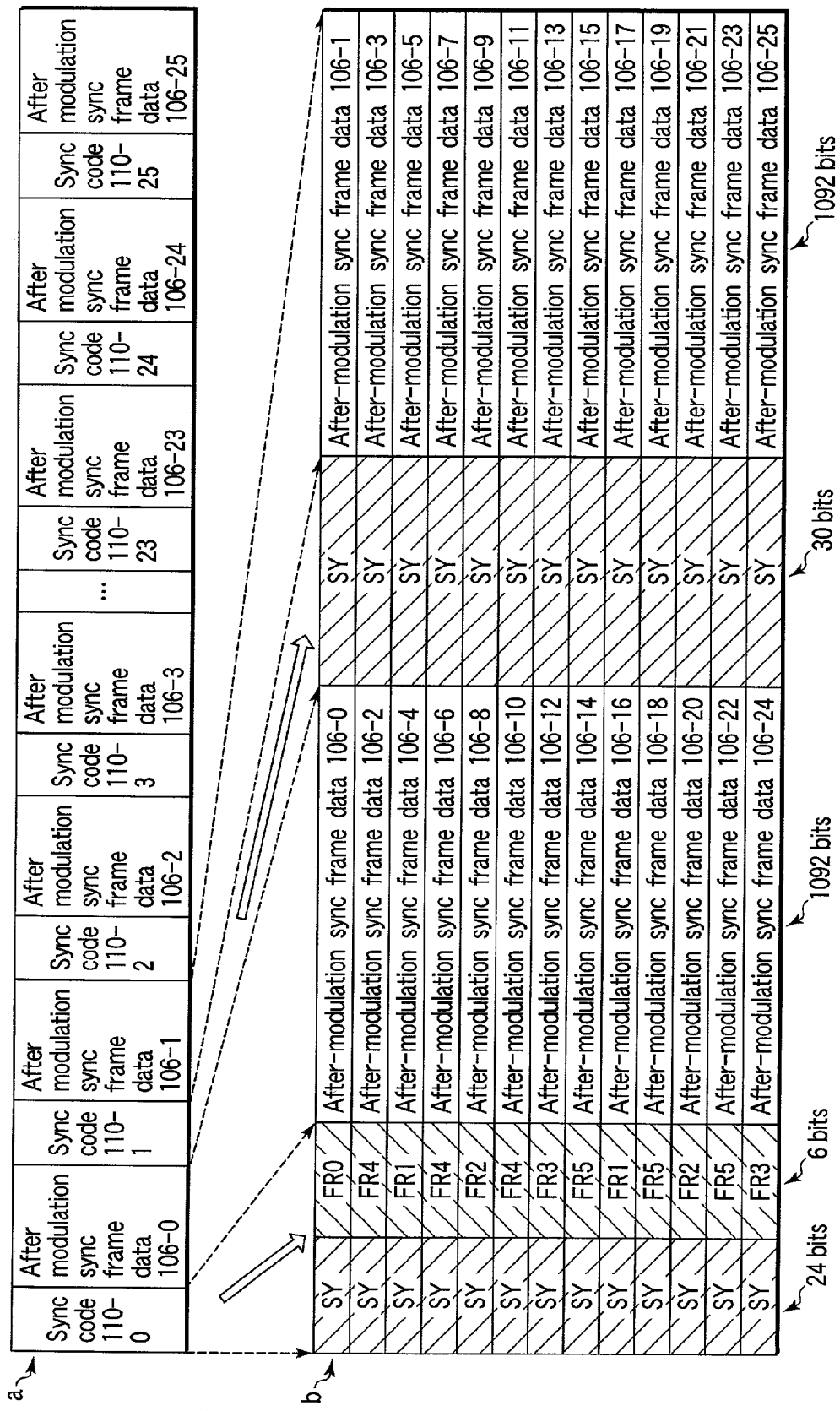
FIG. 29 is an explanatory diagram showing still another example of the relation of array between the sync code and modulated sync frame data according to the present invention.

Because in case of the structure shown in FIG. 28, "FR*" is disposed before "SY", it is transmitted to the identifying portion 185 inside the sync frame position identifying code through a variable code transmitting portion 183 and the position of the sync code 110 in the physical sector is determined.

In case of the structure shown in FIGS. 29 to 32, half of the sync code 110 is information about only "SY" which does not contain any sync frame position identifying code. Here, only DSV value correction is carried out for the after-modulation data by the incorporated DC control polarity inversion pattern 124.

In case of the structure shown in FIGS. 29 to 32, the size of the portion "SY" is set to 24 bits like other sync code 110. However because the function of the "SY" is limited, the size of this portion is set small so as to reduce the total bit number for use in the sync code 110 in a single physical sector. Consequently, there is such an effect that availability of user data to the information storage medium 9 can be improved (improvement of the occupation ratio of the sync frame data 106 in a single physical sector). In order to raise the effect of improved availability further as other applied example of the present invention, the number of the sync codes 110 to be inserted into a physical sector in a conventional DVD may be reduced from 26 to 13 as shown in FIG. 33.

FIGS. 34 and 35 show another embodiment relating to the sync code arrangement method in a physical sector of the present invention.

The structure inside the sync code of FIG. 35 is of any one of the structures shown in FIGS. 17B, 19A and 19B and the structure of FIG. 34 is of any one of the structures shown in FIGS. 13A to 13C, 15A, 15B, 16A, 16B, 17A, 18A and 18B. However, in the structures of FIGS. 35 and 34, the combination and arrangement order of the sync position numbers 115 corresponding to the sync frame position identification code 123 substantially employed (serving for other code/pattern also) are the same.

The prominent feature of the present invention is that "SY0" in FIG. 35 or "FR0" in FIG. 34 is not only disposed at a first place in the same physical sector, but also the same "SY0" or "FR0" is disposed at other places (2nd, 5th, 7th, 14th, 15th, 18th, and 20th). The next feature of the present invention is that when a physical sector is completely divided into two sections (divided into two sections with a final portion of the sync frame data 106-12 after modulation as a border), the arrangement positions of "SY0 " or "FR0" before and after division into two sections coincide with each other completely.

"SY0" or "FR0" exists just before the sync frame data 106-0 after the modulation and correspondingly, "SY0" or "FR0" exists just before the sync frame data 106-13 after the modulation. Further, "SY0" or "FR0" exists just before the sync frame data 106-1 after the modulation and correspondingly, "SY0" or "FR0" exists just before the sync frame data 106-14 after the modulation. Further, "SY0" or "FR0" exists just before the sync frame data 106-4 after the modulation and correspondingly, "SY0" or "FR0" exists just before the sync frame data 106-17 after the modulation.

If a physical sector is divided into two sections and then "SY0" or "FR0" is disposed symmetrically across this division, when "SY0" or "FR0" is detected at an arbitrary position within the physical sector, a range for searching for an allocation position of the sync frame data 160 after the modulation is changed from conventional 26 types to half thereof, that is, 13 types. This means that the allocation position searching processing of the sync frame data 106 after the modulation is simplified.

"SY1" or "FR1" and "SY2" or "FR2" are disposed symmetrically and in an inverted state across that two-division line. That is, "SY1" or "FR1" exists just before the sync frame data 106-2 after the modulation and "SY2" or "FR2" in which 2 replaces 1 exists just before the sync frame data 106-15 after the modulation located at a corresponding symmetrical position. Further, "SY2" or "FR2" exists just before the sync frame data 106-11 after the modulation and further, "SY1" or "FR1" in which 2 replaces 1 exists just before the sync frame data 106-24 after the modulation located at a corresponding symmetrical place.

If seeing the allocation across the two-division line of the physical sector, "SY0" or "FR0" is disposed symmetrically across the division line and "SY1" or "FR1" and "SY2" or "FR2" are disposed symmetrically across the division line such that 2 replaces 1. If with only three kinds "SY0", "SY1" and "SY2" or three kinds "FR0", "FR1" and "FR2" being disposed, the continuous arrangement order of the sync codes 110 is searched, the position of the sync frame data 106 after modulation being currently modulated can be searched for.

Next, the method of searching for the position of data being currently reproduced in the physical sector by using the arrangement of information across the division line about plural sync codes 110 corresponding to the sync code arrangement method shown in FIGS. 34 and 35 will be described with reference to FIGS. 36 and 42. In the meantime, FIGS. 37 to 41 describe an example of the operation of the apparatus shown in FIGS. 3 and 4 and this will be described later.

Output data of the vittarbi decoder 156 (see FIG. 4) shown in FIG. 36 is sent to the sync code position extracting portion 145 (step ST51 in FIG. 42), so that it turns to an object for extracting the sync code 110. That is, this is the sync position detection code detecting portion 182, which detects the position of the sync position detecting code 121 according to the pattern matching method (step ST52 in FIG. 42).

After that, information about the detected sync code 110 is stored into a memory portion 175 shown in FIG. 36 successively through the control portion 143. That is, information about the sync frame position identification code 123 is extracted by the identifying portions 185, 186 inside the sync deflection free position identifying code by using detection timing of step ST52 and extraction history information is recorded into the memory portion 175 through the control portion 143 (step ST53 in FIG. 42).

If the position of the sync code 110 is found, only the sync frame data 106 after the modulation in data outputted from the vittarbi decoder 156 is extracted and sent to the shift register circuit 170. That is, only the sync frame data 106 after the modulation is extracted using the timing of step ST52 and the sync frame data 106 after the modulation is sent to the shift register circuit 170 in order to match the timing by delaying (step ST54 in FIG. 42).

Next, the control portion 143 reads out history information of the sync code 110 recorded in the memory portion 175 so as to identify the arrangement order of the sync frame position identification code (step ST55 in FIG. 42). Then, the position of the after-modulation sync frame data 106 stored temporarily in the shift register circuit 170, in the physical sector is determined (step ST56 in FIG. 42). That is, the control portion 143 determines the position of the after-modulation sync frame data 106 transmitted to the shift register circuit 170, in the physical sector, according to data about the arrangement order shown in FIG. 34 or 35 of the identified sync frame position identifying codes.

Next, the after-modulation sync frame data 106 transmitted to the shift register circuit 170 is sent to the demodulation circuit 152 as required, so that demodulation is started (step ST57).

For example if the arrangement order of the sync codes 110 stored in the memory portion 175 as shown in FIG. 36 is "FR0→FR2→FR1" or "SY0→SY2→SY1", "after-modulation sync frame data 106-6" exists just after "FR0" or "SY0". If the "after-modulation sync frame data 106-0" exists just after "FR0" or "SY0" when "FR0→FR0→FR1" or "SY0→SY0→SY1" is provided, the position thereof can be determined.

Figure 30:
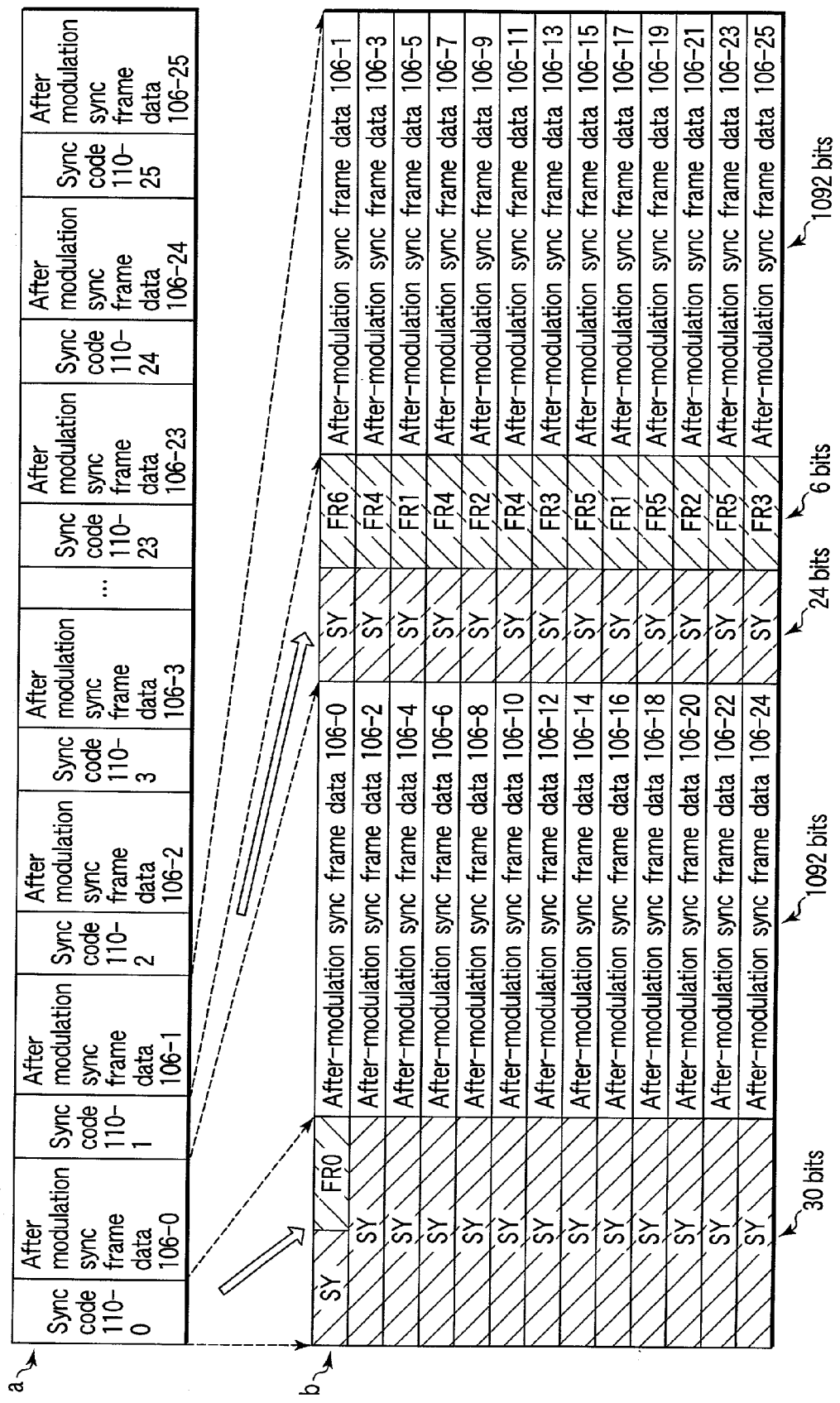
FIG. 30 is an explanatory diagram showing yet still another example of the relation of array between the sync code and modulated sync frame data according to the present invention.
Figure 31:
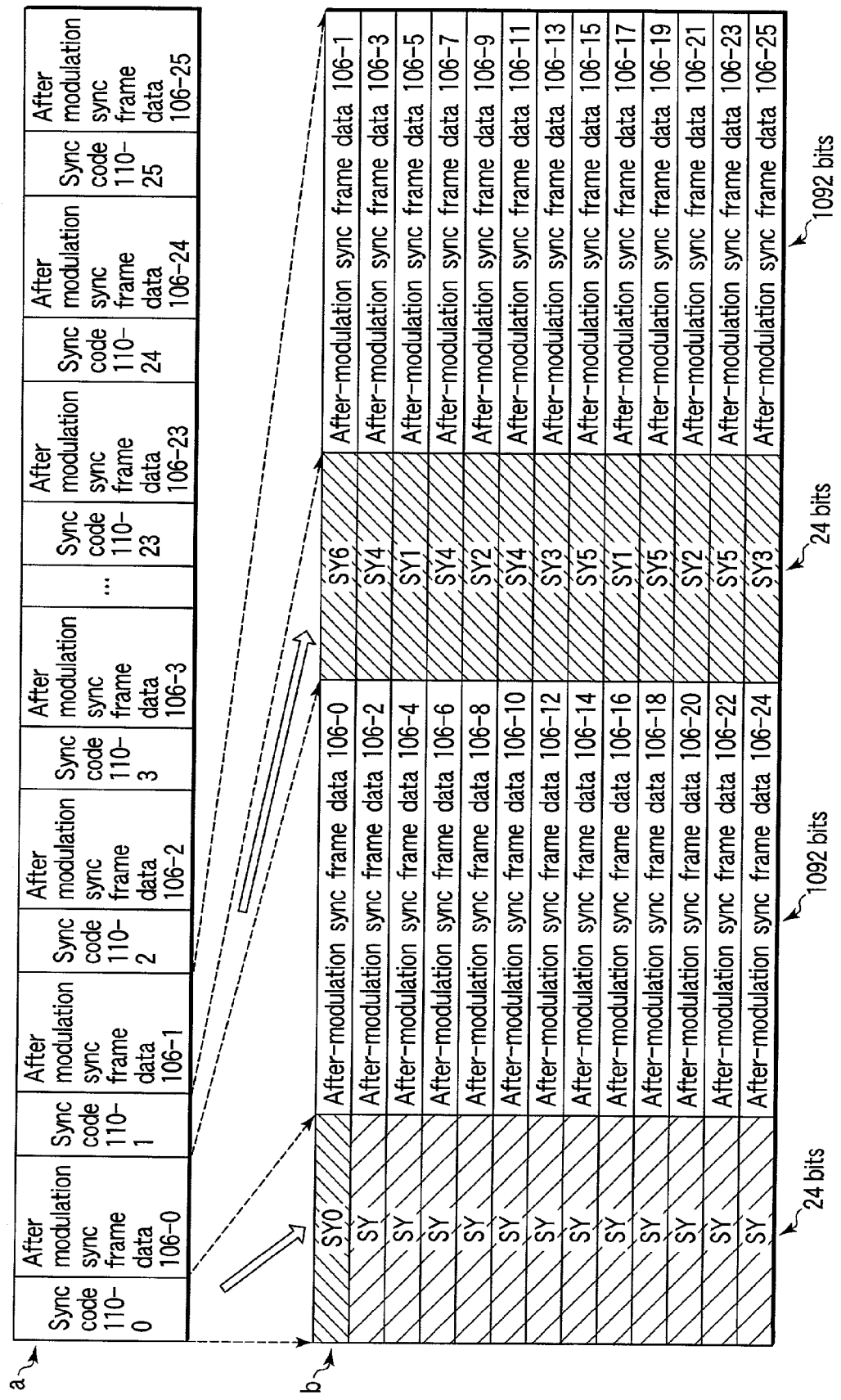
FIG. 31 is an explanatory diagram showing yet still another example of the relation of array between the sync code and modulated sync frame data according to the present invention.
Figure 32:
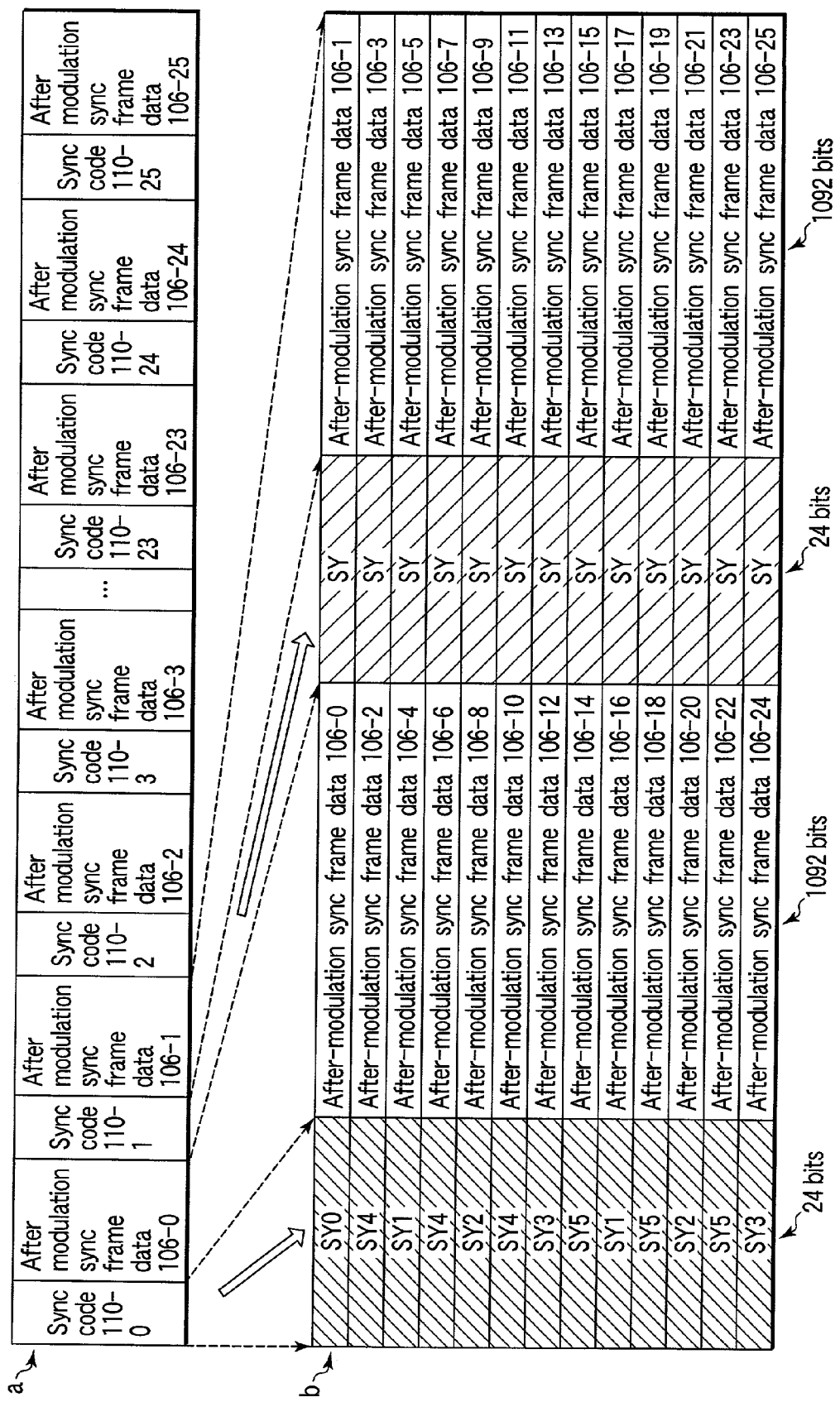
FIG. 32 is an explanatory diagram showing yet still another example of the relation of array between the sync code and modulated sync frame data according to the present invention.

If the position in the physical sector is determined and it can be recognized that the after-modulation sync frame data 106 at a desired position has been inputted into the shift register circuit 170, that data is transmitted to the demodulating circuit 152 so that demodulation is started (ST57 in FIG. 30).

Figure 37:
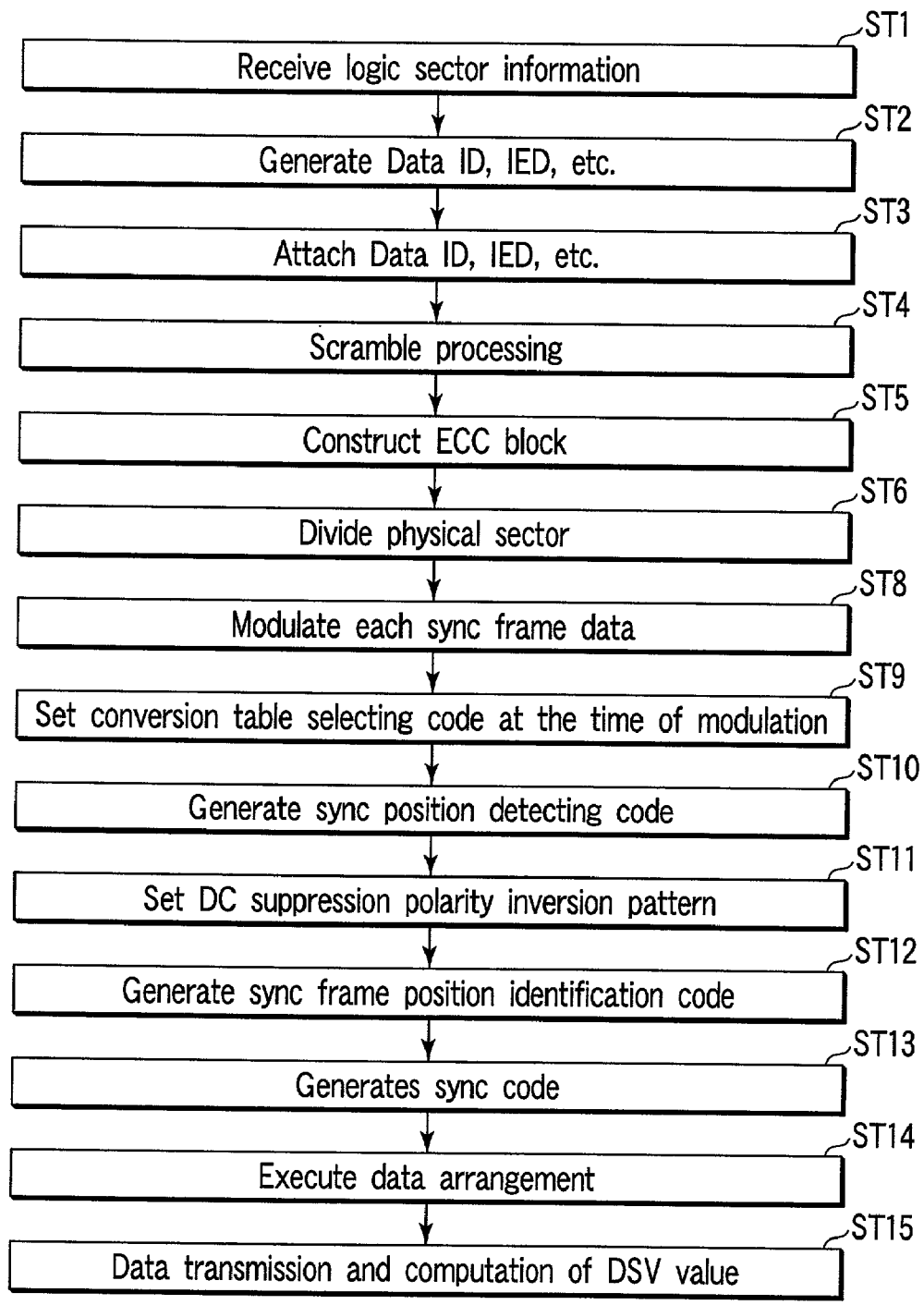
FIG. 37 is a flow chart for explaining data conversion processing in case where the sync code shown in FIGS. 11 to 13 is adopted.

FIG. 37 shows data conversion processing when the sync code shown in FIGS. 11 to 13C is employed.

In step ST1, logical sector information 103 to be recorded is received by the interface portion 142. In next step ST2, data ID information and IED information of each sector are generated by the data ID generating portion 165. In next step ST3, data arrangement indicated by symbol "c" in FIG. 1 and symbol "c" in FIG. 5 is created by the data ID, IED, CPR_MAI, EDC attachment portion 168. In next step ST3, data allocation indicated in portions of symbol "c" in FIG. 1 and symbol "c" in FIG. 5 is created by the data ID, IED, CPR_MAI, EDC attachment portion 168.

In step ST4, scramble processing is carried out to the logical sector information 103 by the scramble circuit 157. In step ST5, the ECC block having the structure shown in FIGS. 5, 6 and 7 is constructed with the ECC encoding circuit 161.

Next, in step ST6, the physical sector composing the ECC block created within the ECC encoding circuit 161 is divided into 26 sections or 13 sections, so as to produce sync frame data 105 as shown in a portion indicated by symbol "d" in FIG. 1.

In next step ST8, modulation is carried out in each sync frame data 105 by the modulation circuit 151 and its result is transmitted to the temporary storage portion 139 for storing modulated data.

(1) The DSV value is computed successively by the DSV value computing portion 148 at the time of modulation and a table for use in modulation is selected from the conversion table storage portion 153 at the time of modulation according to the value and then, its conversion table selection information 192 is transmitted to the conversion table selection information storage portion 133 adopted at the time of modulation.

(2) Of the DSV value information 191 to be computed at the same time at the time of modulation, a differential value of each sync frame data 105 is transmitted to a DSV differential history storage portion 131 of each sync frame data 105.

In next step ST9, the conversion table selection code 122 for modulation is set up within the modulation-time conversion table selection code generating portion 134 based on data transmitted from the conversion table selection information storage portion 133 employed at the time of modulation.

In next step ST10, the sync position detecting code 121 is generated by the sync position detecting code generating portion 136.

In step ST11, the DC suppression polarity inversion pattern 124 is set up within the DC suppression polarity inversion pattern determining portion 132 based on the DSV computation result (output of the DSV value computing portion 149) to data to be recorded by the information recording/reproducing portion 141 after it is synthesized by a recording data synthesizing portion 138, and the output result of the DSV differential history storage portion 131 of each sync frame data 105.

In next step ST12, the sync frame position identifying code 123 is generated by the sync frame position identifying code generating portion 135.

In next step ST13, data generated in ST9 to ST12 is synthesized by the sync code 110 generating portion 137 so as to generate the sync code 110.

In next step ST14, data created by the sync code 110 generating portion 137 and data recorded in the temporary storage portion 139 of the modulated data are synthesized by the recording data synthesizing portion 138 so as to create data arrangement indicated by a portion of symbol "e" in FIG. 2 or indicated in FIGS. 26 to 32.

Next, data created in step ST14 is transmitted to the information recording/reproducing portion 141 and then transmitted to the information storage medium 9. The DSV value is computed successively to that data by the DSV value computing portion 149 and its result is transmitted to the DC suppression polarity inversion pattern determining portion 132.

Figure 38:
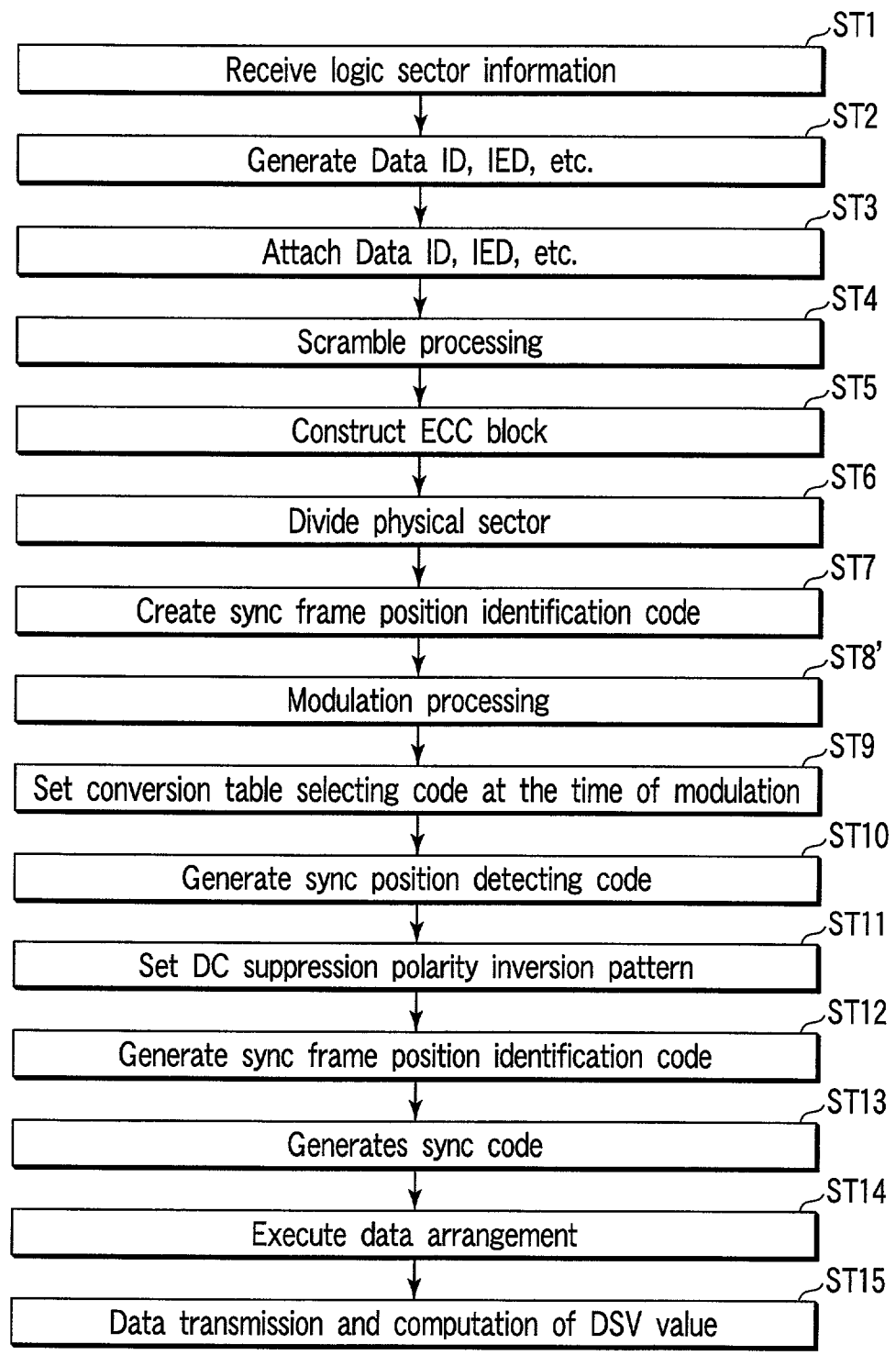
FIG. 38 is a flow chart for explaining data conversion processing in case where the sync code shown in FIGS. 14A to 19B is adopted.

FIG. 38 shows data conversion processing in case where the sync code shown in FIGS. 14A to 19B is employed.

In step ST1, the logical sector information 103 to be recorded is received by the interface portion 142. In step ST2, data ID information and IED information of each sector are generated by the data ID generating portion 165. In next step ST3, data arrangement indicated by a portion of symbol "c" in FIG. 1 or a portion of symbol "c" in FIG. 5 is created by the data ID, IED, CPR_MAI, EDC attachment portion 168.

In step ST4, scramble processing is carried out to the logical sector information 103 by the scramble circuit 157. In next step ST5, the ECC encoding circuit 161 forms the ECC block having the structure indicated by a portion of symbol "c" in FIG. 5 and portions of symbols "h" and "i" in FIGS. 6 and 7.

In next step ST6, the physical sector which composes the ECC block created within the ECC encoding circuit 161 is divided into 26 sections or 13 sections so as to obtain the sync frame data 105 as indicated by symbol "d" in FIG. 1.

In step ST7, a sync frame position identifying code corresponding to the position of the sync frame data 106 after the modulation in a single physical sector is created by the sync frame position identifying code generating portion 136 as indicated by a portion of symbol "e" in FIG. 2, a portion of symbol "b" in FIG. 26 and as indicated in FIGS. 27 to 31 and 32. This sync frame position identifying code is disposed at the head of each sync frame data 105 as indicated by a portion of symbol "d" in FIG. 1 in the modulation circuit 115.

In next step ST8, modulation processing including the sync frame position identifying code disposed at the head of each sync frame data 105 is carried out within the modulation circuit 151.

(1) The DSV value is computed successively by the DSV value computing portion 148 at the time of modulation and a table for use for modulation is selected from the conversion table storage portion 153 used at the time of the modulation based on the value. Then, its conversion table selection information 192 is transmitted to the storage portion 133 as conversion table selection information employed at the time of modulation.

(2) Of the DSV value information 191 to be computed at the same time at the time of modulation, a differential value of each sync frame data 105 is transmitted to the DSV differential history storage portion 131 of each sync frame data 105.

The conversion table selection code 122 for use at the time of modulation is set up within the conversion table selection code generating portion 134 at the time of modulation based on data transmitted from the conversion table selection information storage portion 133.

In step ST10, the sync position detecting code 121 is generated by the sync position detecting code generating portion 136.

In step ST 11, the DC suppression polarity inversion pattern 124 is set up to data which is synthesized by the recording data synthesizing portion 138 and to be recorded by the information recording/reproducing portion 141, based on the DSV computation result (output of the DSV value computing portion 149) and the output result of the DSV differential history storage portion 131 of each sync frame data 105. The DC suppression polarity inversion pattern 124 is set up in the DC suppression polarity inversion pattern determining portion 132.

In step ST13, data generated by the sync code 110 generating portion 137 in steps ST9 to ST11 is synthesized so as to generate the sync code 110.

In step ST14, data created by the sync code 110 generating portion 137 and data recorded in the temporary storage portion 139 of the modulated data are synthesized by the recording data synthesizing portion 138 so as to create a portion indicated by symbol "e" in FIG. 2 or data arrangement indicated in FIGS. 26 to 32.

In step ST15, data created in step ST14 is transmitted to the information recording/reproducing portion 141 and then transmitted to the information storage medium 9. The DSV value is computed successively to that data by the DSV value computing portion 149 and its result is transmitted to the DC suppression polarity inversion pattern determining portion 132.

Figure 39:
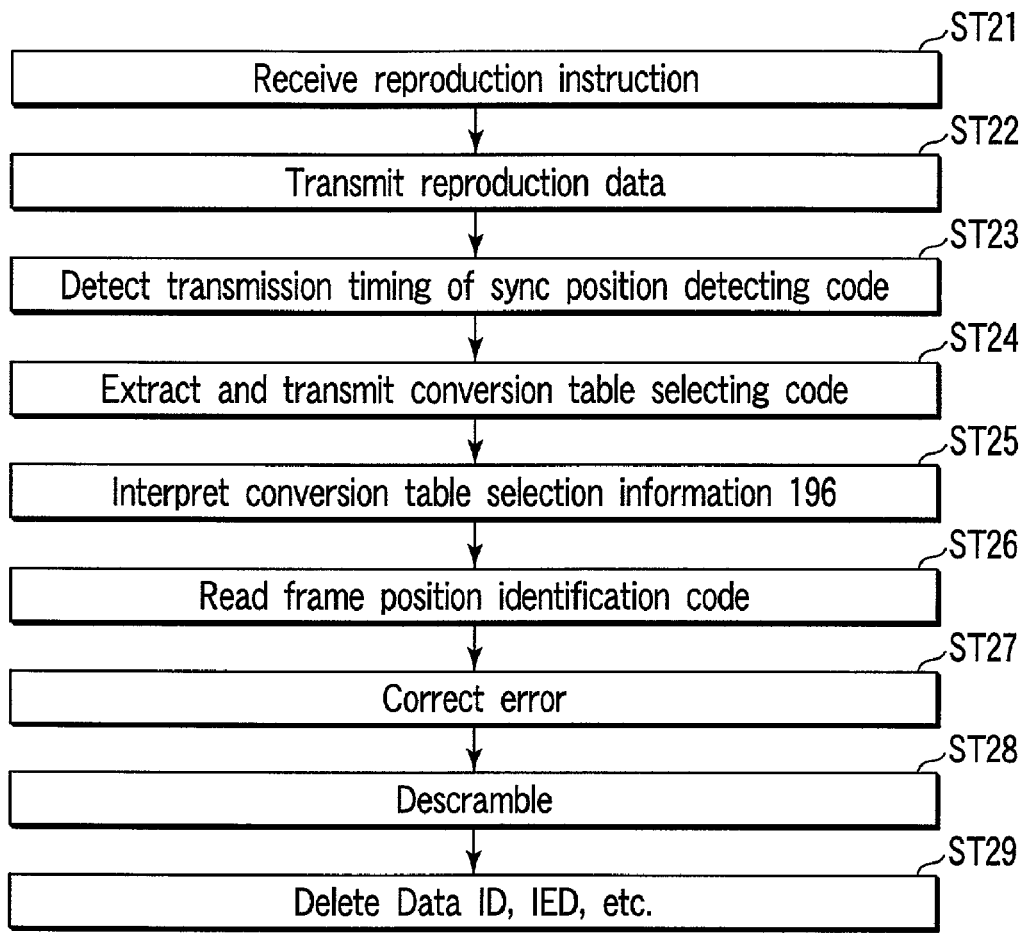
FIG. 39 is a flow chart for explaining data conversion processing for simply reproducing information in the apparatus of the present invention.

FIG. 39 shows data conversion processing upon reproducing information in the apparatus of the present invention.

In step ST21, the interface portion 142 receives an instruction about a range to be reproduced from the information storage medium 9. In next step ST22, the information recording/reproducing portion 141 reproduces data mixed with the sync frame data 106 after the sync code 110 is modulated, indicated by the symbol "e" in FIG. 2 and the reproduced data is transmitted to a shift register circuit 181. In next step ST23, timing for transmitting the sync position detecting code 121 is detected by the sync position detecting code detecting portion 182 comprised of a comparator circuit.

In step ST24, the conversion table selection code 122 at the time of modulation is extracted by the variable code transmitting portion 183 based on the detecting timing of step ST23 and transmitted to a conversion table selection code identifying portion 187 at the time of modulation.

In step ST25, the conversion table selection code identifying portion 187 at the time of modulation interprets conversion table selection information 196 from the conversion table selection code 122 and transmits its interpretation result to a demodulation conversion table selecting/transmitting portion 189.

In step ST26, information about the sync frame position identification code 123 is read out from data transmitted from the information recording/reproducing portion 141 by the identifying portions (identifying the content of the sync frame position identifying code) 185, 186 located within the sync code position extracting portion 145 or within the demodulating circuit 152 based on the detecting timing of step ST23. Then, the position of the sync frame data 106 after the modulation is computed and subjected to demodulation processing by using data transmitted in step S24 according to the method shown in FIG. 42.

Next, in step ST27, error correction is carried out by the ECC decoding circuit 62. In step ST28, descramble processing is carried out by the descramble circuit 159.

Then, in step ST29, data ID, IED, CPR_MAI, EDC is deleted by the logic sector information extracting portion 173 and only the logic sector information 103 is transmitted outside through the interface portion 142.

Figure 40:
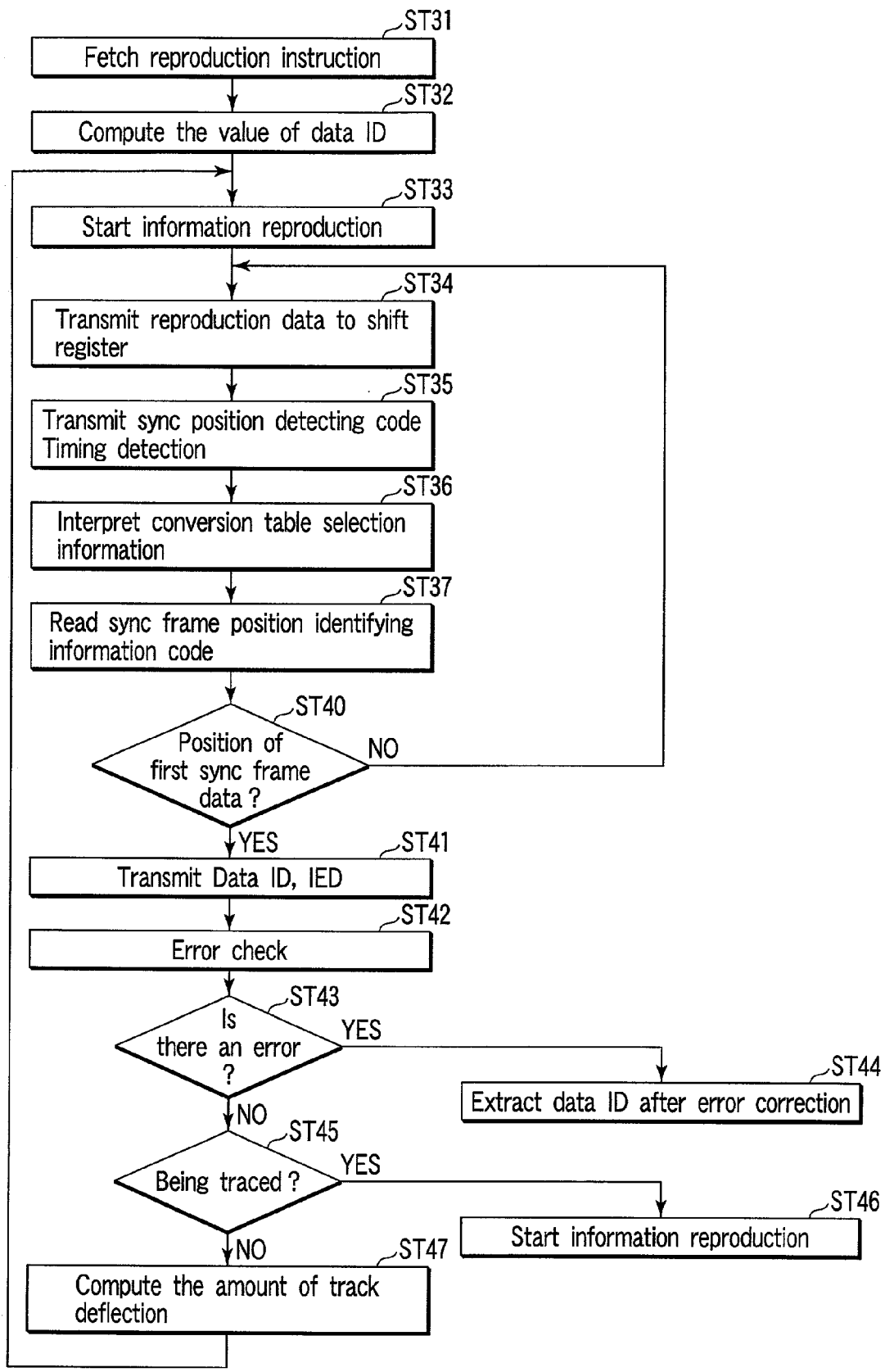
FIG. 40 is a flow chart for explaining control operation in case where access is made to a predetermined position of an information storage medium by employing the sync code shown in FIGS. 11 to 13.

FIG. 40 shows a control operation in case where access is made to a predetermined position in the information storage medium by employing the sync code shown in FIGS. 11 to 13C.

In step ST31, the interface portion 142 receives an instruction about a range to be reproduced from the information storage medium 9. In step ST32, the value of data ID1 corresponding to the reproduction start sector on the information storage medium 9 is computed in the control portion 143 based on information received in step ST31.

In step ST33, the control portion 143 controls the information recording/reproducing portion 41 so as to start reproduction of information from its estimated reproduction start position on the information storage medium 9.

In next step ST34, the information recording/reproducing portion 141 reproduces data in which the sync code 110 of a portion indicated by symbol "e" in FIG. 2 and the after-modulation sync frame data 106 are mixed and the reproduced data is transmitted to the shift register circuit 181 just as it is.

In next step ST35, the sync position detecting code detecting portion 182 detects the timing for transmitting the sync position detecting code 121. In step ST36, the conversion table selection code identifying portion 187 at the time of modulation interprets the conversion table selection information 196 by using the detection timing of step ST35 and transmits its interpretation result to the demodulation conversion table selecting/transmitting portion 189.

In step ST37, information of the sync frame position identification code 123 existing in the variable code transmitting portion 183, 184 is read out by using the detection timing of step ST35. Then, according to the method shown in FIG. 42, where in the physical sector the sync frame data 106 being currently reproduced exists is determined and its result is transmitted to the control portion 143.

In next step ST40, whether or not it is the position of the first sync frame data 106-1 in the physical sector is determined.

If the result is Yes, in step ST41, information of data ID 1-0 and IED2-0 existing at the head position of the first sync frame data 105-0 in the physical sector is transmitted to the ID portion and IED portion extracting portion 171 by using the detection timing in step ST35. If the determination result is NO, the processing returns to step ST34.

In step ST42, the error check portion 172 of the data ID portion checks whether or not there is an error in data ID1 information detected by using information of the IDE2.

Then, whether or not there is any error in data ID1 is determined in step ST43 and if so, in step ST44, data ID1 after error correction processing is extracted by the ECC decoding circuit 162. If there is no error in the data ID1, whether or not a scheduled track on the information storage medium 9 is being traced is determined in step ST45. If this determination result is Yes, reproduction of information from the information storage medium 9 is started in step ST46. Otherwise, the amount of deflection on the track of the information storage medium 9 is computed according to a differential value between the value of data ID1, which is a reproduction result and data ID1 in a sector scheduled to be reproduced in step ST47 and the processing returns to step ST33.

Figure 41:
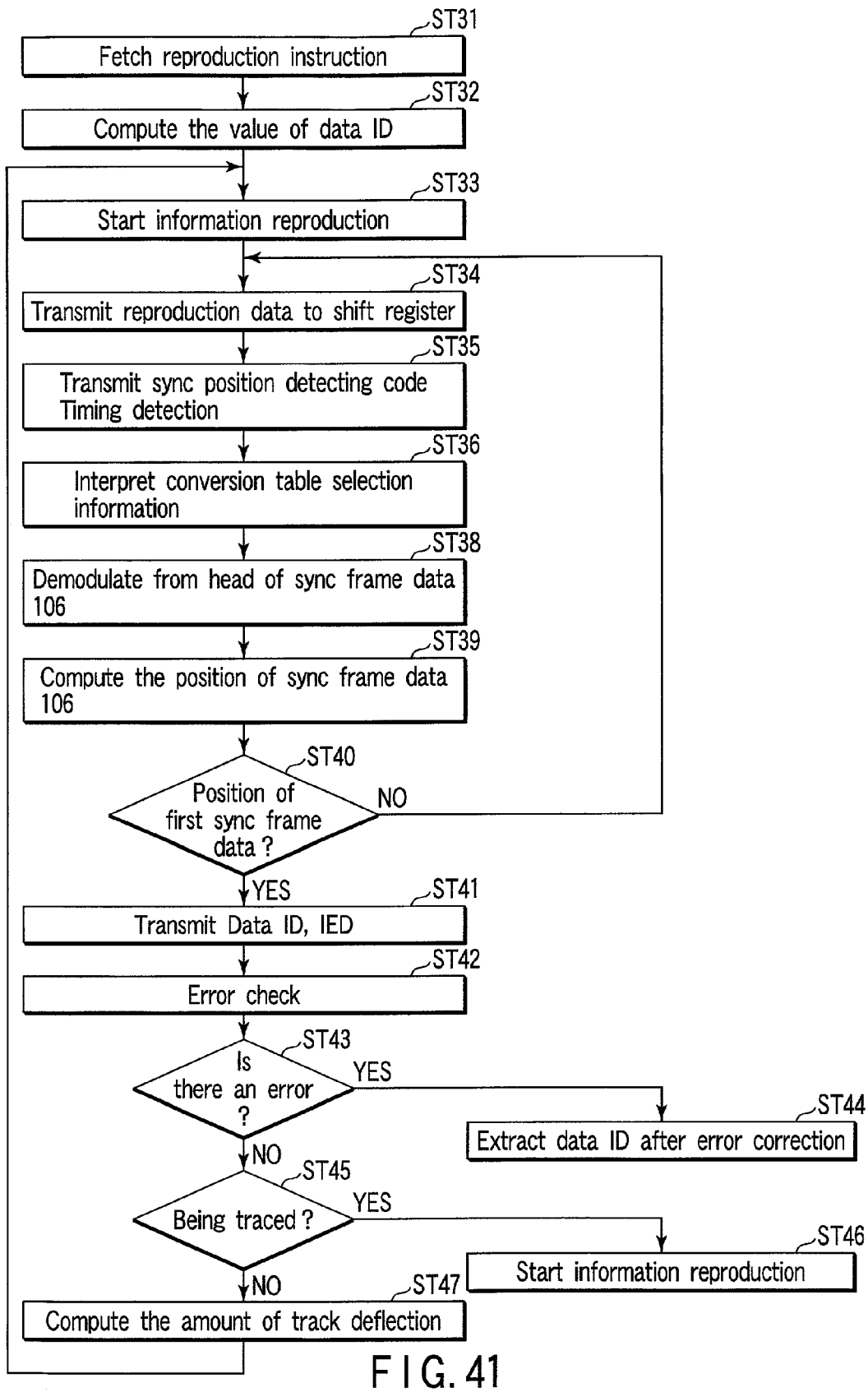
FIG. 41 is a flow chart for explaining control operation in case where access is made to a predetermined position of an information storage medium by employing the sync code shown in FIGS. 14A to 19B.

FIG. 41 shows a control operation in case where access is made to a predetermined position on the information storage medium by employing the sync code shown in FIGS. 14A to 19B.

In step ST31, the interface portion 142 receives an instruction on the range to be reproduced from the information storage medium 9. In step ST32, the value of the data IDI corresponding to a reproduction start sector on the information storage medium 9 is computed according to information received in step ST31.

In step ST33, the control portion 143 controls the information recording/reproducing portion 41 so as to start reproduction of information from its estimated reproduction start position on the information storage medium 9.

In next step ST34, the information recording/reproducing portion 141 reproduces data in which the sync code 110 in a portion indicated by symbol "e" in FIG. 2 and the after-modulation sync frame data 106 are mixed and transmits reproduced data to the shift register circuit 181.

In step ST35, the sync position detecting code detecting portion 182 detects the timing for transmitting the sync position detecting code 121.

In step ST36, the conversion table selection information 196 is interpreted by the conversion table selection code identifying portion 187 at the time of modulation by using the detection timing of step ST35 and its interpretation result is transmitted to the demodulation conversion table selecting/transmitting portion 189.

In next step ST38, demodulation is carried out from the head of the sync frame data 106 after modulation in the demodulating circuit 152 by using the detection timing of step ST35 and the conversion table selection information 196 obtained in step ST36. At this time, the demodulation is executed from the "sync frame position identification code 125 after modulation", existing at the head of the after-modulation data region 107 as shown in FIGS. 14A, 14B and 15A.

Next, in step ST39, the content of the sync frame position identification code 123 after demodulation is interpreted within a sync frame position identification code content identifying portion 186 so as to compute the position of the sync frame data 106 according to the method shown in FIG. 42.

In step ST40, it is determined whether or not the computed position is the position of the first sync frame data 106-1 in the physical sector. Otherwise, the processing returns to step ST34. If its results is Yes, information of data ID 1-0 and IED2-0 existing at the head of the first sync frame data 105-0 in the physical sector is transmitted to the data ID 1 and IED portion extracting portion 171 by using the detection timing of step ST35 (step ST41).

In step ST42, it is checked whether or not there is any error in the data ID 1 information detected by using the information of IED2 by the data ID portion error check portion 172.

In step ST43, whether or not there is an error in the data ID 1 is determined. If there is an error, in step ST44, data ID 1 after error correction processing is extracted by the ECC decoding circuit 162. If there is no error, it is determined whether or not a scheduled track on the information storage medium 9 is being traced. If this scheduled track is being traced, reproduction of information from the information storage medium 9 is started (step ST46).

The amount of deflection of the track on the information storage medium 9 is computed by the control portion 143 according to a differential value between the data ID1 which is a reproduction result of step ST46 and the data ID1 of a sector scheduled to be reproduced (step ST47).

According to the present invention, as described above, the interior of the sync code is divided into codes having plural contents. That is, information is recorded into an information storage medium in a first recording unit (physical sector 5) and plural sync codes are disposed within the first recording unit. The sync code has the fixed code region (111), which is common within the above-described plural sync codes and different variable code regions (112, 113), which are different between at least two sync codes. The sync position detecting code (121) is recorded in the fixed code region (121) and at least any one of the modulation-time conversion table selection code (122) and sync frame position identification code (123) is recorded in the above-described variable code regions (112, 113).

Consequently, as compared to the conventional DVD in which the sync code needs to be detected by 32 kinds of pattern matching to 32 kinds of sync code patterns, according to the present invention, detecting only a single kind of the sync position detecting code pattern within the fixed code region enables to detect the sync code. For the reason, the sync code can be detected very simply and easily and further at high speeds. Because according to the present invention, the interior of the variable code region is divided into the conversion table selection code and the sync frame position identification code, the conversion table selection information and sync frame position information can be extracted easily at high speeds. As a result, reproduction processing speed for data recorded on the information storage medium can be increased (because extraction of various kinds of codes is easy) and the price of the information reproducing apparatus or information recording/reproducing apparatus can be lowered.

According to the present invention, the sync position detecting code contains a pattern in which 2 "0"s continue. That is, user information is recorded in the information storage medium in a first recording unit (physical sector 5) in a format after it is modulated according to the modulation rule of (d, k; m, n). Further, the first recording unit contains plural sync codes and the sync code has the fixed code region (111), which is common within the above-described plural sync codes and the variable code regions (112, 113), which are different between at least two sync codes. The sync position detecting code (121) is recorded in the fixed code region (121).

Further, the sync position detecting code (121) contains a pattern in which "k+2" "0" continue and a pattern in which 2 "0"s continue.

Consequently, when the after-modulation user information is recorded on the information storage medium according to the modulation rule of (d, k; m, n), employing a pattern in which "0"s are continuous by, which cannot exist within the after-modulation user information, as the sync position detecting code facilitates identification between the sync code and the after-modulation user information data. If the quantity of continuous "0"s increases, the phase lock loop (PLL) in the information reproducing apparatus becomes likely to deflect. Thus, if the pattern in which only two "0"s continue is disposed just after the pattern in which "k+2" "0" continue, the deflection of the PLL can be corrected rapidly.

If PRML is used in the data reproducing system by shortening the bit length after modulation to "d=1" aiming at intensified density, the amplitude of a reproduction signal from a place having a "0" is very small, so that stable binarization is impossible. Thus, a pattern in which 2 "0"s continue is disposed.

Consequently, (1) the amplitude of the reproduction signal from this position is increased to some extent so that the signal after binarization is stabilized (can be detected accurately) and (2) the amount of deflection in phase of the PLL which occurs because "0" continues long can be corrected rapidly.

The apparatus of the present invention can be also provided with an abnormality detecting function which monitors arrangement order of the sync code so as to detect deflection of the track.

As described in FIG. 42, output data of the vittarbi decoder 156 (see FIG. 4) is transmitted to the sync code position detecting portion 145 (step ST51 in FIG. 42), where it is handled to detect the position of the sync code 110. That is, the position of the sync position detecting code 121 is detected by the sync position detecting code detecting portion 182 comprised of a comparator according to pattern matching method (step ST52 in FIG. 42).

After that, information about the detected sync code 110 is transmitted through the control portion 143 and then stored in the memory portion 175 successively as shown in FIG. 36. That is, information of the sync frame position identification code 123 is extracted by the sync deflection free position identification code content identifying portions 185, 1865 by using the detection timing of step ST52 and extraction history information is recorded in the memory portion 175 through the control portion 143 (step ST53 in FIG. 42).

If the position of the sync code 110 is found, only the after-modulation sync frame data 106 is extracted from data outputted from the vittarbi decoder 156 and transmitted to the shift resistor circuit 170. That is, only the sync frame data 106 after modulation is extracted using the timing of step ST52 and the sync frame data 106 after modulation is transmitted to the shift resistor circuit 170 so as to match the timing by delay (step ST54 in FIG. 42).

The control portion 143 reads out history information of the sync code 110 recorded in the memory portion 175 and identifies arrangement order of the sync frame position identification code (step ST55 in FIG. 42). Then, the position in the physical sector of the sync frame data 106 after modulation temporarily stored in the shift resistor circuit 170 is computed (step ST56 in FIG. 42). That is, the control portion 143 computes the position of the after-modulation sync frame data 106 in the physical sector, transmitted to the shift register circuit 170 according to the arrangement order of the identified sync frame position identification code, for example data of the arrangement order shown in FIG. 34 or 35.

Next, the after-modulation sync frame data 106 transmitted to the shift register circuit 170 as required is transmitted to the demodulating circuit 152 and the demodulation is started (step ST57).

For example, if the arrangement order of the sync code 110 stored in the memory portion 175 is "FR0→FR2→FR1" or "SY0→SY2→SY1" as shown in FIG. 36, it can be calculated that the after-modulation sync frame data 106.6 exists just after "FR0" or "SY0". Further if the arrangement order is "FR0→FR0→FR1" or "SY0→SY0→SY1", it can be calculated that the after-modulation sync frame data 106.0 exists just after "FR0" or "SY0".

Figure 43:
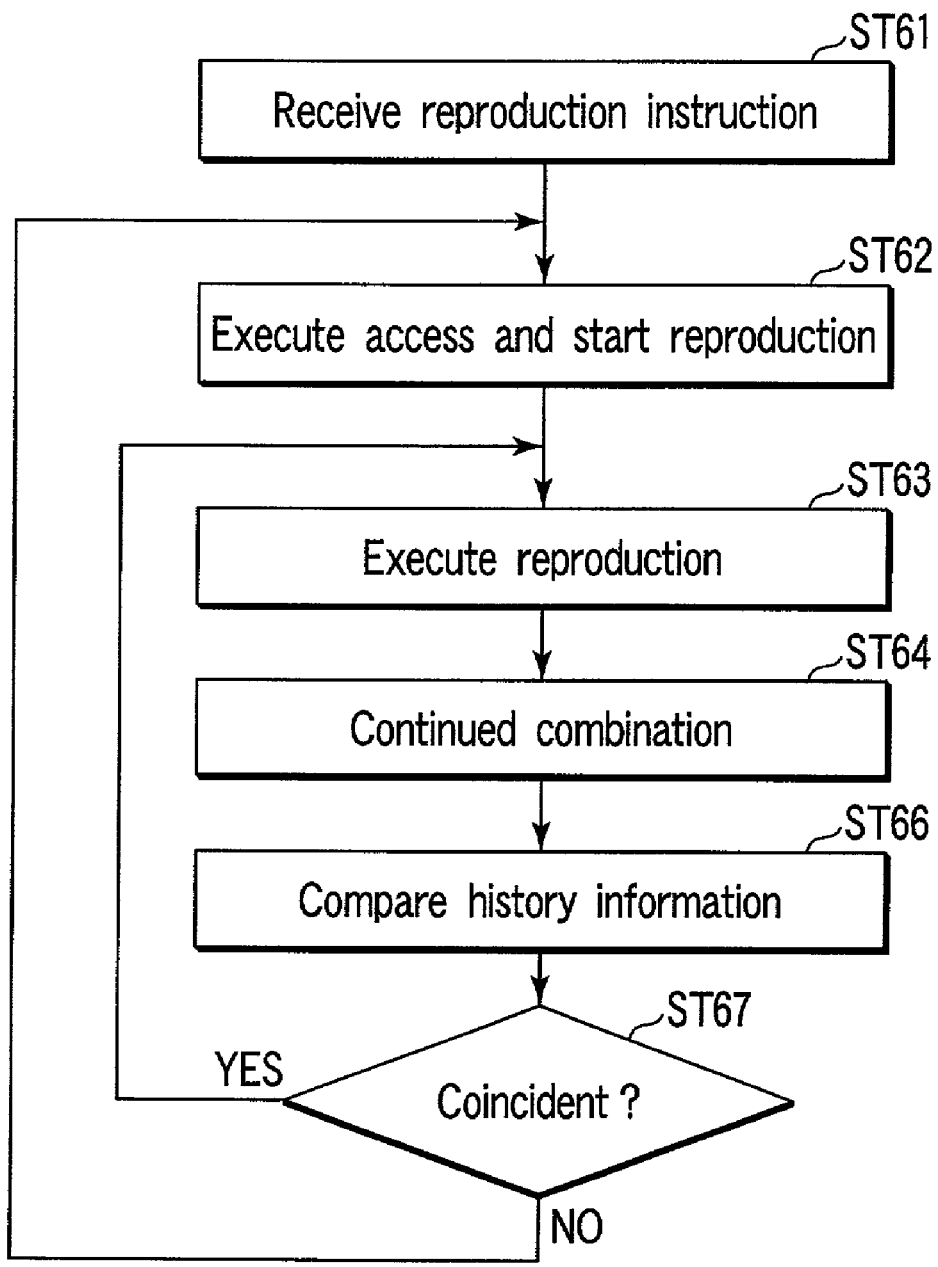
FIG. 43 is a flow chart for explaining a method of detecting such an error as deflection from a track from the arrangement order of plural sync codes in the information recording/reproducing apparatus of the present invention.

As shown in FIG. 43, this is enabled by algorithm provided in the control portion 143 also. In step ST61, an instruction about the range which should be reproduced is received from the information storage medium based on an operation input or control input from outside. Consequently, according to a flow shown in FIG. 40 or 41, access to a reproduction start position on the information storage medium is executed so as to start reproduction of data (step ST62). Continuous reproduction is executed according to a procedure shown in FIG. 39 (step ST63). Next, a continued combination of a sync code 110 scheduled to be detected is estimated by the control portion 143 (step ST64). According to the method based on the flow in FIG. 42, history information of the sync code 110 is read out and compared with the continued combination estimated in step ST64 (step ST66). If comparison and history information coincide with estimated combination, it is determined that a scheduled track on the information storage medium is being traced and the processing returns to step ST63. Otherwise, the processing returns to step ST62 (step ST67).

According to the embodiment of the present invention, as described above:

[A] there is provided a sync code structure and a detection method in which Sync code position detecting algorithm can be simplified largely. That is, sync code detection in the information reproducing apparatus or information recording/ reproducing apparatus is facilitated and the price of the information reproducing apparatus or information recording/reproducing apparatus is reduced and at the same time, detection reliability of the sync code can be increased; and

[B] there is provided a sync code structure for improving the reliability of sync code position detection largely. Consequently, a sync code pattern, which facilitates identification between the sync code and other user (after modulation) recording data and unlikely generates deflection of phase lock loop (PLL), has been proposed so as to improve reliability of the sync code.

In the meantime, the estimating content of the sync code to be reproduced is frame information or combination of codes indicating the frame position.

The present invention is not restricted to the above-described embodiments. In the above specification, the content (sync position detecting code) of the sync code, particularly the fixed region is described to be always the same when it is handled by the recording/reproducing apparatus. However, it is permissible to change over plural kinds of the sync position detecting codes in the recording apparatus or reproducing apparatus. For example, it is permissible to provide the recording/reproducing apparatus with default setting function or selection setting function for the sync position detecting code for only specified users to select the sync position detecting code. Usually, a default sync position detecting code is used. Because a specified user knows a used sync position detecting code in this case, he can obtain reproduced information.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for generating a sync code of ECC blocks, comprising:

generating two small ECC blocks, each one of small ECC blocks having a plurality of sectors, each one of the sectors having a plurality of rows, one of the rows in each one of the sectors being parity of outer-code information, other rows in each one of the sectors having data portion and parity of inner-code information, and each of the small ECC blocks including data which are to be interleaved between the small ECC blocks, modulating the small ECC blocks and adding the sync code to a header portion of each one of the sync frames corresponding to the rows;

arranging a fixed code and a variable code in the sync code of 24 bit numbers;

setting the fixed code to sync position detecting code, such that the fixed code includes a part having twelve consecutive "0"s continue and a part having the bit sequence "1001";

setting the variable code to have a bit for depressing a DC component, wherein the variable code is set to a variable code pattern selected from "00100*", "00010*" and "00*010", where * is a bit for depressing DC component.

2. The sync code generation method according to claim 1, wherein the user information is modulated according to a modulation rule of (d, k; m, n), and a pattern of the sync code is set to a part having "k+3" consecutive "0"s and a part having the bit sequence "1001".

3. The method of claim 1, wherein each of the small ECC blocks includes data which are to be interleaved between different physical sectors.

4. The method of claim 1, wherein a value of the * is determined by a DSV controller.

5. The method of claim 4, wherein the value of the * depends on the contents of the modulated data in the modulated ECC block.

6. A computer readable information storage medium configured to record information in a first recording unit, where the first recording unit includes a modulated ECC block and the sync code to a header portion of each one of the sync frames of the modulated ECC block, the modulated ECC block being formed as one of two small ECC blocks, each one of small ECC blocks having a plurality of sectors, each one of the sectors having a plurality of rows corresponding to the sync frames, one of the rows in each one of the sectors being PO information, other rows in each one of the sectors having a data portion and PI information, and each of the small ECC blocks including data which are interleaved between the small ECC blocks, the information storage medium comprising:

a user information recording portion where the user information is recorded; and a sync code recording portion where the sync code is recorded, the sync code includes a fixed code and a variable code in the sync code of 24 bit numbers, the fixed code is to set a sync position detecting code, such that the fixed code includes a part having twelve consecutive "0"s and a part having the bit sequence "1001", and the variable code is set to have a bit for depressing a DC component, wherein the variable code is set to a variable code pattern selected from "00100*", "00010*" and "00*010", where * is a bit for depressing DC components.

7. The computer readable information storage medium according to claim 6, wherein the user information is modulated according to a modulation rule of (d, k; m, n), and a pattern of the sync code is set to the parts having "k+3" consecutive "0"s continue and a part having the bit sequence "1001".

8. A method for reproducing information from a computer readable information storage medium according to the claim 6, the method comprising:
- obtaining the first recording unit;
- detecting the sync position detecting code from the first recording unit by pattern comparison between a predetermined pattern and data in the first recording unit; and
- outputting a sync frame position ID code indicating the position of the sync frame by obtaining data of a fore or a rear position of the sync position detection code from a shift register when the sync position detecting code is detected.

9. The information reproducing method according to claim 8, wherein the user information is modulated according to a modulation rule of (d, k; m, n), and a pattern of the sync code is set to a part having "k+3" consecutive "0"s and a part having the bit sequence "1001".

10. An information reproducing apparatus reproducing information from the computer readable information storage medium according to the claim 6, comprising:
- an obtaining portion that obtains the first recording unit;
- a detecting portion that detects the sync position detecting code from the first recording unit by pattern comparison between a predetermined pattern and data in the first recording unit; and
- an outputting portion that outputs a sync frame position ID code indicating the position of the sync frame by obtaining data of a fore or a rear position of the sync position detection code from a shift register when the sync position detecting code is detected.

11. The information reproducing apparatus according to claim 10, wherein the user information is modulated according to a modulation rule of (d, k; m, n), and a pattern of the sync code is set to a part having "k+3" consecutive "0"s and a part having the bit sequence "1001".

12. An information recording method for recording information to the computer readable information storage medium according to claim 6, the method comprising:
- arranging the fixed code and a variable code in the sync code of 24 bit numbers;
- setting the fixed code to the sync position detecting code, such that the fixed code includes a part having twelve consecutive "0"s and a part having the bit sequence "1001";
- setting the variable code to have a bit for depressing a DC component; and recording the depressed DC component.

13. The information recording method according to claim 12, wherein the user information is modulated according to a modulation rule of (d, k; m, n), and a pattern of the sync code is set to a part having "k+3" consecutive "0"s and a part having the bit sequence "1001".

14. An information recording apparatus for recording information to the computer readable information storage medium according to claim 6, the apparatus comprising:
- an arranging portion that arranges the fixed code and a variable code in the sync code of 24 bit numbers;
- a fixed code setting portion that sets the fixed code to the sync position detecting code, such that the fixed code includes a part having twelve consecutive "0"s and a part having the bit sequence "1001";
- a variable code setting portion that sets the variable code to have a bit for depressing a DC component; and
- a recording portion that records the depressed DC component.

15. The information recording apparatus according to claim 14, wherein the user information is modulated according to a modulation rule of (d, k; m, n), and a pattern of the sync code is set to a part having "k+3" consecutive "0"s and a part having the bit sequence "1001".

16. The medium of claim 6, wherein each of the small ECC blocks includes data in the data portions which are stored into different physical sectors.

17. The medium of claim 6, wherein a value of the * is determined by a DSV controller.

18. The medium of claim 17, wherein the value of the * depends on the contents of the modulated data in the modulated ECC block.

* * * * *